US012796257B2

(12) United States Patent
Lee et al.

(10) Patent No.: US 12,796,257 B2
(45) Date of Patent: Nov. 10, 2026

(54) DISPLAY DEVICE

(71) Applicant: Samsung Display Co., Ltd., Yongin-si (KR)

(72) Inventors: Sunhwa Lee, Yongin-si (KR); Hyeongseok Kim, Yongin-si (KR); Heejean Park, Yongin-si (KR); Mukyung Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/244,014

(22) Filed: Jun. 20, 2025

(65) Prior Publication Data

US 2025/0393424 A1 Dec. 25, 2025

(30) Foreign Application Priority Data

Jun. 21, 2024 (KR) ........................ 10-2024-0081370

(51) Int. Cl.

*G09G 3/3233* (2016.01)
*H10K 59/121* (2023.01)

(Continued)

(52) U.S. Cl.

CPC ......... *H10K 59/131* (2023.02); *G09G 3/3233* (2013.01); *H10K 59/1216* (2023.02); *G09G 3/035* (2020.08); *G09G 2300/0426* (2013.01); *G09G 2300/0819* (2013.01); *G09G 2300/0842* (2013.01)

(58) Field of Classification Search

CPC ............. H10K 59/131; H10K 59/1216; G09G 3/3233; G09G 3/035; G09G 2300/0426; G09G 2300/0819; G09G 2300/0842

See application file for complete search history.

(56) References Cited

U.S. PATENT DOCUMENTS

| | | | |
|---|---|---|---|
| 11,341,921 | B2 | 5/2022 | Shin et al. |
| 2018/0197475 | A1 | 7/2018 | Yang et al. |

(Continued)

FOREIGN PATENT DOCUMENTS

| | | | |
|---|---|---|---|
| KR | 1020180082662 | A | 7/2018 |
| KR | 1020200064231 | A | 6/2020 |

(Continued)

*Primary Examiner* — Temesghen Ghebretinsae
*Assistant Examiner* — Sosina Abebe
(74) *Attorney, Agent, or Firm* — CANTOR COLBURN LLP

(57) ABSTRACT

A display device includes a first pixel circuit arranged in each of the plurality of island portions and connected to a first data line, wherein the first pixel circuit includes a first transistor connected between a first driving voltage line and a light-emitting element and configured to control a current supplied to the light-emitting element, a first capacitor connected between a first node connected to a gate of the first transistor, and an initialization voltage line, a second transistor connected between the first node and a second node and including a gate connected to a first gate line, a second capacitor connected between the first data line and the second node, and a third transistor connected between the second node and a third node connected to the light-emitting element, wherein the third transistor includes a gate connected to a second gate line.

19 Claims, 36 Drawing Sheets

(51) Int. Cl.
*H10K 59/131* (2023.01)
*G09G 3/00* (2006.01)

(56) References Cited

U.S. PATENT DOCUMENTS

| | | | | |
|---|---|---|---|---|
| 2018/0226028 | A1* | 8/2018 | Park | G09G 3/3233 |
| 2019/0148477 | A1 | 5/2019 | Park et al. | |
| 2020/0168824 | A1* | 5/2020 | Park | H10K 77/111 |
| 2021/0134197 | A1 | 5/2021 | Ju | |
| 2023/0029234 | A1* | 1/2023 | Son | G09G 3/3266 |
| 2023/0109049 | A1* | 4/2023 | Wang | B32B 3/30 361/807 |
| 2023/0187451 | A1 | 6/2023 | Ham et al. | |
| 2023/0232678 | A1 | 7/2023 | Cho et al. | |
| 2023/0247879 | A1 | 8/2023 | Cho et al. | |
| 2023/0397479 | A1 | 12/2023 | Xue et al. | |
| 2024/0186475 | A1 | 6/2024 | Jeong et al. | |
| 2025/0098458 | A1 | 3/2025 | Park et al. | |

FOREIGN PATENT DOCUMENTS

| | | | |
|---|---|---|---|
| KR | 1020200115772 | A | 10/2020 |
| KR | 1020210052723 | A | 5/2021 |
| KR | 102414276 | B1 | 6/2022 |
| KR | 1020230089962 | A | 6/2023 |
| KR | 1020230111703 | A | 7/2023 |
| KR | 1020230117011 | A | 8/2023 |
| KR | 1020240084059 | A | 6/2024 |
| KR | 1020250042269 | A | 3/2025 |

* cited by examiner

DISPLAY DEVICE

This application claims priority to Korean Patent Application No. 10-2024-0081370, filed on Jun. 21, 2024, and all the benefits accruing therefrom under 35 U.S.C. § 119, the content of which in its entirety is herein incorporated by reference.

BACKGROUND

1. Field

One or more embodiments relate to a structure of a display device.

2. Description of the Related Art

With the development of display devices that visually display electrical signals, various display devices having excellent characteristics, such as, for example, thinness, reduced weight, and low power consumption, have been introduced. For example, flexible display devices that can be folded or rolled into a roll shape have been introduced. Recently, research and development on display devices with various structures, such as, for example, stretchable display devices that can change into various forms, are actively underway.

SUMMARY

One or more embodiments include a display device having improved resolution and display quality. Embodiments set forth herein are examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display device includes a substrate in which a plurality of island portions and a plurality of bridge portions connecting the plurality of island portions are defined, a first pixel circuit arranged in each of the plurality of island portions and connected to a first data line, and a light-emitting element arranged in each of the plurality of island portions and connected to the first pixel circuit, wherein the first pixel circuit includes a first transistor connected between a first driving voltage line and the light-emitting element and configured to control a current supplied to the light-emitting element, a first capacitor connected between a first node, connected to a gate of the first transistor, and an initialization voltage line, a second transistor connected between the first node and a second node and including a gate connected to a first gate line, a second capacitor connected between the first data line and the second node, and a third transistor connected between the second node and a third node connected to the light-emitting element, wherein the third transistor includes a gate connected to a second gate line.

The first capacitor may include a first capacitor electrode and a second capacitor electrode arranged on the first capacitor electrode, and the first capacitor electrode may be a part of the gate of the first transistor.

The second capacitor may include a third capacitor electrode and a fourth capacitor electrode arranged on the third capacitor electrode, and the third capacitor electrode may be arranged on the same layer as the gate of the first transistor.

A first insulating layer may be arranged between the first capacitor electrode and the second capacitor electrode and between the third capacitor electrode and the fourth capacitor electrode.

The first pixel circuit may further include a third capacitor connected between the third node and the initialization voltage line, and the third capacitor may include a fifth capacitor electrode and a sixth capacitor electrode on the fifth capacitor electrode.

The fifth capacitor electrode may be formed integrally with the first capacitor electrode.

The plurality of bridge portions may include a first bridge portion connecting first adjacent island portions to each other in a first direction, and a second bridge portion connecting second adjacent island portions to each other in a second direction intersecting with the first direction.

The first gate line and the second gate line may extend in the first direction on the plurality of island portions and the first bridge portion.

The first gate line and the second gate line may be arranged on the same layer on the first bridge portion.

The first gate line, the initialization voltage line, and the first driving voltage line may be arranged on different layers on the first bridge portion.

On the first bridge portion, the initialization voltage line may be arranged on the first gate line and the first driving voltage line may be arranged on the initialization voltage line.

The first data line, the initialization voltage line, and the first driving voltage line may be arranged on different layers on the second bridge portion.

On the second bridge portion, the initialization voltage line may be arranged on the first data line and the first driving voltage line may be arranged on the initialization voltage line.

The display device may further include a second pixel circuit arranged in each of the plurality of island portions and connected to a second data line, and a third pixel circuit arranged in each of the plurality of island portions and connected to a third data line, wherein the first pixel circuit, the second pixel circuit, and the third pixel circuit may be sequentially arranged in the first direction.

The first data line, the second data line, and the third data line may extend in the second direction on the plurality of island portions and the second bridge portion.

The first data line, the second data line, and the third data line may be arranged on the same layer on the second bridge portion.

Each of the initialization voltage line and the first driving voltage line may have a planar mesh pattern.

The initialization voltage line may include a horizontal initialization voltage line extending in the first direction on the plurality of island portions and the first bridge portion, and a vertical initialization voltage line extending in the second direction on the plurality of island portions and the second bridge portion.

The first driving voltage line may include a first horizontal driving voltage line extending in the first direction on the plurality of island portions and the first bridge portion, and a first vertical driving voltage line extending in the second direction on the plurality of island portions and the second bridge portion.

The display device may further include a second driving voltage line connected to the light-emitting element and configured to supply a second voltage lower than a first voltage supplied by the first driving voltage line, wherein the second driving voltage line may include a second horizontal driving voltage line extending in the first direction on the plurality of island portions and the first bridge portion, and a second vertical driving voltage line extending in the second direction on the plurality of island portions and the second bridge portion.

Each of the plurality of island portions may further include a first circuit area in which the first pixel circuit is arranged, a second circuit area in which the second pixel circuit is arranged, and a third circuit area in which the third pixel circuit is arranged.

The vertical initialization voltage line, the first vertical driving voltage line, and the second vertical driving voltage line may respectively extend such that each of the vertical initialization voltage line, the first vertical driving voltage line, and the second vertical driving voltage line passes through one of the first circuit area, the second circuit area, and the third circuit area, and the vertical initialization voltage line, the first vertical driving voltage line, and the second vertical driving voltage line may be arranged in different circuit areas.

The horizontal initialization voltage line, the first horizontal driving voltage line, and the second horizontal driving voltage line may respectively extend such that each of the horizontal initialization voltage line, the first horizontal driving voltage line, and the second horizontal driving voltage line passes through all of the first circuit area, the second circuit area, and the third circuit area.

According to one or more embodiments, a display device includes a substrate in which a plurality of island portions and a plurality of bridge portions connecting the plurality of island portions are defined, a first pixel circuit arranged in each of the plurality of island portions and connected to a first data line, and a voltage wiring line configured to supply a voltage to the first pixel circuit, wherein the plurality of bridge portions includes a first bridge portion connecting first adjacent island portions to each other in a first direction, and a second bridge portion connecting second adjacent island portions to each other in a second direction intersecting with the first direction, and the voltage wiring line includes a horizontal voltage wiring line extending in the first direction on the first bridge portion and the plurality of island portions, and a vertical voltage wiring line extending in the second direction on the second bridge portion and the plurality of island portions, wherein, in a plan view, the horizontal voltage wiring line and the vertical voltage wiring line intersect each other in each of the plurality of island portions.

The display device may further include a second pixel circuit arranged in each of the plurality of island portions and connected to a second data line, and a third pixel circuit arranged in each of the plurality of island portions and connected to a third data line, wherein, in each of the plurality of island portions, a first circuit area in which the first pixel circuit is arranged, a second circuit area in which the second pixel circuit is arranged, and a third circuit area in which the third pixel circuit is arranged may be sequentially arranged in the first direction.

The vertical voltage wiring line may include a first vertical driving voltage line configured to supply a first voltage to each of the first pixel circuit, the second pixel circuit, and the third pixel circuit, a second vertical driving voltage line configured to supply a second voltage lower than the first voltage to a light-emitting element electrically connected to the first pixel circuit, the second pixel circuit, or the third pixel circuit, and a vertical initialization voltage line configured to supply an initialization voltage to each of the first pixel circuit, the second pixel circuit, and the third pixel circuit, wherein the first vertical driving voltage line, the second vertical driving voltage line, and the vertical initialization voltage line may respectively extend such that each of the first vertical driving voltage line, the second vertical driving voltage line, and the vertical initialization voltage line passes through one of the first circuit area, the second circuit area, and the third circuit area.

The first vertical driving voltage line, the second vertical driving voltage line, and the vertical initialization voltage line may be arranged in different circuit areas.

The horizontal voltage wiring line may include a first horizontal driving voltage line configured to supply a first voltage to each of the first pixel circuit, the second pixel circuit, and the third pixel circuit, a second horizontal driving voltage line configured to supply a second voltage lower than the first voltage to a light-emitting element electrically connected to the first pixel circuit, the second pixel circuit, or the third pixel circuit, and a horizontal initialization voltage line configured to supply an initialization voltage to each of the first pixel circuit, the second pixel circuit, and the third pixel circuit, wherein the first horizontal driving voltage line, the second horizontal driving voltage line, and the horizontal initialization voltage line may respectively extend such that each of the first horizontal driving voltage line, the second horizontal driving voltage line, and the horizontal initialization voltage line passes through all of the first circuit area, the second circuit area, and the third circuit area.

The first pixel circuit may include a first transistor connected between a first driving voltage line and a light-emitting element and configured to control a current supplied to the light-emitting element, a first capacitor connected between a first node, connected to a gate of the first transistor, and an initialization voltage line, a second transistor connected between the first node and a second node and including a gate connected to a first gate line, a second capacitor connected between the first data line and the second node, and a third transistor connected between the second node and a third node connected to the light-emitting element, and including a gate connected to a second gate line.

The first pixel circuit may further include a third capacitor connected between the third node and the initialization voltage line.

The first gate line and the second gate line may extend in the first direction on the plurality of island portions and the first bridge portion.

The first gate line, the initialization voltage line, and the first driving voltage line may be arranged on different layers on the first bridge portion.

The first data line may extend in the second direction on the plurality of island portions and the second bridge portion.

The first data line, the initialization voltage line, and the first driving voltage line may be arranged on different layers on the second bridge portion.

According to one or more embodiments, An electronic apparatus comprising a display device, wherein the display device comprising: a substrate in which a plurality of island portions and a plurality of bridge portions connecting the plurality of island portions are defined; a first pixel circuit arranged in each of the plurality of island portions and connected to a first data line; and a light-emitting element arranged in each of the plurality of island portions and connected to the first pixel circuit, wherein the first pixel circuit comprises: a first transistor connected between a first driving voltage line and the light-emitting element and configured to control a current supplied to the light-emitting element; a first capacitor connected between: a first node connected to a gate of the first transistor, and an initialization voltage line; a second transistor connected between the first node and a second node and comprising a gate connected to a first gate line; a second capacitor connected between the first data line and the second node; and a third transistor connected between the second node and a third node connected to the light-emitting element, wherein the third transistor comprises a gate connected to a second gate line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
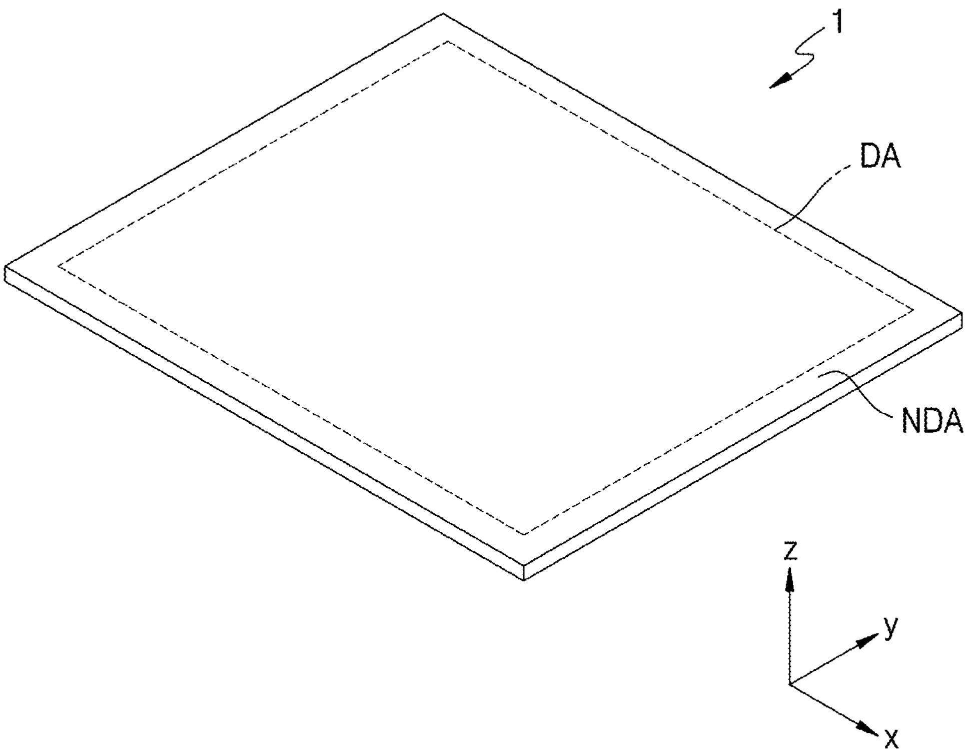
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described herein, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure is subject to various modifications and may have many embodiments, certain of which are illustrated in the drawings and further described in the detailed description. The effects and features of the disclosure, and methods of achieving them will become clear with reference to the embodiments described herein in detail together with the drawings. However, the disclosure is not limited to the embodiments described herein and may be implemented in various forms.

Hereinafter, embodiments will be described in detail with reference to the accompanying drawings, and when being described with reference to the drawings, the same or corresponding components are given the same reference numerals, and duplicate descriptions thereof will be omitted.

In the following embodiments, the terms first, second, and the like are not intended to be limiting, however are used to distinguish one component from another. It is to be understood that the terms first, second, and the like may be expressed herein as 1st, 2nd, and the like.

In the following embodiments, the singular expression includes the plural unless the context clearly indicates otherwise.

In the following embodiments, the terms including or that has, and the like are intended to imply the presence of the recited features or components and do not preclude the possibility of the addition of one or more other features or components.

In the following embodiments, when a portion of a film, area, component, or the like is described to be over or on top of another portion, the description includes not only when the portion is directly on top of the other portion, but also when there are other films, areas, components, or the like arranged therebetween.

In the drawings, components may be exaggerated or reduced in size for ease of illustration. For example, the size and thickness of each configuration illustrated in the drawings are arbitrary for purposes of illustration and the disclosure is not necessarily limited to those illustrated.

In some embodiments, a particular sequence of processes may be performed in a different order than that described. For example, two processes described in succession may be performed substantially simultaneously, or may be performed in the opposite order from the order described.

In the following embodiments, when layers, regions, or components are connected to each other, the layers, the regions, or the components may be directly connected to each other, or another layer, another region, or another component may be between the layers, the regions, or the components and thus the layers, the regions, or the components may be indirectly connected to each other. For example, in the following embodiments, when layers, regions, or components are electrically connected to each other, the layers, the regions, or the components may be directly electrically connected to each other, or another layer, another region, or another component may be between the layers, the regions, or the components and thus the layers, the regions, or the components may be indirectly electrically connected to each other.

In the following embodiments, the terms x-axis, y-axis, and z-axis are not limited to, however may be interpreted in a broad sense to include, three axes in a Cartesian coordinate system. For example, the x-axis, y-axis, and z-axis may be orthogonal to each other, however may also refer to different directions that are not orthogonal to each other.

The term "substantially," as used herein, means approximately or actually. The term "substantially equal" means approximately or actually equal. The term "substantially the same" means approximately or actually the same. The term "substantially perpendicular" means approximately or actually perpendicular. The term "substantially parallel" means approximately or actually parallel. The term "substantially simultaneously" means approximately or actually simultaneously.

Figure 2A:
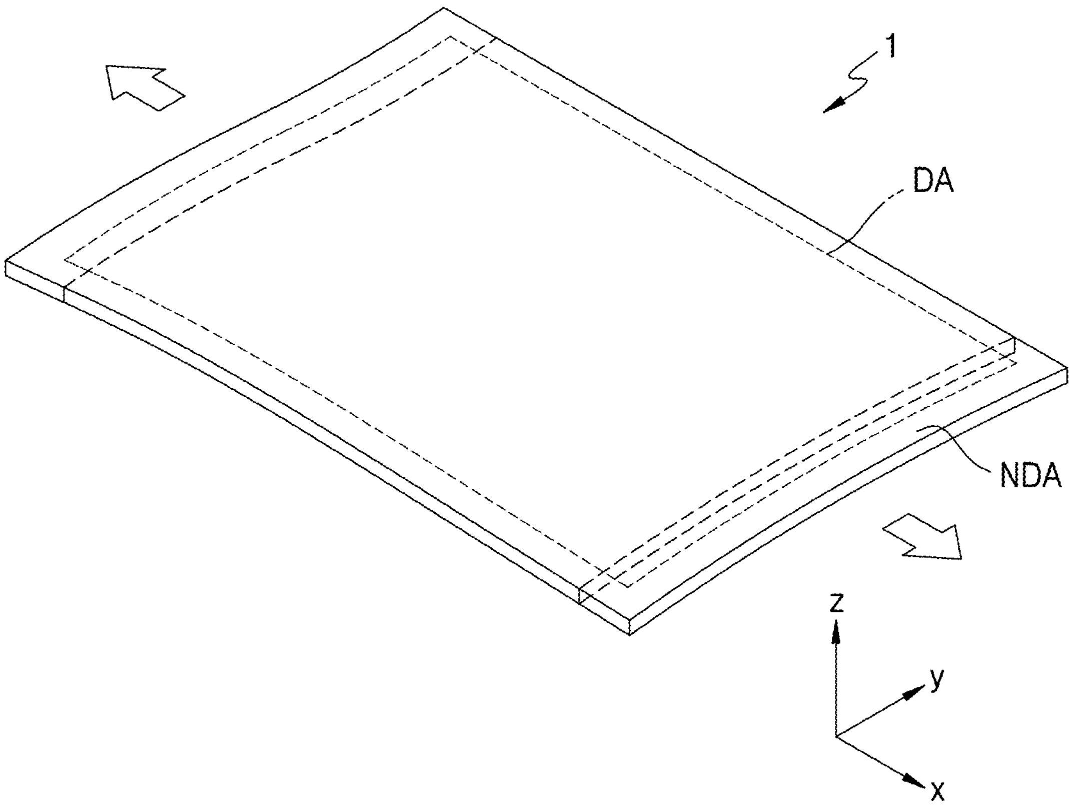
FIGS. 2A and 2B are perspective views of the display device of FIG. 1 stretched in a first direction.
Figure 2B:
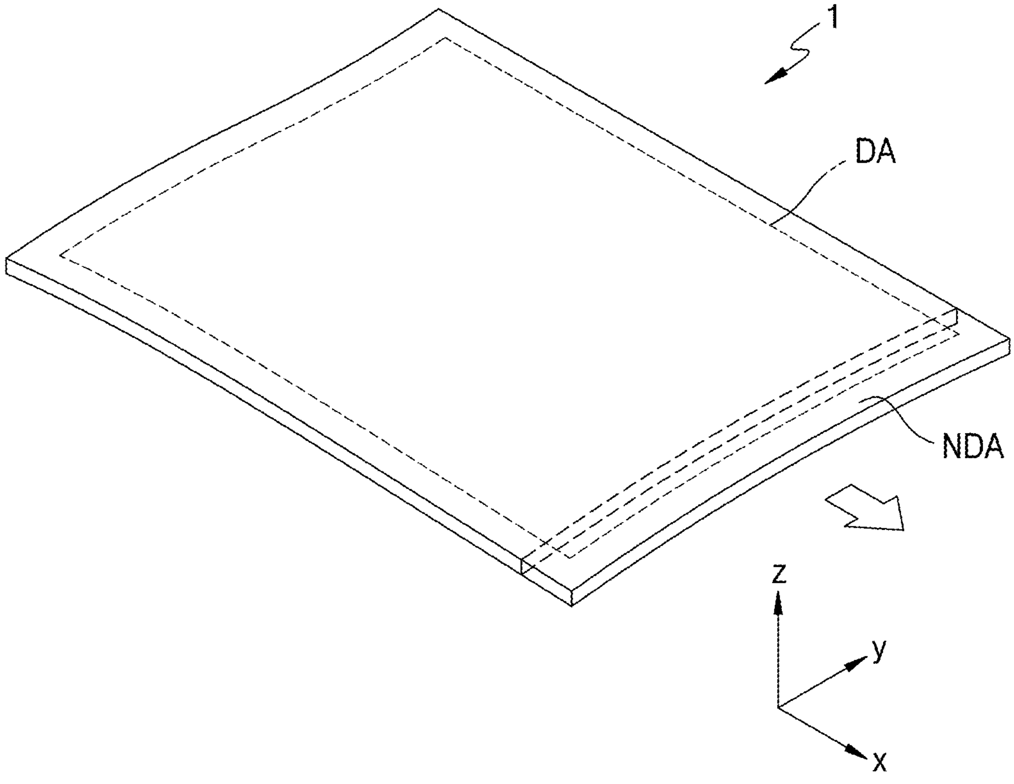
Figure 2C:
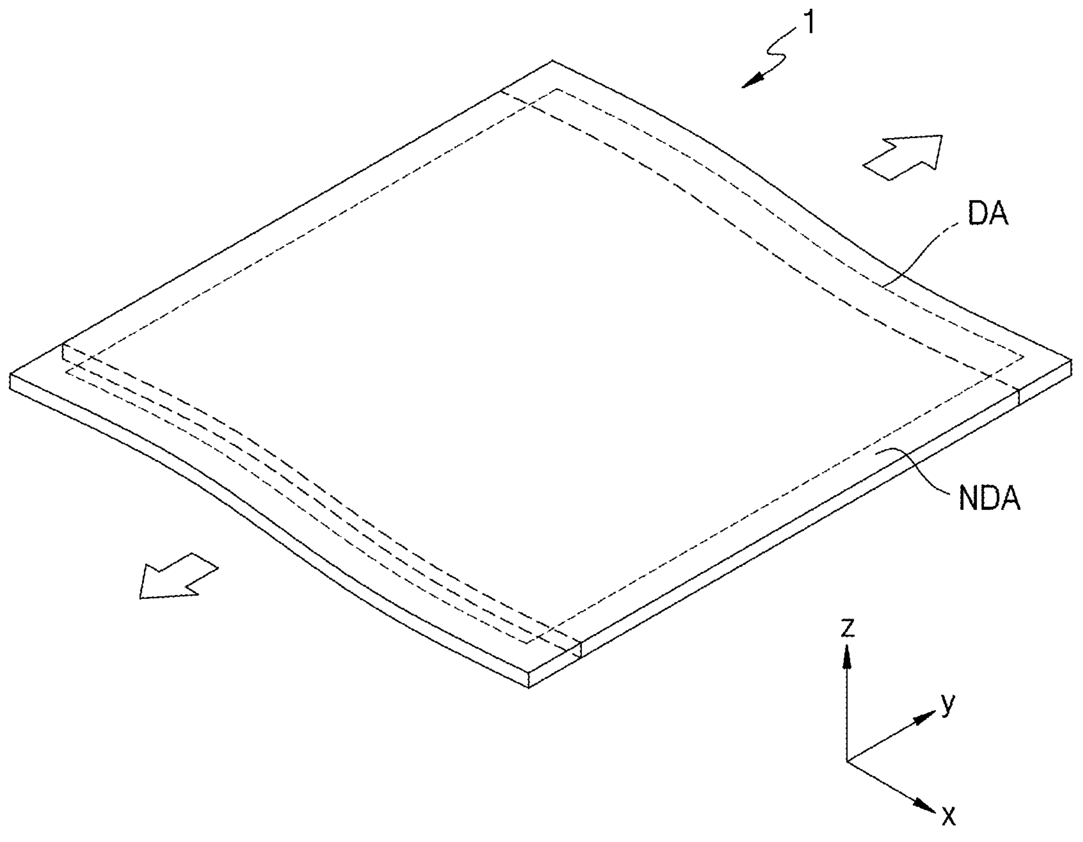
FIG. 2C is a perspective view of the display device of FIG. 1 stretched in a second direction.
Figure 2D:
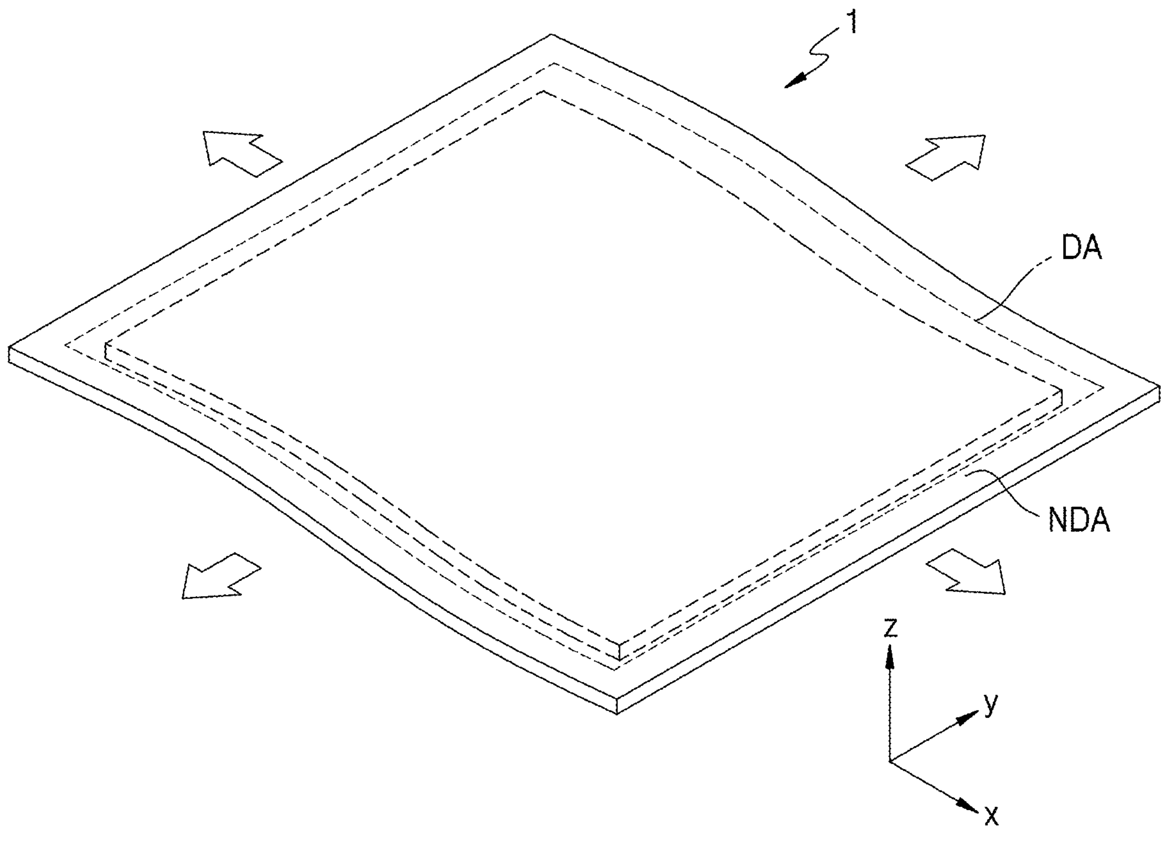
FIG. 2D is a perspective view of the display device of FIG. 1 stretched in the first and second directions.
Figure 2E:
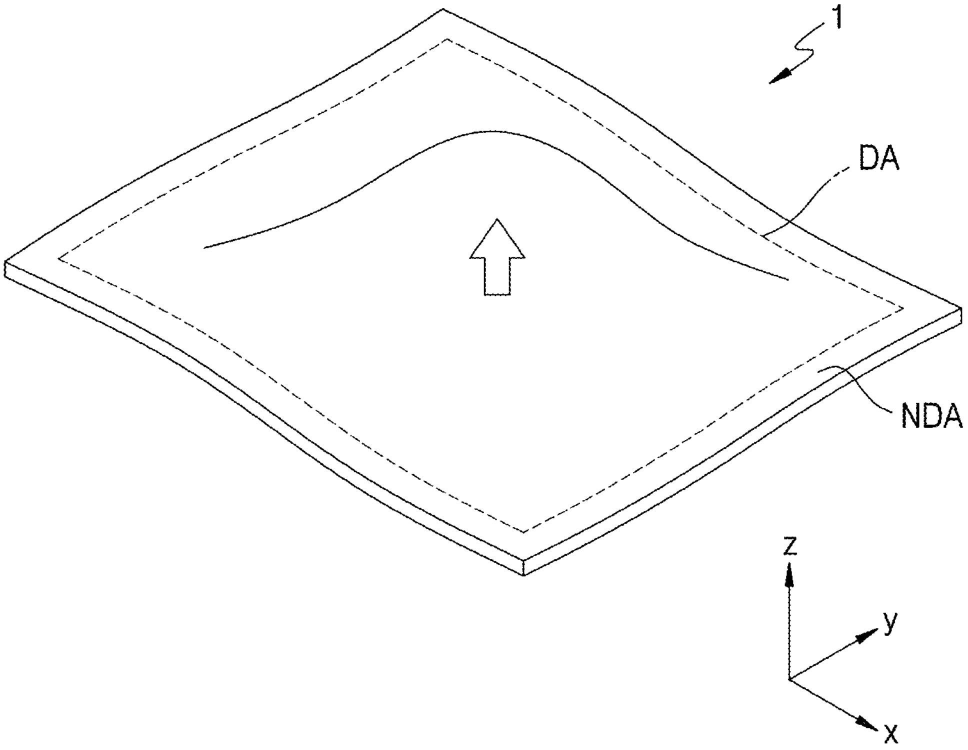
FIG. 2E is a perspective view of the display device of FIG. 1 stretched in a third direction.

FIG. 1 is a schematic perspective view of a display device 1 according to an embodiment. FIGS. 2A and 2B are perspective views of the display device 1 of FIG. 1 stretched in a first direction. FIG. 2C is a perspective view of the display device 1 of FIG. 1 stretched in a second direction. FIG. 2D is a perspective view of the display device of FIG. 1 stretched in the first and second directions. FIG. 2E is a perspective view of the display device 1 of FIG. 1 stretched in a third direction.

Referring to FIG. 1, the display device 1 may be a stretchable display device that may be stretched or shrunk in various directions. The display device 1 may include a display area DA and a non-display area NDA. The display area DA may include a plurality of pixels. The display device 1 may provide a certain image by using light emitted from the plurality of pixels. The non-display area NDA may be placed outside the display area DA. The non-display area NDA may entirely surround the display area DA.

The display device 1 may be stretched in a first direction (e.g., the x direction and/or the −x direction) by an external force applied by an external object or a user. In an embodiment, as illustrated in FIGS. 2A and 2B, the display area DA and/or the non-display area NDA of the display device 1 may be stretched in the first direction (e.g., the x direction and/or the −x direction). For example, as illustrated in FIG. 2A, the display device 1 may be stretched in the x direction and −x direction, or may be stretched in the x direction or −x direction while one side of the display device 1 is fixed. FIG. 2B illustrates an example in which the display device 1 is stretched in the x direction or the −x direction while one side of the display device 1 is fixed.

The display device 1 may be stretched in the second direction (e.g., the y direction and/or the −y direction) by an external force applied by an external object or a user. In an embodiment, as illustrated in FIG. 2C, the display area DA and/or the non-display area NDA of the display device 1 may be stretched in the y direction and −y direction. In another embodiment, the display area DA and/or the non-display area NDA of the display device 1 may be stretched in the y direction or −y direction while one side of the display device 1 is fixed.

The display device 1 may be stretched in a plurality of directions, for example, in the first direction (e.g., the x direction and/or the −x direction) and the second direction (e.g., the y direction and/or the −y direction), by an external force applied by an external object or a part of a person's body. As illustrated in FIG. 2D, the display area DA and/or the non-display area NDA of the display device 1 may be stretched in the +x direction and the ty direction.

The display device 1 may be stretched in a third direction (e.g., the z direction or the −z direction) by an external force applied by an external object or a part of a person's body. In an embodiment, FIG. 2E illustrates that a portion of the display device 1, for example, a portion of the display area DA protrudes in the z direction. In another embodiment, a portion of the display device 1, for example, a portion of the display area DA may protrude in the −z direction (or be dented in the z direction).

Although FIGS. 2A to 2E show that the display device 1 is stretched in the first direction, the second direction, and/or the third direction, the disclosure is not limited thereto. In another embodiment, the display device 1 may be deformed into various irregular shapes, such as, for example, being bent or twisted along two or more axes.

Figure 3:
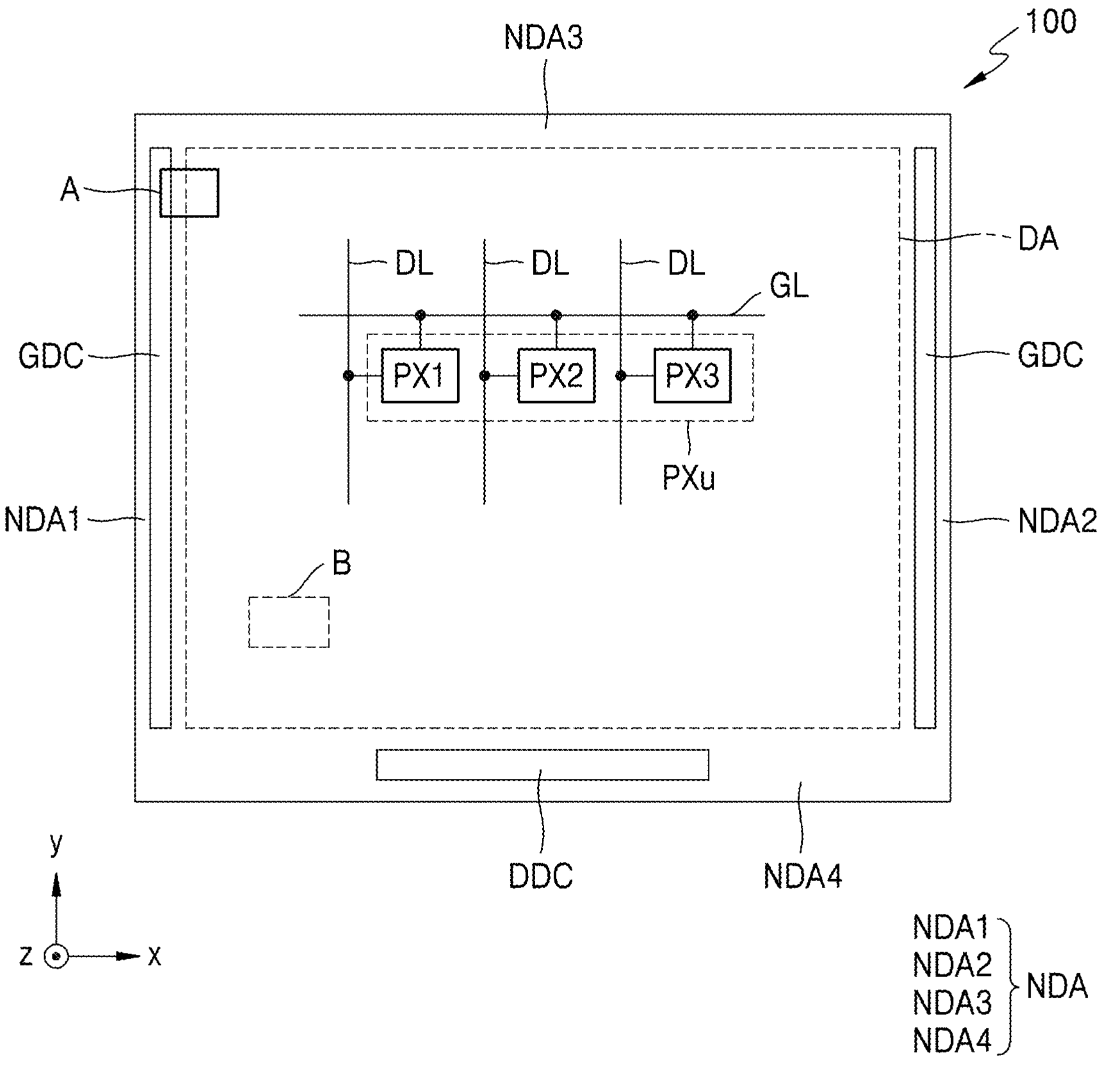
FIG. 3 is a schematic plan view of a display device according to an embodiment.

FIG. 3 is a schematic plan view of a display device according to an embodiment.

A plurality of pixels PX may be arranged in a display area DA of a substrate 100. The plurality of pixels PX may include a first pixel PX1 that emits light in a first color, a second pixel PX2 that emits light in a second color, and a third pixel PX3 that emits light in a third color. For example, the first pixel PX1 may be a red pixel, the second pixel PX2 may be a green pixel, and the third pixel PX3 may be a blue pixel. The first pixel PX1, the second pixel PX2, and the third pixel PX3 may each include a pixel circuit and a light-emitting element electrically connected to the pixel circuit. The pixel circuit may include a plurality of transistors and at least one capacitor and may be a pixel driving circuit that controls driving of the light-emitting element. A plurality of conductive lines (e.g., gate lines GL, data lines DL, and voltage lines) that provide electrical signals to the pixels PX may be arranged in the display area DA.

A unit pixel PXu composed of the first pixel PX1, the second pixel PX2, and the third pixel PX3 may be repeatedly arranged in a certain pattern in the x direction and the y direction. The first pixel PX1, the second pixel PX2, and the third pixel PX3 within the unit pixel PXu may be connected to the same gate line GL and each may be connected to a corresponding data line DL.

A driving circuit for providing electrical signals to light-emitting elements arranged in the display area DA and pixel circuits electrically connected to the light-emitting elements may be arranged in a non-display area NDA surrounding the display area DA. A gate driving circuit GDC may be arranged in each of a first non-display area NDA1 and a second non-display area NDA2 on both sides of the display area DA. The gate driving circuit GDC may be connected to gate lines arranged in the display area DA.

Although FIG. 3 illustrates that the gate driving circuit GDC is arranged in each of the first non-display area NDA1 and the second non-display area NDA2, the disclosure is not limited thereto. In another embodiment, the gate driving circuit GDC may be arranged in either the first non-display area NDA1 or the second non-display area NDA2. Part or all of the gate drive circuit GDC may be directly formed in the non-display area NDA during the process of forming transistors constituting the pixel circuit in the display area DA.

A data driving circuit DDC may be arranged in a third non-display area NDA3 and/or a fourth non-display area NDA4, which connect the first non-display area NDA1 and the second non-display area NDA2 to each other. In an embodiment, FIG. 3 illustrates that the data driving circuit DDC is arranged in the fourth non-display area NDA4. In another embodiment, the data driving circuit DDC may be arranged in each of the third non-display area NDA3 and the fourth non-display area NDA4.

The data drive circuit DDC may be formed in the form of an integrated circuit chip. In an embodiment, the data drive circuit DDC may be directly arranged in the fourth non-display area NDA4 of the substrate 100 in a Chip On Glass (COG) or Chip On Plastic (COP) manner, as illustrated in FIG. 3. In another embodiment, the display device 1 may further include a flexible circuit board (not illustrated) electrically connected through a terminal portion (not illustrated) arranged in the fourth non-display area NDA4 of the substrate 100, and the data driving circuit DDC may be arranged on the flexible circuit board.

The elongation rate of the non-display area NDA may be equal to or less than the elongation rate of the display area DA. In an embodiment, the elongation rate of the non-display area NDA may be different for each area. For example, the first non-display area NDA1, the second non-display area NDA2, and the third non-display area NDA3 may have substantially the same elongation rate, but the elongation rate of the fourth non-display area NDA4 may be less than the elongation rate of each of the first non-display area NDA1, the second non-display area NDA2, and the third non-display area NDA3.

Figure 4A:
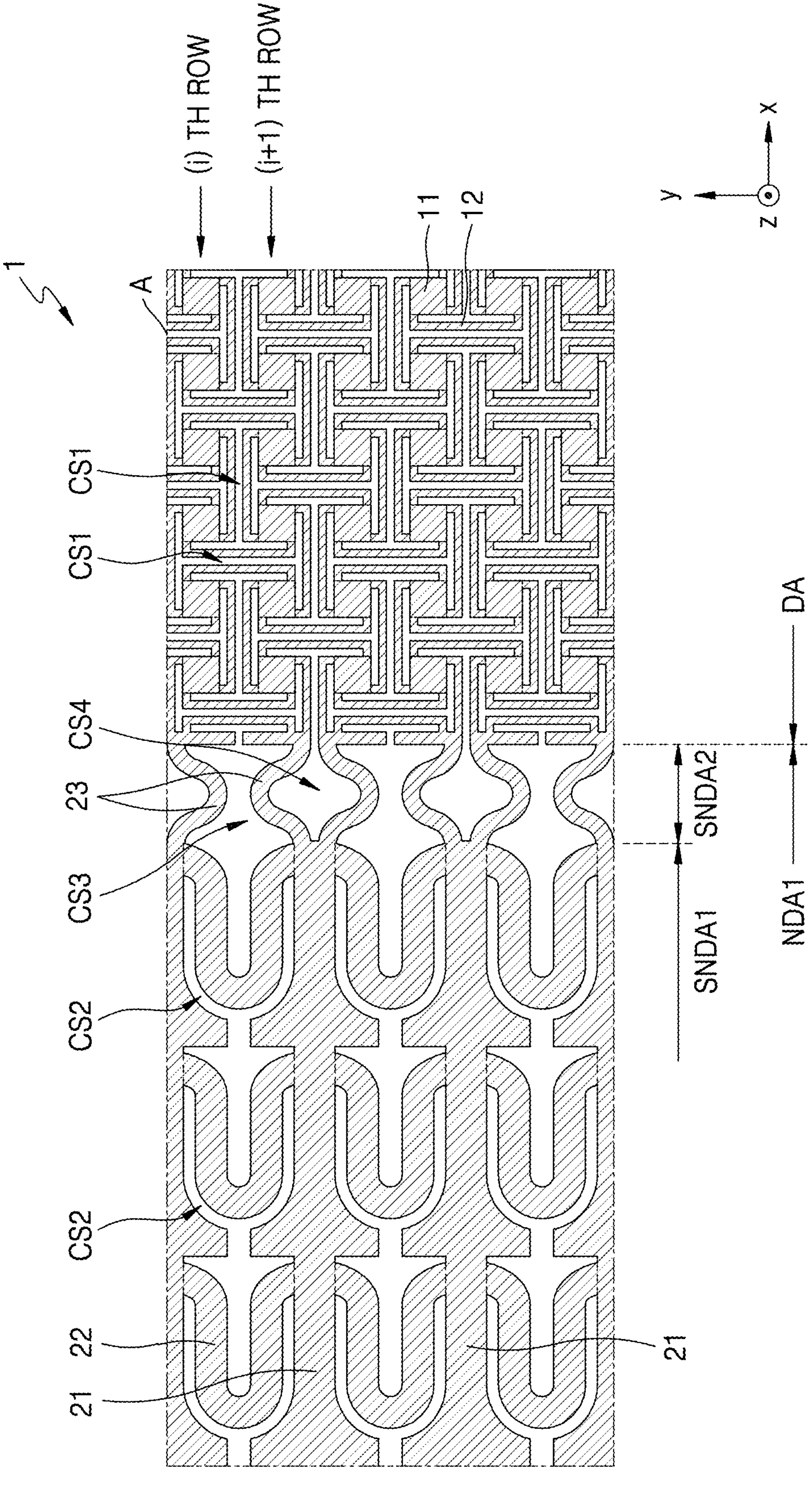
FIG. 4A is an enlarged plan view of an area A of FIG. 3 as a part of a display device according to an embodiment.

FIG. 4A is an enlarged plan view of an area A of FIG. 3 as a part of a display device 1 according to an embodiment.

Referring to FIG. 4A, the display device 1 may include first island portions 11 spaced apart from each other in a first direction (e.g., the x direction or the −x direction) and a second direction (e.g., the y direction or the −y direction) in the display area DA, and first bridge portions 12 connecting adjacent first island portions 11 to each other.

Each of the first island portions 11 may be connected to a plurality of first bridge portions 12. For example, each of the first island portions 11 may be connected to four first bridge portions 12. Two first bridge portions 12 may be arranged on both sides of the first island portion 11 in the first direction (e.g., the x direction or the −x direction), and the remaining two first bridge portions 12 may be arranged on both sides of the first island portion 11 in the second direction (e.g., the y direction or the −y direction). In an embodiment, the four first bridge portions 12 may be respectively connected to the four sides of the first island portion 11. Each of the four first bridge portions 12 may be adjacent to each corner of the first island portion 11.

The first bridge portions 12 may be spaced apart from each other by a first opening CS1 located between the first bridge portions 12. In an embodiment, a first opening CS1 having approximately an H shape and a first opening CS1 having approximately an I shape obtained by rotating the H shape by 90 degrees may be alternately and repeatedly arranged in the first direction (e.g., the x direction or the −x direction) and the second direction (e.g., the y direction or the −y direction). Both ends of each first bridge portion 12 may be connected to each of the adjacent first island portions 11, and one side of each first bridge portion 12 may be spaced apart from one side of an adjacent first island portion 11 and/or one side of another first bridge portion 12 by the first opening CS1.

The display device 1 may include second island portions 21 spaced apart from each other in a non-display area, for example, the first non-display area NDA1 illustrated in FIG. 4A, and second bridge portions 22 connecting adjacent second island portions 21 to each other.

Each of the second island portions 21 may extend in the first direction (e.g., the x direction or the −x direction). The second island portions 21 may be spaced apart from each other in the second direction (e.g., the y direction or the −y direction) that crosses the first direction (e.g., the x direction or the −x direction). Each second island portion 21 may include drivers of the gate driving circuit GDC (see FIG. 2) described with reference to FIG. 3.

The second bridge portion 22 may have a serpentine shape. The length of the second bridge portion 22 may be greater than the shortest distance between adjacent second island portions 21 in the second direction (e.g., the y direction or the −y direction). In an embodiment, the second bridge portion 22 may have approximately an omega (Ω) shape that is convex toward the first direction (e.g., the x direction or the −x direction). The second bridge portions 22 may be arranged between adjacent second island portions 21 and may be spaced apart from each other.

The second bridge portions 22 between adjacent second island portions 21 may be spaced apart from each other by second openings CS2. Between the adjacent second island portions 21, the second openings CS2 and the second bridge portions 22 may be alternately arranged in the first direction (e.g., the x direction or the −x direction). The second openings CS2 may have the same shape. Both ends of each second bridge portion 22 may be connected to each of the adjacent second island portions 21, and one side of each second bridge portion 22 may be spaced apart from one side of an adjacent second island portion 21 and/or one side of another second bridge portion 22 by the second opening CS2.

One of the second island portions 21 arranged in the first non-display area NDA1 may correspond to a plurality of rows of first island portions 11 arranged in the display area DA1. For example, one of the second island portions 21 arranged in the first non-display area NDA1 may correspond to first island portions 11 arranged in the (i)th row and first island portions 11 arranged in the (i+1)th row in the display area DA (where I is a positive number greater than 0). Although FIG. 4A illustrates that one second island portion 21 corresponds to two rows of first island portions 11, but the disclosure is not limited thereto. In another embodiment, one second island portion 21 arranged in the first non-display area NDA1 may correspond to n rows of first island portions 11 arranged in the display area DA1 (where n is a positive number that is 3 or more).

The non-display area, for example, the first non-display area NDA1, may include a first sub-non-display area SNDA1 in which the second island portions 21 and the second bridge portions 22, described herein, are arranged, and a second sub-non-display area SNDA2 between the first sub-non-display area SNDA1 and the display area DA. Third bridge portions 23 may be arranged in the second sub-non-display area SNDA2 and connect the display area DA with the first sub-non-display area SNDA1. One end of the third bridge portion 23 may be connected to the second island portion 21 and/or the second bridge portion 22, and the other end of the third bridge portion 23 may be connected to the first island portion 11 and/or the first bridge portion 12.

The third bridge portion 23 may have a serpentine shape. In an embodiment, the shape of the third bridge portion 23 may be different from the shape of each of the first bridge portion 12 and the second bridge portion 22. In an embodiment, as illustrated in FIG. 4A, the third bridge portion 23 may have approximately an Ω shape that is convex toward the second direction (e.g., the y direction or the −y direction). The third bridge portions 23 may have a symmetrical structure, in which one of the adjacent third bridge portions 23 arranged in the second direction (e.g., the y direction or the −y direction) is convex in the y direction and the other is convex in the −y direction. Between the third bridge portions 23, third openings CS3 and fourth openings CS4 of different shapes may have a repeated structure. The width of the third bridge portion 23 may be different from the width of the first bridge portion 12 and the width of the second bridge portion 22. In an embodiment, the width of the third bridge portion 23 may be greater than the width of the first bridge portion 12 and may be less than the width of the second bridge portion 22.

FIG. 4A illustrates that the second island portion 21 and the second bridge portion 22 in the non-display area, for example, the first non-display area NDA1, have different shapes from the first island portion 11 and the first bridge portion 12, respectively, in the display area DA. In another embodiment, the second island portion 21 and the second bridge portion 22 in the non-display area may have the same shape as the first island portion 11 and the first bridge portion 12, respectively, in the display area DA.

Figure 4B:
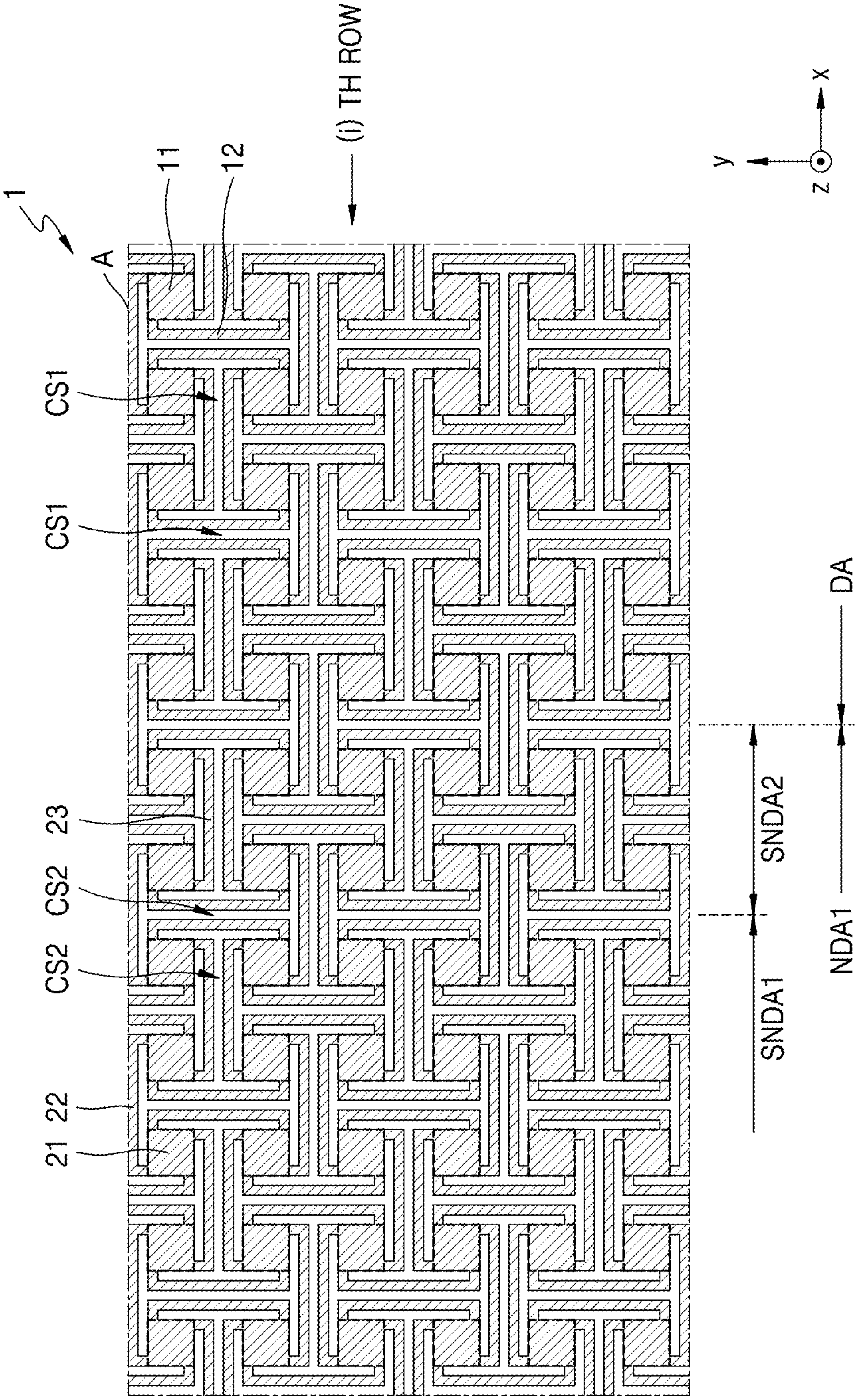
FIG. 4B is an enlarged plan view of an area A of FIG. 3 as a part of a display device according to an embodiment.

FIG. 4B is an enlarged plan view of an area A of FIG. 3 as a part of a display device 1 according to an embodiment.

Referring to FIG. 4B, the display device 1 may include first island portions 11 spaced apart from each other in a display area DA and first bridge portions 12 spaced apart from each other by a first opening CS1 and connecting adjacent first island portions 11 to each other. The structure of the display area DA in FIG. 4B may be the same as the structure of the display area DA previously described with reference to FIG. 4A.

The display device 1 may include second island portions 21 and second bridge portions 22, arranged in a non-display area, for example, a first non-display area NDA1. In an embodiment, the second island portions 21 and the second bridge portions 22 may have substantially the same shape as the first island portions 11 and the first bridge portions 12, respectively.

The second island portions 21 may be spaced apart from each other in a first direction (e.g., the x direction or the −x direction) and a second direction (e.g., the y direction or the −y direction) in the non-display area, for example, the first non-display area NDA1. Each of the second bridge portions 22 may connect adjacent second island portions 21 to each other. The second bridge portions 22 may be spaced apart from each other by a second opening CS2 located between the second bridge portions 22.

The second opening CS2 may have substantially the same shape as the first opening CS1. For example, a second opening CS2 having approximately an H shape and a second opening CS2 having approximately an I shape may be alternately and repeatedly arranged in the non-display area, for example, the first non-display area NDA1. Both ends of each second bridge portion 22 may be connected to each of the adjacent second island portions 21, and one side of each second bridge portion 22 may be spaced apart from one side of an adjacent second island portion 21 and/or one side of another second bridge portion 22 by the second opening CS2.

Each second island portion 21 may be connected to four second bridge portions 22. Each second island portion 21 may include drivers of the gate driving circuit GDC (see FIG. 2) described with reference to FIG. 3.

Second island portions 21 in one row arranged in the first non-display area NDA1 may correspond to first island portions 11 in one row arranged in the display area DA1. For example, second island portions 21 arranged in the (i)th row in the first direction (e.g., the x direction or the −x direction) in the first non-display area NDA1 may correspond to first island portions 11 arranged in the same row, for example, the (i)th row, in the display area DA (where i is a positive number greater than 0).

The display device 1 may include third bridge portions 23 arranged in the second sub-non-display area SNDA2 for connecting the display area DA to the first sub-non-display area SNDA1. A non-display area, for example, the first non-display area NDA1, may include a first sub-non-display area SNDA1 in which the second island portions 21 and the second bridge portions 22 are arranged, and a second sub-non-display area SNDA2 including third bridge portions 23 and located between the first sub-non-display area SNDA1 and the display area DA. The third bridge portion 23 may be substantially the same as the first bridge portion 12 and the second bridge portion 22. For example, the width of the third bridge portion 23 may be the same as the width of the first bridge portion 12 and the width of the second bridge portion 22.

Figure 4C:
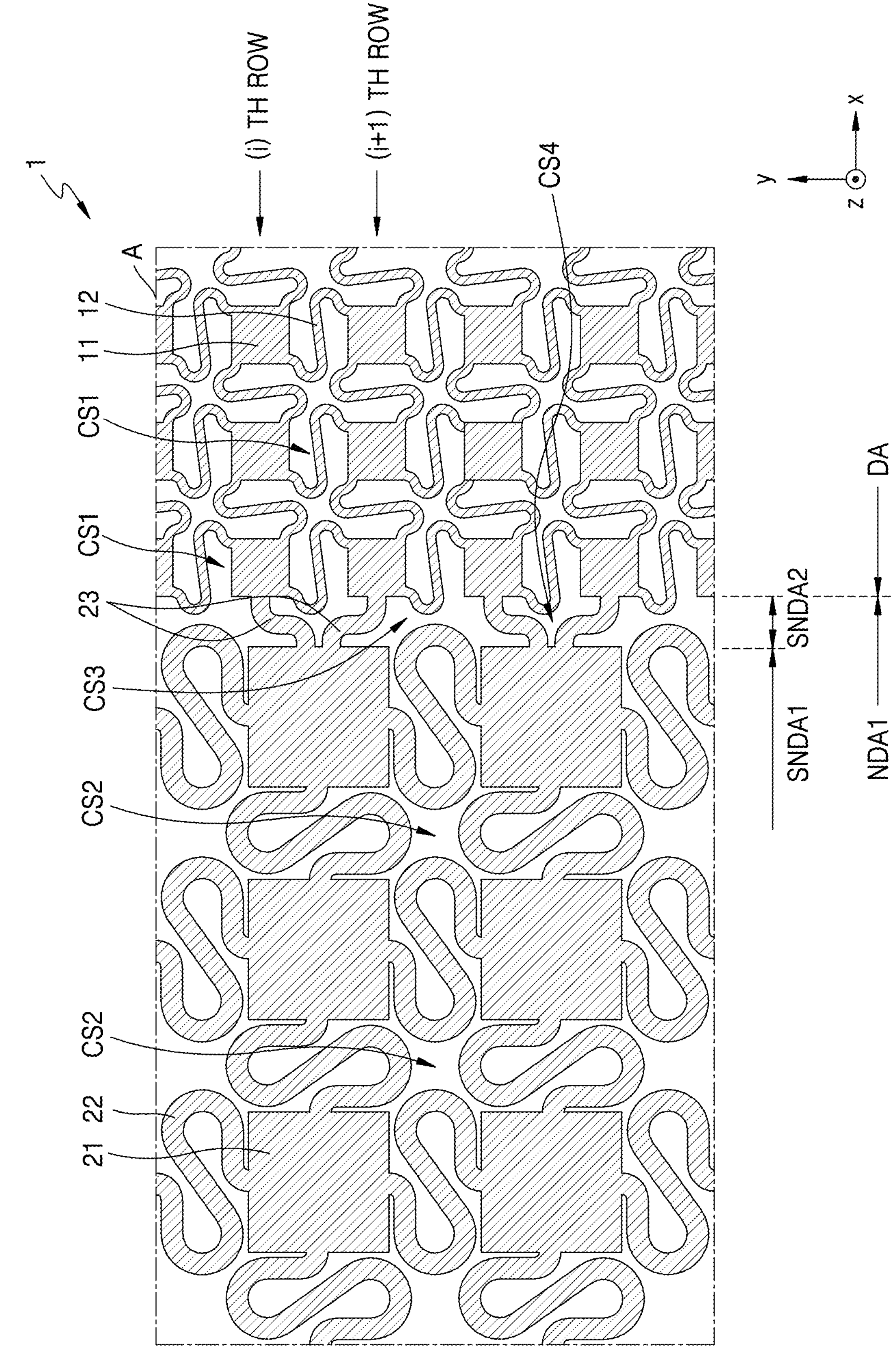
FIG. 4C is an enlarged plan view of an area A of FIG. 3 as a part of a display device according to an embodiment.

FIG. 4C is an enlarged plan view of an area A of FIG. 3 as a part of a display device according to an embodiment.

Referring to FIG. 4C, the display device 1 may include first island portions 11 spaced apart from each other in a first direction (e.g., the x direction or the −x direction) and a second direction (e.g., the y direction or the −y direction) in the display area DA, and first bridge portions 12 connecting adjacent first island portions 11 to each other.

The first bridge portions 12 may be arranged such that the first bridge portions 12 are spaced apart from each other by the first opening CS1 located between the first bridge portions 12. The first bridge portion 12 may have a serpentine shape. For example, as illustrated in FIG. 4C, the first bridge portion 12 may have the shape of approximately 'alphabet S'.

Each of the first island portions 11 may be connected to a plurality of first bridge portions 12. For example, each of the first island portions 11 may be connected to four first bridge portions 12. Two first bridge portions 12 may be arranged on both sides of the first island portion 11 in the first direction (e.g., the x direction or the −x direction), and the remaining two first bridge portions 12 may be arranged on both sides of the first island portion 11 in the second direction (e.g., the y direction or the −y direction). The four first bridge portions 12 may be respectively connected to the four sides of the first island portion 11. Each of the four first bridge portions 12 may be adjacent to each corner of the first island portion 11.

The display device 1 may include second island portions 21 spaced apart from each other in a first direction (e.g., the x direction or the −x direction) and a second direction (e.g., the y direction or the −y direction) in a non-display area, for example, in the first non-display area NDA1 illustrated in FIG. 4C, and second bridge portions 22 connecting adjacent second island portions 21 to each other.

The second bridge portions 22 may be arranged such that the second bridge portions 22 are spaced apart from each other by the second opening CS2 located between the second bridge portions 22. The second bridge portion 22 may have a serpentine shape. For example, as illustrated in FIG. 4C, the second bridge portion 22 may have the shape of approximately 'alphabet S'. The size and/or width of the second bridge portion 22 may be different from the size and/or width of the first bridge portion 12. For example, the size and/or width of the second bridge portion 22 may be greater than the size and/or width of the first bridge portion 12. The radius of curvature of a round portion of the second bridge portion 22 may be different from the radius of curvature of a round portion of the first bridge portion 12. For example, the radius of curvature of the round portion of the second bridge portion 22 may be greater than the radius of curvature of the round portion of the first bridge portion 12.

Each of the second island portions 21 may be connected to a plurality of second bridge portions 22. Each of the second island portions 21 may be connected to four second bridge portions 22. Two second bridge portions 22 may be arranged on both sides of the second island portion 21 in the first direction (e.g., the x direction or the −x direction), and the remaining two second bridge portions 22 may be arranged on both sides of the second island portion 21 in the second direction (e.g., the y direction or the −y direction). In an embodiment, the four second bridge portions 22 may be respectively connected to the four sides of the second island portion 21. Each second bridge portion 22 may be connected to a central portion of each side of the second island portion 21.

Second island portions 21 in one row arranged in the first non-display area NDA1 may correspond to first island portions 11 in a plurality of rows arranged in the display area DA1. For example, the second island portions 21 in one row arranged in the first non-display area NDA1 may correspond to first island portions 11 arranged in the (i)th row of the display area DA and first island portions 11 arranged in the (i+1)th row (where i is a positive number greater than 0). In another embodiment, one row of second island portions 21 may correspond to n rows of first island portions 11 (where n is a positive number that is 3 or more).

The non-display area, for example, the first non-display area NDA1, may include a first sub-non-display area SNDA1 in which the second island portions 21 and the second bridge portions 22, described herein, are arranged, and a second sub-non-display area SNDA2 between the first sub-non-display area SNDA1 and the display area DA. Third bridge portions 23 may be arranged in the second sub-non-display area SNDA2 and connect the display area DA with the first sub-non-display area SNDA1. One end of the third bridge portion 23 may be connected to the second island portion 21 and the other end of the third bridge portion 23 may be connected to the first island portion 11. For example, one end of the third bridge portion 23 may be connected to a central portion of one side of the second island portion 21, and the other end of the third bridge portion 23 may be connected to a central portion of one side of the first island portion 11.

The third bridge portion 23 may have a serpentine shape. In an embodiment, the shape of the third bridge portion 23 may be different from the shape of each of the first bridge portion 12 and the second bridge portion 22. The width of the third bridge portion 23 may be different from the width of the first bridge portion 12 and the width of the second bridge portion 22. The width of the third bridge portion 23 may be greater than the width of the first bridge portion 12 and may be less than the width of the second bridge portion 22. Third openings CS3 and fourth openings CS4 of different shapes may be alternately arranged between the third bridge portions 23 in the second direction (e.g., the y direction or the −y direction).

Figure 4D:
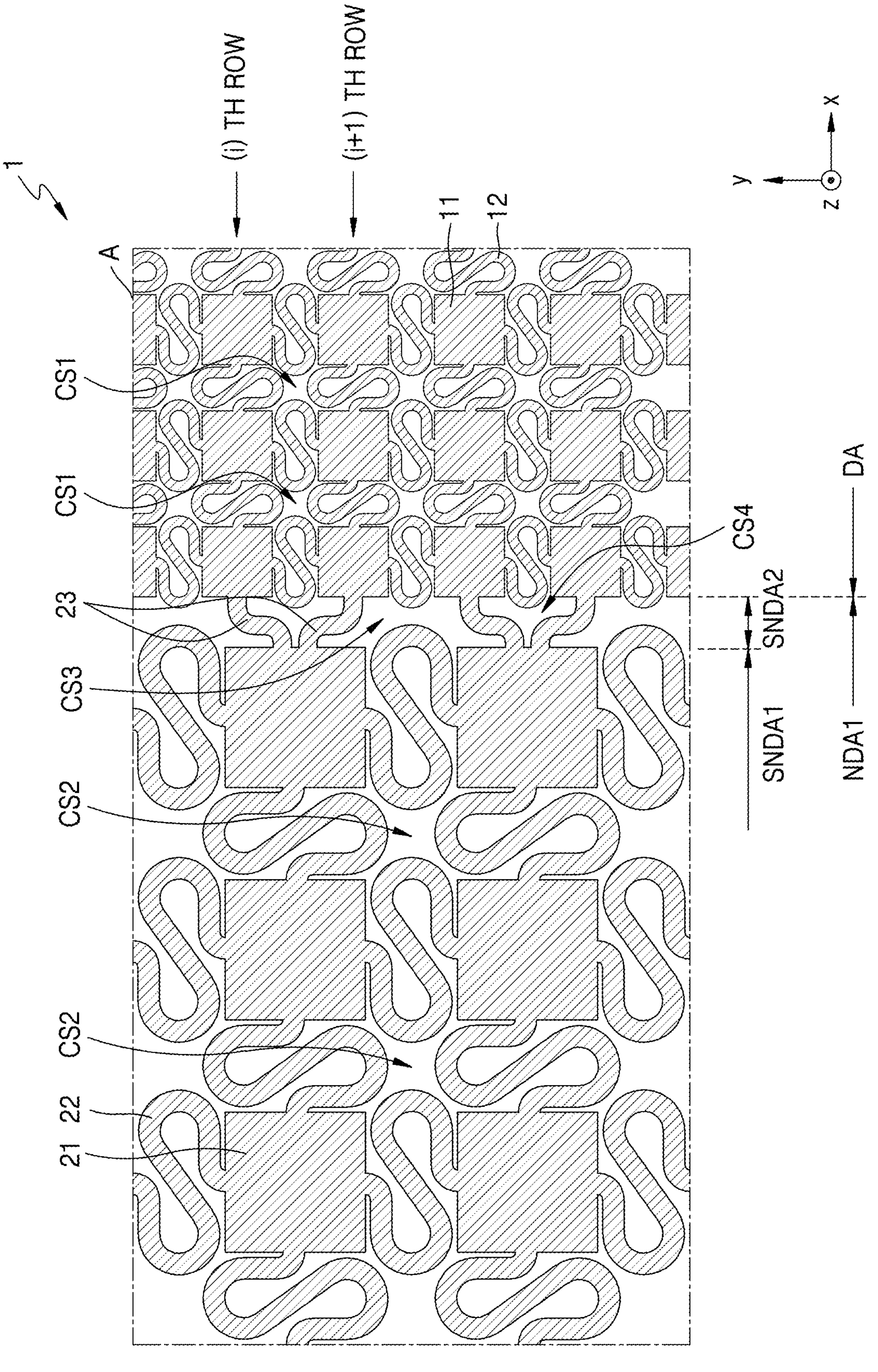
FIG. 4D is an enlarged plan view of an area A of FIG. 3 as a part of a display device according to an embodiment.

FIG. 4D is an enlarged plan view of an area A of FIG. 3 as a part of a display device according to an embodiment.

Referring to FIG. 4D, the display device 1 may include first island portions 11 spaced apart from each other in a first direction (e.g., the x direction or the −x direction) and a second direction (e.g., the y direction or the −y direction) in the display area DA, and first bridge portions 12 connecting adjacent first island portions 11 to each other.

The first bridge portions 12 may be arranged such that the first bridge portions 12 are spaced apart from each other by the first opening CS1 located between the first bridge portions 12. The first bridge portion 12 may have a serpentine shape. For example, as illustrated in FIG. 4D, the first bridge portion 12 may have the shape of approximately 'alphabet S'.

Each of the first island portions 11 may be connected to a plurality of first bridge portions 12. For example, each of the first island portions 11 may be connected to four first bridge portions 12. Two first bridge portions 12 may be arranged on both sides of the first island portion 11 in the first direction (e.g., the x direction or the −x direction), and the remaining two first bridge portions 12 may be arranged on both sides of the first island portion 11 in the second direction (e.g., the y direction or the −y direction). The four first bridge portions 12 may be respectively connected to the four sides of the first island portion 11. Each of the four first bridge portions 12 may be connected to a central portion of each side of the first island portion 11.

The display device 1 may include second island portions 21 spaced apart from each other in the first non-display area NDA1 and second bridge portions 22 spaced apart from each other by a second opening CS2 and connecting adjacent second island portions 21 to each other. The structure of the first non-display area NDA1 in FIG. 4D may be the same as the structure of the first non-display area NDA1 described herein with reference to FIG. 4C.

The non-display area, for example, the first non-display area NDA1, may include a first sub-non-display area SNDA1 in which the second island portions 21 and the second bridge portions 22, described herein, are arranged, and a second sub-non-display area SNDA2 between the first sub-non-display area SNDA1 and the display area DA. Third bridge portions 23 may be arranged in the second sub-non-display area SNDA2 and connect the display area DA with the first sub-non-display area SNDA1. The structure of the second sub-non-display area SNDA2 in FIG. 4D may be the same as the structure of the second sub-non-display area SNDA2 described herein with reference to FIG. 4C.

Figure 5:
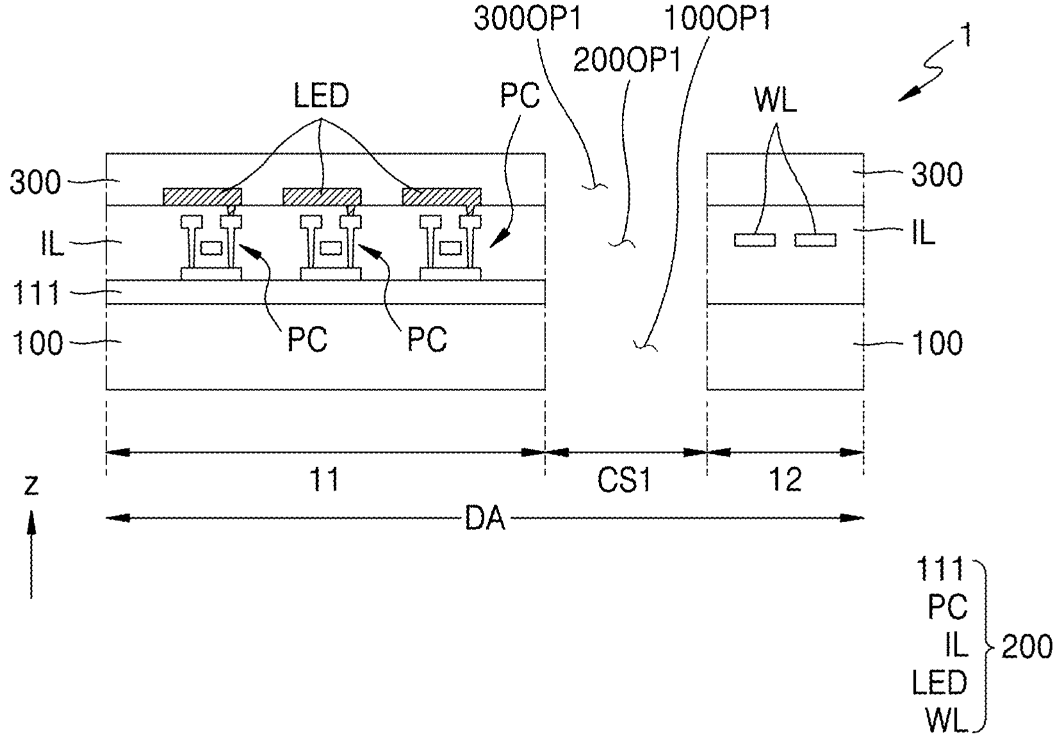
FIG. 5 is a schematic cross-sectional view illustrating a first island portion and a first bridge portion arranged in a display area of a display device according to an embodiment.

FIG. 5 is a schematic cross-sectional view illustrating a first island portion 11 and a first bridge portion 12 arranged in a display area DA of a display device 1 according to an embodiment.

Referring to FIG. 5, the first island portion 11 and the first bridge portion 12 arranged in the display area DA may be spaced apart from each other with a first opening CS1 between the first island portion 11 and the first bridge portion 12. The first island portion 11 may include light-emitting elements LED and a circuit (e.g., a pixel circuit (PC)) electrically connected to the light-emitting elements LED and for driving the light-emitting elements LED, and the first bridge portion 12 may include a wiring line WL electrically connected to pixel circuits PC arranged in each of the adjacent first island portions 11.

In the first island portion 11, a buffer layer 111 including an inorganic insulating material may be arranged on a substrate 100, and a pixel circuit PC may be arranged on the buffer layer 111. An insulating layer IL including an inorganic insulating material and/or an organic insulating material may be arranged between the pixel circuit PC and the light-emitting element LED. The light-emitting element LED may be arranged on the insulating layer IL and may be electrically connected to a corresponding pixel circuit PC. Light-emitting elements LED may emit light of different colors or the same color. In an embodiment, each of the light-emitting elements LED may emit red light, green light, or blue light. In some embodiments, the light-emitting elements LED may emit white light. In another embodiment, each of the light-emitting elements LED may emit red light, green light, blue light, or white light.

The substrate 100 may include a polymer resin, such as, for example, polyethersulfone, polyarylate, polyether imide, polyethylene naphthalate, polyethylene terephthalate, polyphenylene sulfide, polyimide, polycarbonate, cellulose triacetate, or cellulose acetate propionate. In an embodiment, the substrate 100 may include a single layer including the aforementioned resin. In another embodiment, the substrate 100 may have a multi-layered structure including a base layer including the aforementioned polymer resin and a barrier layer including an inorganic insulating material. The substrate 100 including a polymer resin may be flexible, rollable, or bendable.

In an embodiment, FIG. 5 illustrates that three pixel circuits PC are arranged in each of the first island portions 11 and three light-emitting elements LED are connected to each of the pixel circuits PC. However, the disclosure is not limited thereto. In another embodiment, the number of pixel circuits PC and light-emitting elements LED arranged in the first island portion 11 may be one, two, or four or more.

An encapsulation layer 300 may be arranged on the light-emitting elements LED and may protect the light-emitting elements LED from external force and/or moisture penetration. The encapsulation layer 300 may include an inorganic encapsulation layer and/or an organic encapsulation layer. In some embodiments, the encapsulation layer 300 may have a structure in which an inorganic encapsulation layer including an inorganic insulating material, an organic encapsulation layer including an organic insulating material, and an inorganic encapsulation layer including an inorganic insulating material are stacked. In another embodiment, the encapsulation layer 300 may include an organic material, such as, for example, resin. In some embodiments, the encapsulation layer 300 may include urethane epoxy acrylate. The encapsulation layer 300 may include a photosensitive material, such as, for example, photoresist.

In the first bridge portion 12, an insulating layer IL including an organic insulating material may be arranged on the substrate 100. In an example in which the display device 1 is stretched, unlike the first island portion 11, there may not be a layer including an inorganic insulating material, which is prone to cracks, in the first bridge portion 12, which is relatively deformed.

In an embodiment, the substrate 100 corresponding to the first bridge portion 12 may have the same stacked structure as the substrate 100 corresponding to the first island portion 11. In an embodiment, the substrate 100 corresponding to the first bridge portion 12 and the substrate 100 corresponding to the first island portion 11 may be polymer resin layers formed together in the same process. In another embodiment, the substrate 100 corresponding to the first bridge portion 12 may have a different stack structure from the substrate 100 corresponding to the first island portion 11. In some embodiments, the substrate 100 corresponding to the first island portion 11 may have a multi-layered structure including a base layer including a polymer resin and a barrier layer including an inorganic insulating material, and the substrate 100 corresponding to the first bridge portion 12 may have a structure of a polymer resin layer without a layer including an inorganic insulating material.

As described herein, wiring lines WL of the first bridge portion 12 may be signal lines (e.g., gate lines and data lines) for providing electrical signals to transistors included in the pixel circuit PC of the first island portion 11, or voltage lines (e.g., driving voltage lines and initialization voltage lines) for providing voltages. The encapsulation layer 300 may also be arranged in the first bridge portion 12. In another embodiment, the encapsulation layer 300 may be absent or omitted from the first bridge portion 12.

Referring to FIGS. 4A to 4D and FIG. 5, the substrate 100 corresponding to the first island portion 11 and the substrate 100 corresponding to the first bridge portion 12 may be connected to each other. In other words, the plan views illustrated in FIGS. 4A to 4D may be substantially the same as the plan view of the substrate 100 in FIG. 5. In other words, the substrate 100 may include an area corresponding to the first island portion 11, an area corresponding to the first bridge portion 12, and an opening 100OP1 having the same shape as the first opening CS1.

Similarly, the encapsulation layer 300 corresponding to the first island portion 11 and the encapsulation layer 300 corresponding to the first bridge portion 12 may be connected to each other. For example, the plan views illustrated in FIGS. 4A to 4D may be substantially the same as the plan view of the encapsulation layer 300. In other words, the encapsulation layer 300 may include an area corresponding to the first island portion 11, an area corresponding to the first bridge portion 12, and an opening 300OP1 having the same shape as the first opening CS1.

A circuit-light-emitting element layer 200 between the substrate 100 and the encapsulation layer 300 may include a buffer layer 111, a pixel circuit PC, a wiring line WL, an insulating layer IL, and a light-emitting element LED. Similar to the substrate 100, the plan view illustrated in FIGS. 4A to 4D may be substantially the same as the plan view of the circuit-light-emitting element layer 200. In other words, the circuit-light-emitting element layer 200 may include an opening 200OP1 having the same shape as the first opening CS1.

Figure 6:
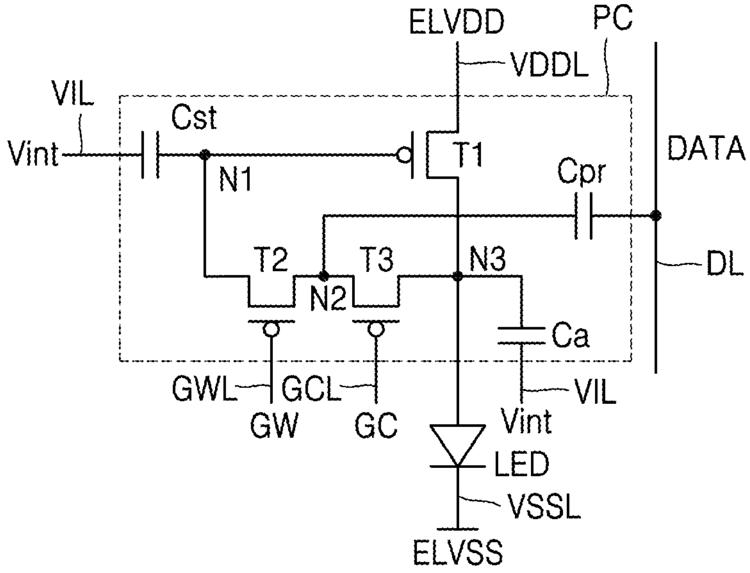
FIG. 6 is an equivalent circuit diagram of a pixel of a display device according to an embodiment.

FIG. 6 is an equivalent circuit diagram of a pixel of a display device according to an embodiment.

Referring to FIG. 6, a pixel PX (see FIG. 3) may include a light-emitting element LED and a pixel circuit PC connected to the light-emitting element LED. The pixel circuit PC may include a first capacitor Cst, a second capacitor Cpr, a third capacitor Ca, and first to third transistors T1, T2, and T3. The first transistor T1 may be a driving transistor configured to output a driving current corresponding to a data signal, and the second transistor T2 and the third transistor T3 may be switching transistors configured to transfer signals. A first electrode and second electrode of each of the first to third transistors T1, T2, and T3 may each be a source or a drain depending on the voltages of the first electrode and the second electrode. For example, depending on the voltages of the first electrode and the second electrode, the first electrode may be the source and the second electrode may be the drain, or the first electrode may be the drain and the second electrode may be the source. Hereinafter, a node where a gate of the first transistor T1 and a first capacitor electrode of the first capacitor Cst are connected to each other may be defined as a first node N1, a node where the first electrode of the second transistor T2 and a third capacitor electrode of the second capacitor Cpr are connected to each other may be defined as a second node N2, and a node where the second electrode of the first transistor T1 and the first electrode of the third transistor T3 are connected to each other may be defined as a third node N3.

The pixel PX may be connected to a first gate line GWL configured to transmit a first gate signal GW, a second gate line GCL configured to transmit a second gate signal GC, and a data line DL configured to transmit a data signal DATA. In some aspects, the pixel PX may be connected to a first driving voltage line VDDL configured to transmit a first driving voltage ELVDD, a second driving voltage line VSSL configured to transmit a second driving voltage ELVSS, and an initialization voltage line VIL configured to transmit an initialization voltage Vint.

The first transistor T1 may be connected between the first driving voltage line VDDL and the light-emitting element LED. The gate of the first transistor T1 may be connected to the first node N1. Accordingly, the gate of the first transistor T1 may be connected to the first capacitor electrode of the first capacitor Cst and the second electrode of the second transistor T2. The first electrode of the first transistor T1 may be connected to the first driving voltage line VDDL. The second electrode of the first transistor T1 may be connected to the third node N3. Accordingly, the second electrode of the first transistor T1 may be connected to the first electrode of the third transistor T3, a fifth capacitor electrode of the third capacitor Ca, and a first electrode of the light-emitting element LED. The first transistor T1 may be configured to receive the data signal DATA according to switching operations of the second transistor T2 and the third transistor T3 and control the current amount of the driving current flowing to the light-emitting element LED.

The second transistor T2 may be connected between the first node N1 and the second node N2. A gate of the second transistor T2 may be connected to the first gate line GWL. The first electrode of the second transistor T2 may be connected to the second node N2 and may be connected to the data line DL through the second capacitor Cpr. The second electrode of the second transistor T2 may be connected to the first node N1 and may be connected to the first capacitor electrode of the first capacitor Cst and the gate of the first transistor T1. The second transistor T2 may be configured to be turned on by the first gate signal GW transmitted to the first gate line GWL to electrically connect the second capacitor Cpr to the first capacitor Cst, and transfer the data signal DATA transmitted to the data line DL to the gate of the first transistor T1.

The third transistor T3 may be connected between the second node N2 and the third node N3. The third transistor T3 may include a gate connected to the second gate line GCL. The first electrode of the third transistor T3 may be connected to the third node N3. Accordingly, the first electrode of the third transistor T3 may be connected to the second electrode of the first transistor T1, the first electrode of the light-emitting element LED, and the fifth capacitor electrode of the third capacitor Ca. The second electrode of the third transistor T3 may be connected to the second node N2. Accordingly, the second electrode of the third transistor T3 may be connected to the third capacitor electrode of the second capacitor Cpr and the first electrode of the second transistor T2. The third transistor T3 may be configured to be turned on by the second gate signal GC transmitted to the second gate line GCL to diode-connect the first transistor T1 together with the second transistor T2, thereby compensating for the threshold voltage of the first transistor T1.

The first capacitor Cst may be connected between the first node N1 and the initialization voltage line VIL. The first capacitor Cst may include the first capacitor electrode and a second capacitor electrode. The first capacitor electrode of the first capacitor Cst may be connected to the first node N1 and may be connected to the gate of the first transistor T1 and the second electrode of the second transistor T2. The second capacitor electrode of the first capacitor Cst may be connected to the initialization voltage line VIL. The first capacitor Cst may be a storage capacitor and may store a voltage corresponding to the threshold voltage of the first transistor T1 and the data signal DATA. The first capacitor Cst may change the voltage of the first node N1 in response to a voltage change of the initialization voltage line VIL.

The second capacitor Cpr may be connected between the second node N2 and the data line DL. The second capacitor Cpr may include the third capacitor electrode and a fourth capacitor electrode. The third capacitor electrode of the second capacitor Cpr may be connected to the second node N2, and thus may be connected to the first electrode of the second transistor T2 and the second electrode of the third transistor T3. The fourth capacitor electrode of the second capacitor Cpr may be connected to the data line DL. The second capacitor Cst may change the voltage of the second node N2 in response to a voltage change of the data line DL.

The third capacitor Ca may be connected between the first electrode of the light-emitting element LED and the initialization voltage line VIL. The third capacitor Ca may include the fifth capacitor electrode and a sixth capacitor electrode. The fifth capacitor electrode of the third capacitor Ca may be connected to the third node N3, and thus may be connected to the second electrode of the first transistor T1, the first electrode of the third transistor T3, and the first electrode of the light-emitting element LED. The sixth capacitor electrode of the third capacitor Ca may be connected to the initialization voltage line VIL. The third capacitor Ca may store and maintain a voltage corresponding to the voltage difference between the first electrode of the light-emitting element LED and the initialization voltage line VIL, thereby improving black gradation or low gradation expression.

The light-emitting element LED may be connected between the first transistor T1 and the second driving voltage line VSSL. The light-emitting element LED may include the first electrode (pixel electrode or anode) and a second electrode (opposite electrode or cathode). The first electrode of the light-emitting element LED may be connected to the third node N3, and thus may be connected to the second electrode of the first transistor T1, the first electrode of the third transistor T3, and the fifth capacitor electrode of the third capacitor Ca. The second electrode of the light-emitting element LED may be connected to the second driving voltage line VSSL configured to provide the second driving voltage ELVSS. The light-emitting element LED may emit light with a brightness corresponding to the driving current supplied from the first transistor T1.

The pixel PX may perform initialization, threshold voltage compensation, data writing, and light-emitting operations during one frame. The initialization of the light-emitting element LED may be further performed before light-emitting. In an initialization period and a threshold voltage compensation period, the second transistor T2 and the third transistor T3 may operate together to initialize the voltage of the first electrode of the light-emitting element LED and the voltage of the gate of the first transistor T1 and compensate for the threshold voltage of the first capacitor Cst. For example, in a threshold voltage compensation period, the voltage of the first node N1 may have a value of 'ELVDD_H−|VTH|'. In this case, 'VTH' may be a threshold voltage, and 'EVLDD_H' may be a high level value of the first driving voltage ELVDD.

In a data writing period, while a plurality of pixels are scanned along a row, a first gate signal GW having a low level may be sequentially applied to the second transistor T2 of each pixel circuit PC. In some aspects, in the data writing period, the data signal DATA may be sequentially applied to the data line DL of each pixel circuit PC. In this case, in the data writing period, the second transistor T2 may be turned on and may transfer a data voltage input through the second capacitor Cpr to the gate of the first transistor T1. In this case, the first capacitor Cst may store and maintain the data voltage transferred to the gate of the first transistor T1 through the second transistor T2.

As described herein, the third capacitor electrode of the second capacitor Cpr may be connected to the second node N2, and the fourth capacitor electrode may be connected to the data line DL. Therefore, as the voltage of the data line DL changes, the voltage of the second node N2 may also change, and the second transistor T2 may be turned on to store the data voltage of the second node N2 in the first capacitor Cst. In this case, because the amount of change in a voltage transferred to the second node N2 is transferred through the second capacitor Cpr, and thus may be transferred at a reduced amount compared to the amount of change in a voltage applied to the data line DL. For example, in the data writing period, the voltage of the first node N1 may have a value of 'EVLDD_L−|VTH|+a×Vdata' due to charge sharing between the first node N1 and the second node N2 and coupling through the second capacitor Cpr. 'ELVDD_L' may be the low level value of the first driving voltage ELVDD, and 'a' may be 'CprF/CstF+CprF'. 'CstF' may be the capacitance of the first capacitor Cst, and 'CprF' may be the capacitance of the second capacitor Cpr.

In a light-emitting period, the first transistor T1 may be turned on and the second transistor T2 and the third transistor T3 may be turned off, and thus, the light-emitting element LED may emit light with the current flowing through the first transistor T1. In this case, the light-emitting element LED may emit light while changing the initialization voltage Vint from a low voltage to a high voltage when the data voltage is stored in the first capacitor electrode of the first capacitor Cst of all pixel. In other words, after the data writing period is completed for all pixels, all pixels may simultaneously enter the light-emitting period.

Figure 7A:
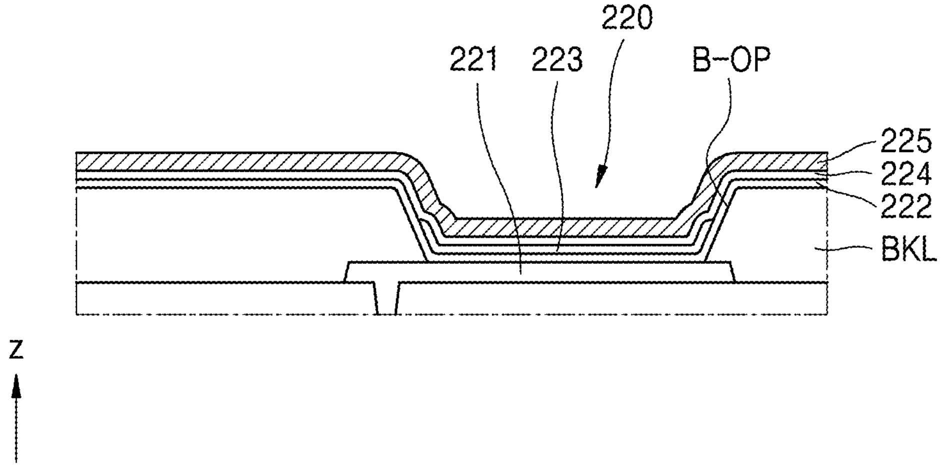
FIG. 7A is a schematic cross-sectional view of a light-emitting element of a display device according to an embodiment.

FIG. 7A is a schematic cross-sectional view of a light-emitting element of a display device according to an embodiment.

Referring to FIG. 7A, a light-emitting element according to an embodiment may include an organic light-emitting diode 220 including an organic material. The organic light-emitting diode 220 may include a first electrode 221 arranged on an insulating layer, a second electrode 225 facing the first electrode 221, and an emission layer 223 arranged between the first electrode 221 and the second electrode 225. A first functional layer 222 may be arranged between the first electrode 221 and the emission layer 223, and a second functional layer 224 may be arranged between the emission layer 223 and the second electrode 225.

The edge of the first electrode 221 may be covered with a bank layer BKL including an insulating material. The bank layer BKL may include an opening B-OP overlapping a center portion of the first electrode 221.

The first electrode 221 may include a conductive oxide, such as, for example, indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the first electrode 221 may further include a layer formed of ITO, IZO, ZnO, or $In_2O_3$, above/below the reflective layer described herein.

The emission layer 223 may include a polymeric or low-molecular-weight organic material that emits a certain color of light. The first functional layer 222 may include a hole transport layer (HTL) and/or a hole injection layer (HIL). The second functional layer 224 may include an electron transport layer (ETL) and/or an electron injection layer (EIL).

The second electrode 225 may include a conductive material with a low work function. For example, the second electrode 225 may include a (semi-)transparent layer including Ag, Mg, Al, Pt, Pd, Au, Ni, Nd, Ir, Cr, lithium (Li), calcium (Ca), an alloy thereof, or the like. Alternatively, the second electrode 225 may further include a layer including ITO, IZO, ZnO, AZO, or $In_2O_3$ on the (semi-)transparent layer including the materials described herein.

Figure 7B:
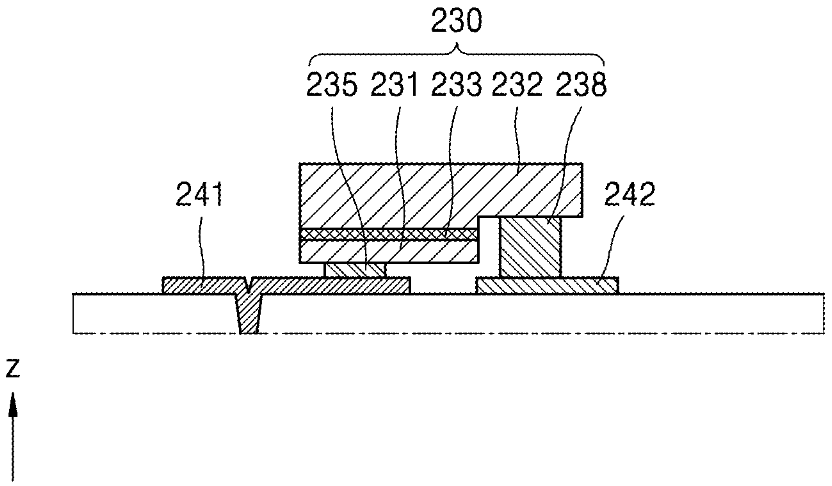
FIG. 7B is a schematic cross-sectional view of a light-emitting element of a display device according to an embodiment.

FIG. 7B is a schematic cross-sectional view of a light-emitting element of a display device according to an embodiment.

Referring to FIG. 7B, a light-emitting element according to an embodiment may include an inorganic light-emitting diode 230 including an inorganic material. The inorganic light-emitting diode 230 may include a first semiconductor layer 231, a second semiconductor layer 232, an intermediate layer 233 between the first semiconductor layer 231 and the second semiconductor layer 232, a first electrode 235 electrically connected to the first semiconductor layer 231, and a second electrode 238 electrically connected to the second semiconductor layer 232. The first electrode 235 and the second electrode 238 of the inorganic light-emitting diode 230 may be electrically connected to a first electrode pad 241 and a second electrode pad 242, respectively, arranged on the same layer.

In some embodiments, the first semiconductor layer 231 may include a p-type semiconductor layer. The p-type semiconductor layer may include a semiconductor material having a composition formula of InxAlyGa1-x-yN ($0 \leq x \leq 1$, $0 \leq y \leq 1$, and $0 \leq x+y \leq 1$), such as, for example, GaN, AlN, AlGaN, InGaN, InN, InAlGaN, or AlInN, and may be doped with a p-type dopant, such as, for example, Mg, Zn, Ca, Sr, or Ba.

The second semiconductor layer 232 may include, for example, an n-type semiconductor layer. The n-type semiconductor layer may include a semiconductor material having a composition formula of InxAlyGa1-x-yN ($0 \leq x \leq 1$, $0 \leq y \leq 1$, and $0 \leq x+y \leq 1$), such as, for example, GaN, AlN, AlGaN, InGaN, InN, InAlGaN, or AlInN, and may be doped with an n-type dopant, such as, for example, Si, Ge, and Sn.

The intermediate layer 233 is a region where electrons and holes recombine. As the electrons and the holes recombine, the intermediate layer 233 may transition to a lower energy level and may generate light with a wavelength corresponding thereto. For example, the intermediate layer 233 may include a semiconductor material having a composition formula of InxAlyGa1-x-yN ($0 \leq x \leq 1$, $0 \leq y \leq 1$, and $0 \leq x+y \leq 1$), and may be formed to have a single quantum well structure or a multi quantum well (MQW) structure. In some aspects, the intermediate layer 233 may include a quantum wire structure or a quantum dot structure.

Although FIG. 7B illustrates that the first semiconductor layer 231 includes a p-type semiconductor layer and the second semiconductor layer 232 includes an n-type semiconductor layer, the disclosure is not limited thereto. In another embodiment, the first semiconductor layer 231 may include an n-type semiconductor layer, and the second semiconductor layer 232 may include a p-type semiconductor layer.

Figure 8:
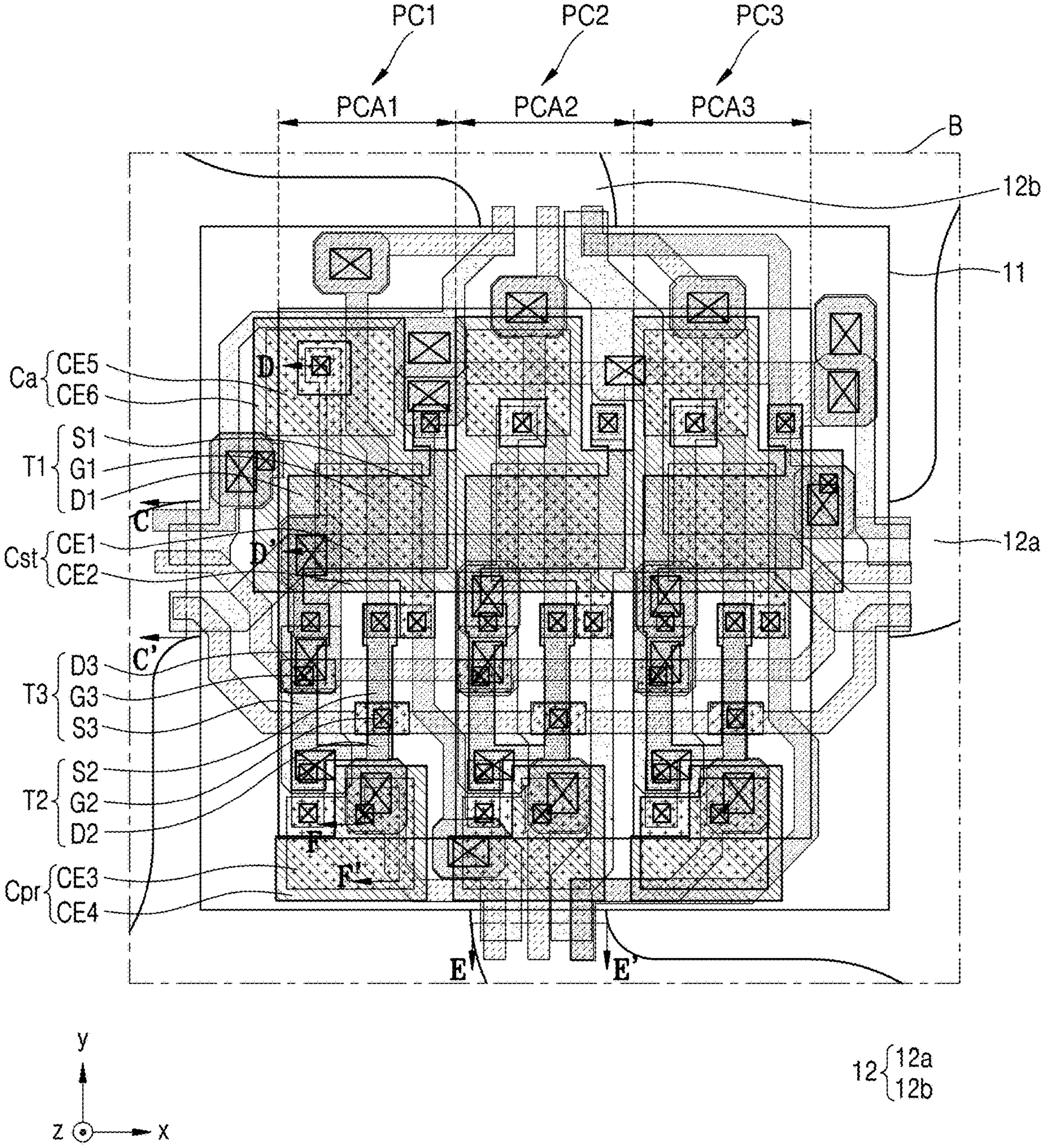
FIG. 8 is a schematic diagram illustrating components of pixel circuits arranged in a first island portion of a display device according to an embodiment.
Figure 9A:
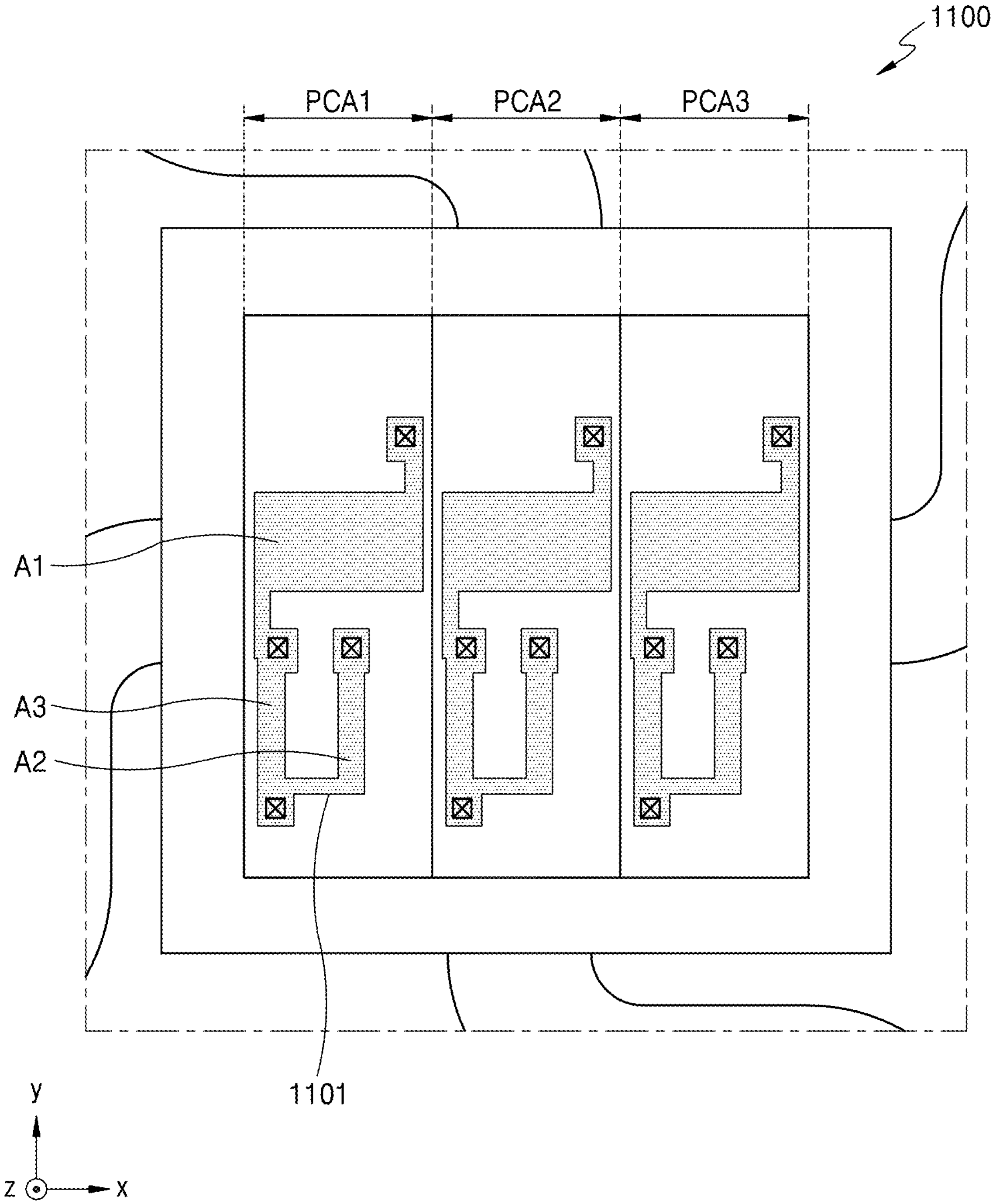
FIGS. 9A to 9G are schematic layout diagrams illustrating, layer by layer, the components of the pixel circuits illustrated in FIG. 8.
Figure 9B:
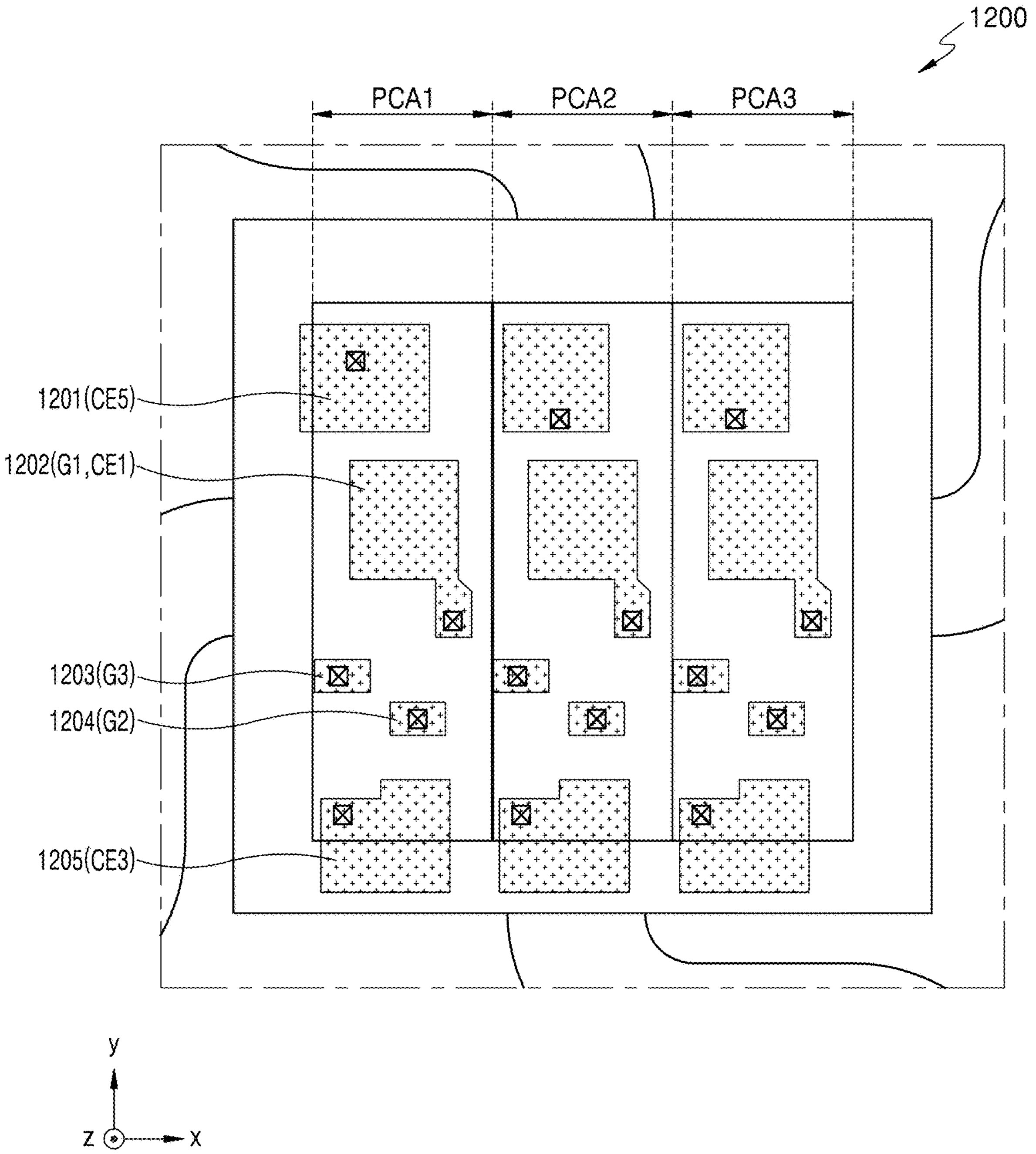

FIG. 8 is a schematic diagram illustrating components of pixel circuits arranged in a first island portion of a display device according to an embodiment. FIGS. 9A to 9B are schematic layout diagrams illustrating, layer by layer, the components of the pixel circuits illustrated in FIG. 8.

As described with reference to FIGS. 4A to 4D, the display device 1 may include a first island portion 11 arranged in the display area DA and a plurality of second bridge portions 12 connected to the first island portion 11. The first island portion 11 may include a plurality of pixels, and the first bridge portion 12 may include wiring lines electrically connected to the pixels.

A first pixel, a second pixel, and a third pixel, which emit light of different colors, may be arranged in the first island portion 11. The first pixel may include a first light-emitting element and a first pixel circuit PC1 connected to the first light-emitting element, the second pixel may include a second light-emitting element and a second pixel circuit PC2 connected to the second light-emitting element, and the third pixel may include a third light-emitting element and a third pixel circuit PC3 connected to the third light-emitting element. In an embodiment, the first light-emitting element may emit red light, the second light-emitting element may emit green light, and the third light-emitting element may emit blue light.

The first pixel circuit PC1 may be arranged in a first circuit area PCA1, the second pixel circuit PC2 may be arranged in a second circuit area PCA2, and the third pixel circuit PC3 may be arranged in a third circuit area PCA3. The first circuit area PCA1, the second circuit area PCA2, and the third circuit area PCA3 may be arranged side by side in a first direction (e.g., the x direction).

Conductive lines extending in the first direction (e.g., the x direction) may be arranged in horizontal bridge portions 12*a* connected to first island portions 11 adjacent thereto in the first direction (e.g., the x direction), and conductive lines extending in a second direction (e.g., the y direction) may be arranged in vertical bridge portions 12*b* connected to first island portions 11 adjacent thereto in the second direction (e.g., the y direction).

Hereinafter, a conductive line extending in the first direction and arranged in the first island portion 11 and/or the horizontal bridge portions 12*a* may be referred to as a horizontal conductive line, a horizontal voltage line, or a horizontal connection line. Similarly, a conductive line extending in the second direction and arranged in the first island portion 11 and/or the vertical bridge portions 12*b* may be referred to as a vertical conductive line, a vertical voltage line, or a vertical connection line. Herein, the first direction has been described as a horizontal direction and the second direction has been described as a vertical direction, but the disclosure is not limited thereto. For example, one of the different directions that are orthogonal to each other depending on a direction in which a display device or a display panel is viewed may be referred to as a horizontal direction, and the other may be referred to as a vertical direction. For example, a conductive line arranged and extending in the first direction may be referred to as a vertical conductive line, and a conductive line arranged and extending in the second direction may be referred to as a horizontal conductive line.

The first pixel circuit PC1, the second pixel circuit PC2, and the third pixel circuit PC3 may have substantially the same or similar structures. Hereinafter, elements will be described focusing on the first pixel circuit PC1 arranged in the first circuit area PCA1, and description of the same or similar elements arranged in the second circuit area PCA2 and the third circuit area PCA3 will be omitted.

The first pixel circuit PC1, the second pixel circuit PC2, and the third pixel circuit PC3 may each include the first to third transistors T1, T2, and T3, the first capacitor Cst, the second capacitor Cpr, and the third capacitor Ca described with reference to FIG. 6.

The first transistor T1 may overlap the first capacitor Cst. The second transistor T2, the third transistor T3, the second capacitor Cpr, and the third capacitor Ca may be arranged above and/or below the first transistor T1 and/or the first capacitor Cst in a plan view. For example, as illustrated in FIG. 8, the second capacitor Cpr, the second transistor T2, and the third transistor T3 may be arranged below the first transistor T1 (e.g., in the −y direction) in a plan view. The third capacitor Ca may be arranged above the first transistor T1 (e.g., in the +y direction) in a plan view.

The first island portion 11 may include a semiconductor layer 1100, a first conductive layer 1200, a second conductive layer 1300, a third conductive layer 1400, a fourth conductive layer 1500, a fifth conductive layer 1600, and a sixth conductive layer 1700, which are sequentially stacked on the substrate 100 (see FIG. 5). The semiconductor layer 1100, the first conductive layer 1200, the second conductive layer 1300, the third conductive layer 1400, the fourth conductive layer 1500, the fifth conductive layer 1600, and the sixth conductive layer 1700 may form signal lines and voltage lines connected to the pixel circuit PC (see FIG. 6) and transistors and capacitors included in the pixel circuit PC (see FIG. 6).

Referring to FIG. 9A, the semiconductor layer 1100 may be arranged on the first island portion 11. A buffer layer 111 may be arranged between the substrate 100 (see FIG. 5) and the semiconductor layer 1100. The semiconductor layer 1100 may include a silicon semiconductor. For example, the semiconductor layer 1100 may include amorphous silicon or polysilicon. The semiconductor layer 1100 may include a channel region of each of the first to third transistors T1, T2, and T3, and a source region and a drain region on both sides of the channel region. The source region or the drain region may be interpreted as a source electrode or a drain electrode of the transistor in some cases.

The semiconductor layer 1100 may include a first semiconductor pattern 1101. The first semiconductor pattern 1101 may be arranged in each of the first circuit area PCA1, the second circuit area PCA2, and the third circuit area PCA3. The first semiconductor pattern 1101 may include a first semiconductor layer A1 of the first transistor T1, a second semiconductor layer A2 of the second transistor T2, and a third semiconductor layer A3 of the third transistor T3. The first semiconductor layer A1, the second semiconductor layer A2, and the third semiconductor layer A3 may be connected to each other as one body. For example, the first semiconductor pattern 1101 may include a source region S1 and a drain region D1 of the first transistor T1, a source region S2 and a drain region D2 of the second transistor T2, and a source region S3 and a drain region D3 of the third transistor T3, as illustrated in FIG. 8.

Referring to FIG. 9B, the first conductive layer 1200 may be arranged on the semiconductor layer 1100. A gate insulating layer 113 (see FIG. 13) may be arranged between the semiconductor layer 1100 and the first conductive layer 1200. The first conductive layer 1200 may include a 1st conductive pattern 1201, a 2nd conductive pattern 1202, a 3rd conductive pattern 1203, a 4th conductive pattern 1204, and a 5th conductive pattern 1205. The 1st conductive pattern 1201, the 2nd conductive pattern 1202, the 3rd conductive pattern 1203, the 4th conductive pattern 1204, and the 5th conductive pattern 1205 may be arranged in each of the first circuit area PCA1, the second circuit area PCA2, and the third circuit area PCA3.

The 1st conductive pattern 1201, the 2nd conductive pattern 1202, the 3rd conductive pattern 1203, the 4th conductive pattern 1204, and the 5th conductive pattern 1205 may include the same material. The 1st conductive pattern 1201, the 2nd conductive pattern 1202, the 3rd conductive pattern 1203, the 4th conductive pattern 1204, and the 5th conductive pattern 1205 may each include Al, Pt, Pd, Ag, Mg, Au, Ni, Nd, Ir, Cr, Li, Ca, molybdenum (Mo), titanium (Ti), tungsten (W), and/or copper (Cu), and may be formed as a single layer or multilayer including the aforementioned material.

The first conductive layer 1200 may include a first gate electrode G1, a second gate electrode G2, and a third gate electrode G3 that overlap the first semiconductor layer A1, the second semiconductor layer A2, and the third semiconductor layer A3 of the semiconductor layer 1100, respectively.

The 2nd conductive pattern 1202 may be arranged in each of the first circuit area PCA1, the second circuit area PCA2, and the third circuit area PCA3 and may have an isolated shape. The 2nd conductive pattern 1202 may include the first gate electrode G1 of the first transistor T1. The first semiconductor layer A1 may include a channel region overlapping the 2nd conductive pattern 1202, which is the first gate electrode G1, and a source region and a drain region arranged on both sides of the channel region. In an embodiment, the 2nd conductive pattern 1202 may include a first capacitor electrode CE1 of the first capacitor Cst. In other words, the 2nd conductive pattern 1202 may be the first gate electrode G1 and/or the first capacitor electrode CE1 of the first capacitor Cst.

The 3rd conductive pattern 1203 may be arranged in each of the first circuit area PCA1, the second circuit area PCA2, and the third circuit area PCA3 and may have an isolated shape. The 3rd conductive pattern 1203 may include the third gate electrode G3 of the third transistor T3. The third semiconductor layer A3 may include a channel region overlapping the 3rd conductive pattern 1203, which is the third gate electrode G3, and a source region and a drain region arranged on both sides of the channel region.

The 4th conductive pattern 1204 may be arranged in each of the first circuit area PCA1, the second circuit area PCA2, and the third circuit area PCA3 and may have an isolated shape. The 4th conductive pattern 1204 may include the second gate electrode G2 of the second transistor T2. The second semiconductor layer A2 may include a channel region overlapping the 4th conductive pattern 1204, which is the second gate electrode G2, and a source region and a drain region arranged on both sides of the channel region.

The 1st conductive pattern 1201 and the 5th conductive pattern 1205 may be arranged in each of the first circuit area PCA1, the second circuit area PCA2, and the third circuit area PCA3 and may each have an isolated shape. In an embodiment, the 1st conductive pattern 1201 may include a fifth capacitor electrode CE5 of the third capacitor Ca, and the 5th conductive pattern 1205 may include a third capacitor electrode CE3 of the second capacitor Cst. That is, the first capacitor electrode CE1, which is a lower electrode of the first capacitor Cst, the third capacitor electrode CE3, which is a lower electrode of the second capacitor Cpr, and the fifth capacitor electrode CE5, which is a lower electrode of the third capacitor Ca, may be arranged on the same layer.

Figure 9C:
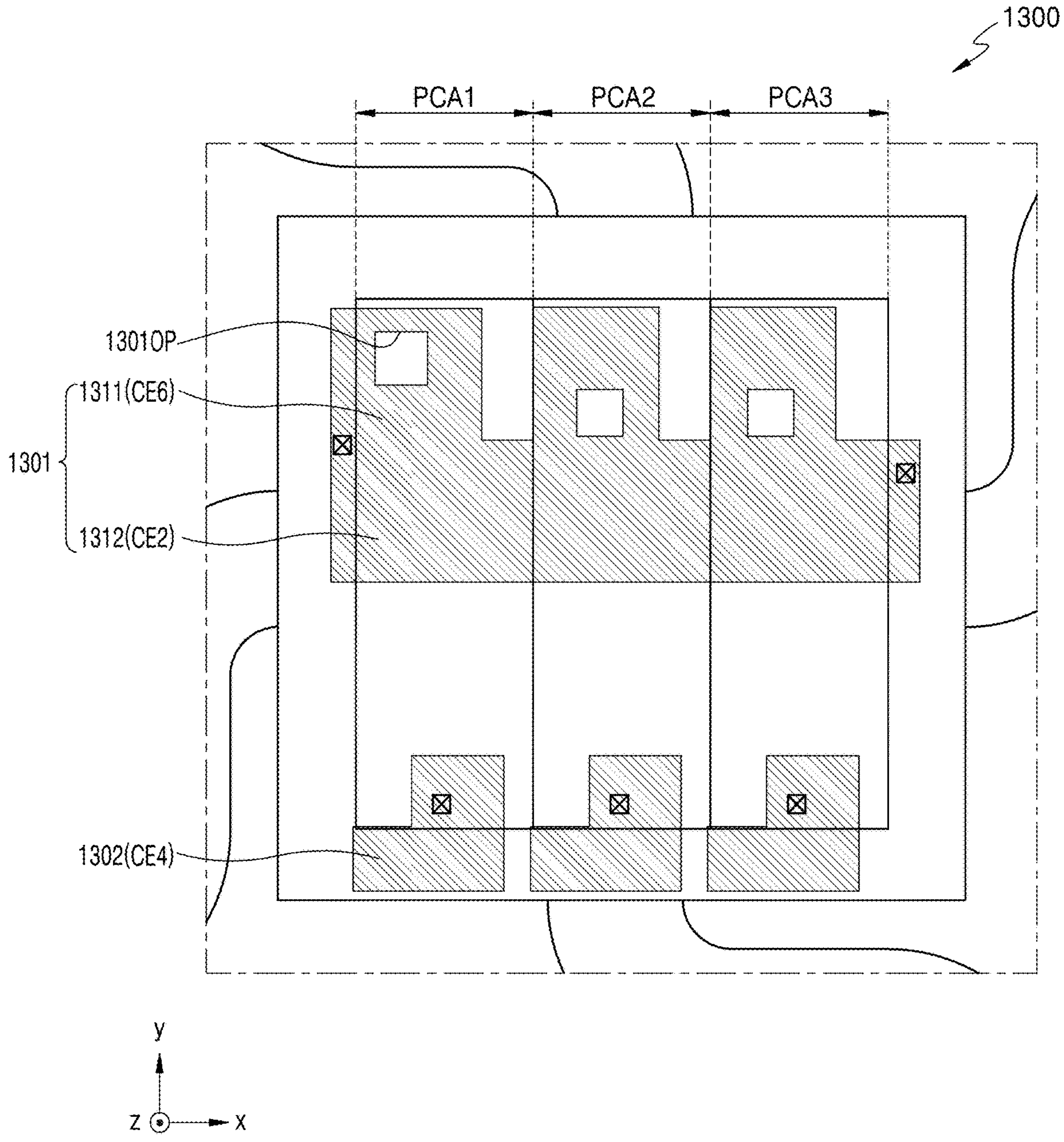

Referring to FIG. 9C, the second conductive layer 1300 may be arranged on the first conductive layer 1200. A first interlayer insulating layer 115 (see FIG. 13) may be arranged between the first conductive layer 1200 and the second conductive layer 1300. The second conductive layer 1300 may include a 6th conductive pattern 1301 and a 7th conductive pattern 1302.

The 6th conductive pattern 1301 and the 7th conductive pattern 1302 may include the same material. The 6th conductive pattern 1301 and the 7th conductive pattern 1302 may each include Al, Pt, Pd, Ag, Mg, Au, Ni, Nd, Ir, Cr, Li, Ca, Mo, Ti, W, and/or Cu, and may be formed as a single layer or multilayer including the aforementioned material.

The 6th conductive pattern 1301 may be arranged to overlap the 1st conductive pattern 1201 and the 2nd conductive pattern 1202. Specifically, the 6th conductive pattern 1301 may include first portions 1311 respectively arranged in the first circuit area PCA1, the second circuit area PCA2, and the third circuit area PCA3, and further, a second portion 1312 extending in the first direction (e.g., the x direction) and connecting the first portions 1311 respectively arranged in the first circuit area PCA1, the second circuit area PCA3, and the third circuit area PCA3. Each of the first portions 1311 may have a closed-shaped opening 1301OP.

The first portions 1311 of the 6th conductive pattern 1301 may overlap the 1st conductive pattern 1201. As described herein, the 1st conductive pattern 1201 may correspond to the fifth capacitor electrode CE5 of the third capacitor Ca, and thus, the first portion 1311 overlapping the 1st conductive pattern 1201 may correspond to a sixth capacitor electrode CE6 of the third capacitor Ca.

The second portion 1312 of the 6th conductive pattern 1301 may overlap the 2nd conductive pattern 1202. As described herein, the 2nd conductive pattern 1202 may correspond to the first capacitor electrode CE1 of the first capacitor Cst, and thus, the second portion 1312 overlapping the 2nd conductive pattern 1202 may correspond to the second capacitor electrode CE2 of the first capacitor Cst.

The 7th conductive pattern 1302 may be arranged in each of the first circuit area PCA1, the second circuit area PCA2, and the third circuit area PCA3 and may have an isolated shape. The 7th conductive pattern 1302 may be arranged to overlap the 5th conductive pattern 1205. As described herein, the 5th conductive pattern 1205 may correspond to the third capacitor electrode CE3 of the second capacitor Cpr, and thus, the 7th conductive pattern 1302 overlapping the 5th conductive pattern 1205 may correspond to a fourth capacitor electrode CE4 of the second capacitor Cpr. The 7th conductive pattern 1302 may be connected to a 16th conductive pattern 1409 to be described herein and may receive a data signal from a data line.

That is, the second capacitor electrode CE2, which is an upper electrode of the first capacitor Cst, the fourth capacitor electrode CE4, which is an upper electrode of the second capacitor Cpr, and the sixth capacitor electrode CE6, which is an upper electrode of the third capacitor Ca, may be arranged on the same layer. The sixth capacitor electrode CE6 may be formed integrally with the second capacitor electrode CE2.

Figure 9D:
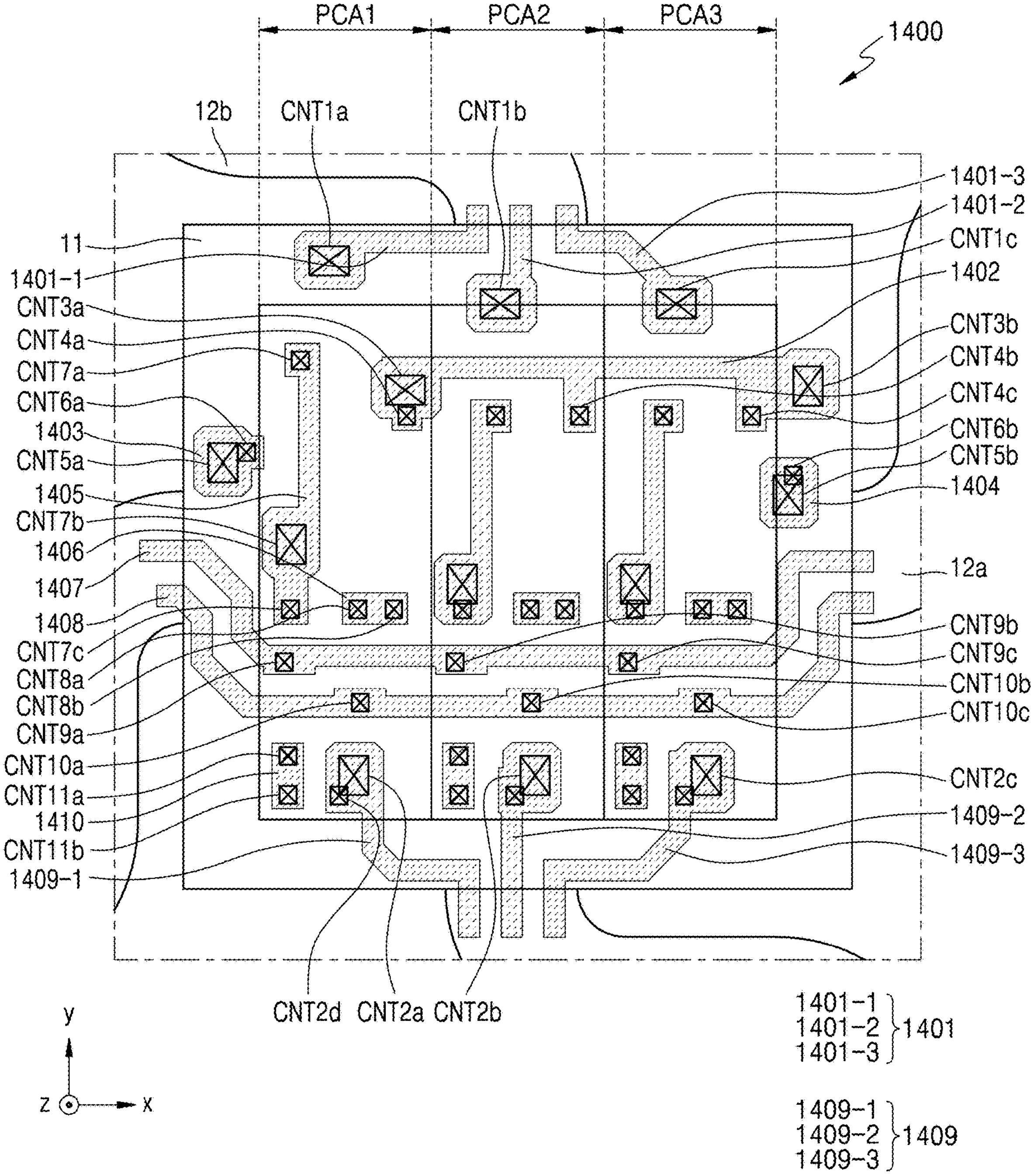

Referring to FIG. 9D, the third conductive layer 1400 may be arranged on the second conductive layer 1300. A second interlayer insulating layer 117 may be arranged between the second conductive layer 1300 and the third conductive layer 1400. The third conductive layer 1400 may include an 8th conductive pattern 1401, a 9th conductive pattern 1402, a 10th conductive pattern 1403, an 11th conductive pattern 1404, a 12th conductive pattern 1405, a 13th conductive pattern 1406, a 14th conductive pattern 1407, a 15th conductive pattern 1408, a 16th conductive pattern 1409, and a 17th conductive pattern 1410.

The 8th to 17th conductive patterns 1401, 1402, 1403, 1404, 1405, 1406, 1407, 1408, 1409, and 1410 may include the same material. The 8th to 17th conductive patterns 1401, 1402, 1403, 1404, 1405, 1406, 1407, 1408, 1409, and 1410 may each include Al, Pt, Pd, Ag, Mg, Au, Ni, Nd, Ir, Cr, Li, Ca, Mo, Ti, W, and/or Cu, and may be formed as a single layer or multilayer including the aforementioned material.

The 8th conductive pattern 1401 and the 16th conductive pattern 1409 may each have an isolated shape. The 8th conductive pattern 1401 may include an 8th-1 conductive pattern 1401-1 arranged in the first circuit area PCA1, an 8th-2 conductive pattern 1401-2 arranged in the second circuit area PCA2, and an 8th-3 conductive pattern 1401-3 arranged in the third circuit area PCA3. The 16th conductive pattern 1409 may include a 16th-1 conductive pattern 1409-1 arranged in the first circuit area PCA1, a 16th-2 conductive pattern 1409-2 arranged in the second circuit area PCA2, and a 16th-3 conductive pattern 1409-3 arranged in the third circuit area PCA3.

In an embodiment, the 8th conductive pattern 1401 and the 16th conductive pattern 1409 may form a part of a data line DL (see FIG. 6). For example, an 18th-1 conductive pattern 1501-1 (see FIG. 9E) to be described herein may be connected to the 8th-1 conductive pattern 1401-1 through a 1st-1 contact hole CNT1*a* and may be connected to the 16th-1 conductive pattern 1409-1 through a 2nd-1 contact hole CNT2*a*. Therefore, the 8th-1 conductive pattern 1401-1, the 16th-1 conductive pattern 1409-1, and the 18th-1 conductive pattern 1501-1 (see FIG. 9E) may form a first data line DL1 (see FIG. 13) configured to transmit a data voltage to the first pixel circuit PC1 (see FIG. 8). Likewise, an 18th-2 conductive pattern 1501-2 (see FIG. 9E) to be described herein may be connected to the 8th-2 conductive pattern 1401-2 through a 1st-2 contact hole CNT1*b* and may be connected to the 16th-2 conductive pattern 1409-2 through a 2nd-2 contact hole CNT2*b*. Therefore, the 8th-2 conductive pattern 1401-2, the 16th-2 conductive pattern 1409-2, and the 18th-2 conductive pattern 1501-2 (see FIG. 9E) may form a second data line DL2 (see FIG. 13) configured to transmit a data voltage to the second pixel circuit PC2 (see FIG. 8). In some aspects, an 18th-3 conductive pattern 1501-3 (see FIG. 9E) to be described herein may be connected to the 8th-3 conductive pattern 1401-3 through a 1st-3 contact hole CNT1*c* and may be connected to the 16th-3 conductive pattern 1409-3 through a 2nd-3 contact hole CNT2*c*. Therefore, the 8th-3 conductive pattern 1401-3, the 16th-3 conductive pattern 1409-3, and the 18th-3 conductive pattern 1501-3 (see FIG. 9E) may form a third data line DL3 (see FIG. 13) configured to transmit a data voltage to the third pixel circuit PC3 (see FIG. 8).

In some aspects, the 16th conductive pattern 1409 may be connected to the 7th conductive pattern 1302 through a 2nd-4 contact hole CNT2*d*. Accordingly, the first to third data lines DL1, DL2, and DL3 in FIG. 13 may each apply a data signal to the second capacitor Cpr.

The 8th conductive pattern 1401 and the 16th conductive pattern 1409 may be arranged such that the 8th conductive pattern 1401 and the 16th conductive pattern 1409 extend from the first island portion 11 to a vertical bridge portion 12*b*. In FIG. 9, for ease of illustration, the 8th conductive pattern 1401 and the 16th conductive pattern 1409 are illustrated as being disconnected on the vertical bridge portion 12*b*. However, the 8th conductive pattern 1401 and the 16th conductive pattern 1409 may be arranged such that the 8th conductive pattern 1401 and the 16th conductive pattern 1409 continue to extend on the vertical bridge portion 12*b* in the second direction (e.g., the y direction).

The 9th conductive pattern 1402 may have an isolated shape. However, the 9th conductive pattern 1402 may be arranged such that the 9th conductive pattern 1402 extends in the first direction (e.g., the x direction) across the first circuit area PCA1, the second circuit area PCA2, and the third circuit area PCA3.

In an embodiment, the 9th conductive pattern 1402 may form a part of the first driving voltage line VDDL (see FIG. 6). For example, the 9th conductive pattern 1402 may be connected, through a 3rd-1 contact hole CNT3*a*, to a 19th conductive pattern 1902 (see FIG. 9E) and a 25th conductive pattern 1601 (see FIG. 9F) to be described herein, and may be connected, through a 3rd-2 contact hole CNT3*b*, to a 22nd conductive pattern 1905 (see FIG. 9E) and a 26th conductive pattern 1602 (see FIG. 9F) to be described herein. In some aspects, the 9th conductive pattern 1402 may be connected to the first semiconductor pattern 1101 through each of a 4th-1 contact hole CNT4*a*, a 4th-2 contact hole CNT4*b*, and a 4th-3 contact hole CNT4*c*.

The 10th conductive pattern 1403 and the 11th conductive pattern 1404 may each have an isolated shape. The 10th conductive pattern 1403 may be arranged on the left outer side of the first circuit area PCA1, and the 11th conductive pattern 1404 may be arranged on the right outer side of the third circuit area PCA3. In other words, the 10th conductive pattern 1403 and the 11th conductive pattern 1404 may each be arranged near the horizontal bridge portion 12*a*. Descriptions of an element being "near" to another element may refer to the element being within a predetermined distance (e.g., a relatively close distance) from the other element.

In an embodiment, the 10th conductive pattern 1403 and the 11th conductive pattern 1404 may form a part of the initialization voltage line VIL (see FIG. 6). For example, the 10th conductive pattern 1403 may be connected, through a 5th-1 contact hole CNT5*a*, to a 21st conductive pattern 1504 (see FIG. 9E) to be described herein and may be connected to the 6th conductive pattern 1301 through a 6th-1 contact hole CNT6*a* and transmit an initialization voltage to a pixel circuit. The 11th conductive pattern 1404 may be connected to the 6th conductive pattern 1301 through a 6th-2 contact hole CNT6*b* and to a 20th conductive pattern 1503 (see FIG. 9E) and a 23rd conductive pattern 1506 (see FIG. 9E) through a 5th-2 contact hole CNT5*b* and transmit an initialization voltage to a pixel circuit.

The 12th conductive pattern 1405 may have an isolated shape. The 12th conductive pattern 1405 may be arranged in each of the first circuit area PCA1, the second circuit area PCA2, and the third circuit area PCA3. The 12th conductive pattern 1405 may be arranged such that the 12th conductive pattern 1405 extends in the second direction (e.g., the y direction).

In an embodiment, the 12th conductive pattern 1405 may be a connection electrode connecting the third capacitor Ca (see FIG. 6), the light-emitting element LED (see FIG. 6), the first transistor T1 (see FIG. 6), and the third transistor T3 (see FIG. 6) to each other. For example, the 12th conductive pattern 1405 may correspond to the third node N3 in FIG. 6. Specifically, the 12th conductive pattern 1405 may be connected to the 1st conductive pattern 1201 through a 7th-1 contact hole CNT7*a* and may be electrically connected to the third capacitor Ca (see FIG. 6). The 12th conductive pattern 1405 may be connected, through a 7th-2 contact hole CNT7*b*, to a 24th conductive pattern 1507 (see FIG. 9E) to be described herein and may be electrically connected to the light-emitting element LED (see FIG. 6). The 12th conductive pattern 1405 may be connected to the first semiconductor pattern 1101 through a 7th-3 contact hole CNT7*c* and may be electrically connected to the first transistor T1 (see FIG. 6) and the third transistor T3 (see FIG. 6).

The 13th conductive pattern 1406 may have an isolated shape. The 13th conductive pattern 1406 may be arranged in each of the first circuit area PCA1, the second circuit area PCA2, and the third circuit area PCA3. The 13th conductive pattern 1406 may be arranged such that the 13th conductive pattern 1406 extends in the first direction (e.g., the x direction).

In an embodiment, the 13th conductive pattern 1406 may be a connection electrode connecting the first transistor T1, the second transistor T2, and the first capacitor Cst to each other. For example, the 13th conductive pattern 1406 may correspond to the first node N1 in FIG. 6. Specifically, the 13th conductive pattern 1406 may be connected to the first semiconductor pattern 1101 through an 8th-1 contact hole CNT8*a* and may be electrically connected to the second transistor T2 (see FIG. 6). The 13th conductive pattern 1406 may be electrically connected to the 2nd conductive pattern 1202 through an 8th-2 contact hole CNT8*b* and may be electrically connected to the first transistor T1 (see FIG. 6) and the first capacitor Cst (see FIG. 6).

The 14th conductive pattern 1407 and the 15th conductive pattern 1408 may be arranged such that the 14th conductive pattern 1407 and the 15th conductive pattern 1408 extend in the first direction (e.g., the x direction). Specifically, the 14th conductive pattern 1407 and the 15th conductive pattern 1408 may be arranged on the first island portion 11 and the horizontal bridge portion 12*a*. The 14th conductive pattern 1407 and the 15th conductive pattern 1408 may be arranged across the first circuit area PCA1, the second circuit area PCA2, and the third circuit area PCA3.

In an embodiment, the 14th conductive pattern 1407 may correspond to the second gate line GCL (see FIG. 6), and the 15th conductive pattern 1408 may correspond to the first gate line GWL (see FIG. 6). The 14th conductive pattern 1407 may be connected to the 3rd conductive pattern 1203 through a 9th-1 contact hole CNT9*a*, a 9th-2 contact hole CNT9*b*, and a 9th-3 contact hole CNT9*c* and transmit the second gate signal GC (see FIG. 6) to the third gate electrode G3 of each pixel circuit. The 15th conductive pattern 1408 may be connected to the 4th conductive pattern 1204 through a 10th-1 contact hole CNT10*a*, a 10th-2 contact hole CNT10*b*, and a 10th-3 contact hole CNT10*c* and transmit the first gate signal GW (see FIG. 6) to the second gate electrode G2 of each pixel circuit.

The 17th conductive pattern 1410 may have an isolated shape. The 17th conductive pattern 1410 may be arranged in each of the first circuit area PCA1, the second circuit area PCA2, and the third circuit area PCA3. The 17th conductive pattern 1410 may be arranged such that the 17th conductive pattern 1410 extends in the second direction (e.g., the y direction).

In an embodiment, the 17th conductive pattern 1410 may be a connection electrode connecting the second capacitor Cpr, the second transistor T2, and the third transistor T3 to one another. For example, the 17th conductive pattern 1410 may correspond to the second node N2 in FIG. 6. Specifically, the 17th conductive pattern 1410 may be connected to the first semiconductor pattern 1101 through an 11th-1 contact hole CNT11*a* and electrically connected to the second transistor T2 and the third transistor T3. The 17th conductive pattern 1410 may be connected to the 5th conductive pattern 1205 through an 11th-2 contact hole CNT11*b* and electrically connected to the second capacitor Cpr (see FIG. 6).

Figure 9E:
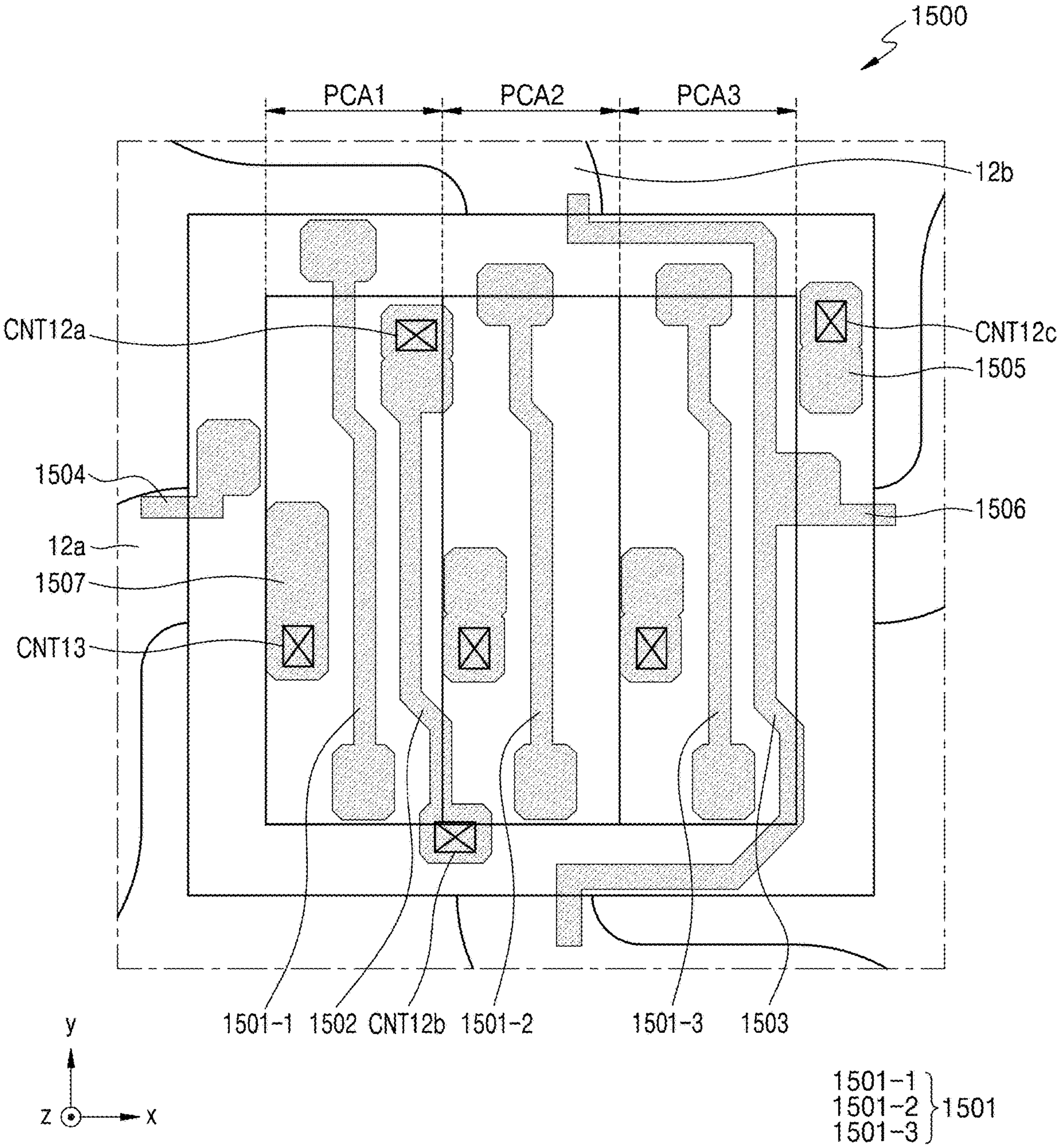

Referring to FIG. 9E, the fourth conductive layer 1500 may be arranged on the third conductive layer 1400. A first organic insulating layer 119 (see FIG. 13) may be arranged between the third conductive layer 1400 and the fourth conductive layer 1500. The fourth conductive layer 1500 may include an 18th conductive pattern 1501, a 19th conductive pattern 1502, a 20th conductive pattern 1503, a 21st conductive pattern 1504, a 22nd conductive pattern 1505, a 23rd conductive pattern 1506, and a 24th conductive pattern 1507.

The 18th to 24th conductive patterns 1501, 1502, 1503, 1504, 1505, 1506, and 1507 may include the same material. The 18th to 24th conductive patterns 1501, 1502, 1503, 1504, 1505, 1506, and 1507 may each include Al, Pt, Pd, Ag, Mg, Au, Ni, Nd, Ir, Cr, Li, Ca, Mo, Ti, W, and/or Cu, and may be formed as a single layer or multilayer including the aforementioned material.

The 18th conductive pattern 1501 may have an isolated shape. The 18th conductive pattern 1501 may include a 18th-1 conductive pattern 1501-1 arranged in the first circuit area PCA1, a 18th-2 conductive pattern 1501-2 arranged in the second circuit area PCA2, and a 18th-3 conductive pattern 1501-3 arranged in the third circuit area PCA3. The 18th-1 conductive pattern 1501-1, the 18th-2 conductive pattern 1501-2, and the 18th-3 conductive pattern 1501-3 may each be arranged such that the 18th-1 conductive pattern 1501-1, the 18th-2 conductive pattern 1501-2, and the 18th-3 conductive pattern 1501-3 extend in the second direction (e.g., the y direction).

In an embodiment, the 18th conductive pattern 1501 may form a part of the data line DL (see FIG. 6). As described herein, the 18th-1 conductive pattern 1501-1 may be connected to the 8th-1 conductive pattern 1401-1 and the 16th-1 conductive pattern 1409-1 to form a first data line that applies a data voltage to the first pixel circuit PC1 (see FIG. 8). Likewise, the 18th-2 conductive pattern 1501-2 may be connected to the 8th-2 conductive pattern 1401-2 and the 16th-2 conductive pattern 1409-2 to form a second data line that applies a data voltage to the second pixel circuit PC2 (see FIG. 8). The 18th-3 conductive pattern 1501-3 may be connected to the 8th-3 conductive pattern 1401-3 and the 16th-3 conductive pattern 1409-3 to form a third data line that applies a data voltage to the third pixel circuit PC3 (see FIG. 8).

The 19th conductive pattern 1502 may have an isolated shape. The 19th conductive pattern 1502 may be arranged such that the 19th conductive pattern 1502 extends in the second direction (e.g., the y direction). The 19th conductive pattern 1502 may be arranged such that the 19th conductive pattern 1502 is arranged within the first circuit area PCA1 and not arranged in the second circuit area PCA2 and the third circuit area PCA3. The 22nd conductive pattern 1505 may have an isolated shape and may be arranged such that the 22nd conductive pattern 1505 extends slightly in the second direction (e.g., the y direction). The 22nd conductive pattern 1505 may be arranged on the right outer side of the third circuit area PCA3.

In an embodiment, the 19th conductive pattern 1502 and the 22nd conductive pattern 1505 may form a part of the first driving voltage line VDDL (see FIG. 6). For example, the 19th conductive pattern 1502 may receive, through a 12th-1 contact hole CNT12*a*, the first driving voltage ELVDD (see FIG. 6) from the 25th conductive pattern 1601 (see FIG. 9F) to be described herein and may transmit the first driving voltage ELVDD in the second direction (e.g., the y direction). The 19th conductive pattern 1502 may be connected to the 9th conductive pattern 1402 through the 3rd-1 contact hole CNT3*a* and transmit the first driving voltage ELVDD in the first direction (e.g., the x direction). The 9th conductive pattern 1402 may be connected to the 22nd conductive pattern 1505, and the 22nd conductive pattern 1505 may be connected, through a 12th-3 contact hole CNT12*c*, to the 26th conductive pattern 1602 (see FIG. 9F) to be described herein. In some aspects, the 19th conductive pattern 1502 may transmit, through a 12th-2 contact hole CNT12*b*, the first driving voltage ELVDD to a 27th conductive pattern 1603 (see FIG. 9F) to be described herein.

The 20th conductive pattern 1503 may be arranged such that the 20th conductive pattern 1503 extends in the second direction (e.g., the y direction). The 20th conductive pattern 1503 may be arranged such that the 20th conductive pattern 1503 extends on the first island portion 11 and the vertical bridge portion 12*b*. In FIG. 9E, for ease of illustration, the 20th conductive pattern 1503 is illustrated as being disconnected on the vertical bridge portion 12*b*. However, the 20th conductive pattern 1503 may be arranged such that the 20th conductive pattern 1503 continues to extend in the second direction (e.g., the y direction) on the vertical bridge portion 12*b*. The 20th conductive pattern 1503 may be arranged such that the 20th conductive pattern 1503 is arranged within the third circuit area PCA3 and not arranged in the first circuit area PCA1 and the second circuit area PCA2. The 23rd conductive pattern 1506 may have an isolated shape.

The 21st conductive pattern 1504 and the 23rd conductive pattern 1506 may be arranged such that the 21st conductive pattern 1504 and the 23rd conductive pattern 1506 extend in the first direction (e.g., the x direction). The 21st conductive pattern 1504 may be arranged on the left outer side of the first circuit area PCA1 and may be arranged such that the 21st conductive pattern 1504 extends on the horizontal bridge portion 12*a*, and the 23rd conductive pattern 1506 may be arranged on the right outer side of the third circuit area PCA3 and may be arranged such that the 23rd conductive pattern 1506 extends on the horizontal bridge portion 12*a*. In FIG. 9E, for ease of illustration, the 21st conductive pattern 1504 and the 23rd conductive pattern 1506 are illustrated as being disconnected on the horizontal bridge portion 12*a*. However, the 21st conductive pattern 1504 and the 23rd conductive pattern 1506 may be arranged such that the 21st conductive pattern 1504 and the 23rd conductive pattern 1506 continue to extend in the first direction (e.g., the x direction) on the horizontal bridge portion 12*a*. The 23rd conductive pattern 1506 may be arranged such that the 23rd conductive pattern 1506 is integrally connected to the 20th conductive pattern 1503.

In an embodiment, the 20th conductive pattern 1503, the 21st conductive pattern 1504, and the 23rd conductive pattern 1506 may form a part of the initialization voltage line VIL (see FIG. 6) For example, the 21st conductive pattern 1504 may be connected to the 10th conductive pattern 1403 and transmit an initialization voltage to the 6th conductive pattern 1301. The 20th conductive pattern 1503 and the 23rd conductive pattern 1506 may be connected to the 11th conductive pattern 1404 connected to the 6th conductive pattern 1301 and transmit an initialization voltage in the second direction and the first direction, respectively.

The 24th conductive pattern 1507 may have an isolated shape. The 24th conductive pattern 1507 may be arranged such that the 24th conductive pattern 1507 extends slightly in the second direction (e.g., the y direction). The 24th conductive pattern 1507 may be arranged in each of the first circuit area PCA1, the second circuit area PCA2, and the third circuit area PCA3.

In an embodiment, the 24th conductive pattern 1507 may be a connection electrode connecting the third capacitor Ca (see FIG. 6), the light-emitting element LED (see FIG. 6), the first transistor T1 (see FIG. 6), and the third transistor T3 (see FIG. 6) to each other. For example, the 24th conductive pattern 1507 may correspond to the third node N3 in FIG. 6. Specifically, the 24th conductive pattern 1507 may be connected to the 1st conductive pattern 1201 and the first semiconductor pattern 1101 through the 12th conductive pattern 1405 and may be electrically connected to the first transistor T1 (see FIG. 6), the third transistor T3 (see FIG. 6), and the third capacitor Ca (see FIG. 6). In some aspects, the 24th conductive pattern 1507 may be connected, through a 13th contact hole CNT13, to a 29th conductive pattern 1605 (see FIG. 9F) to be described herein and may be electrically connected to the light-emitting element LED (see FIG. 6).

Figure 9F:
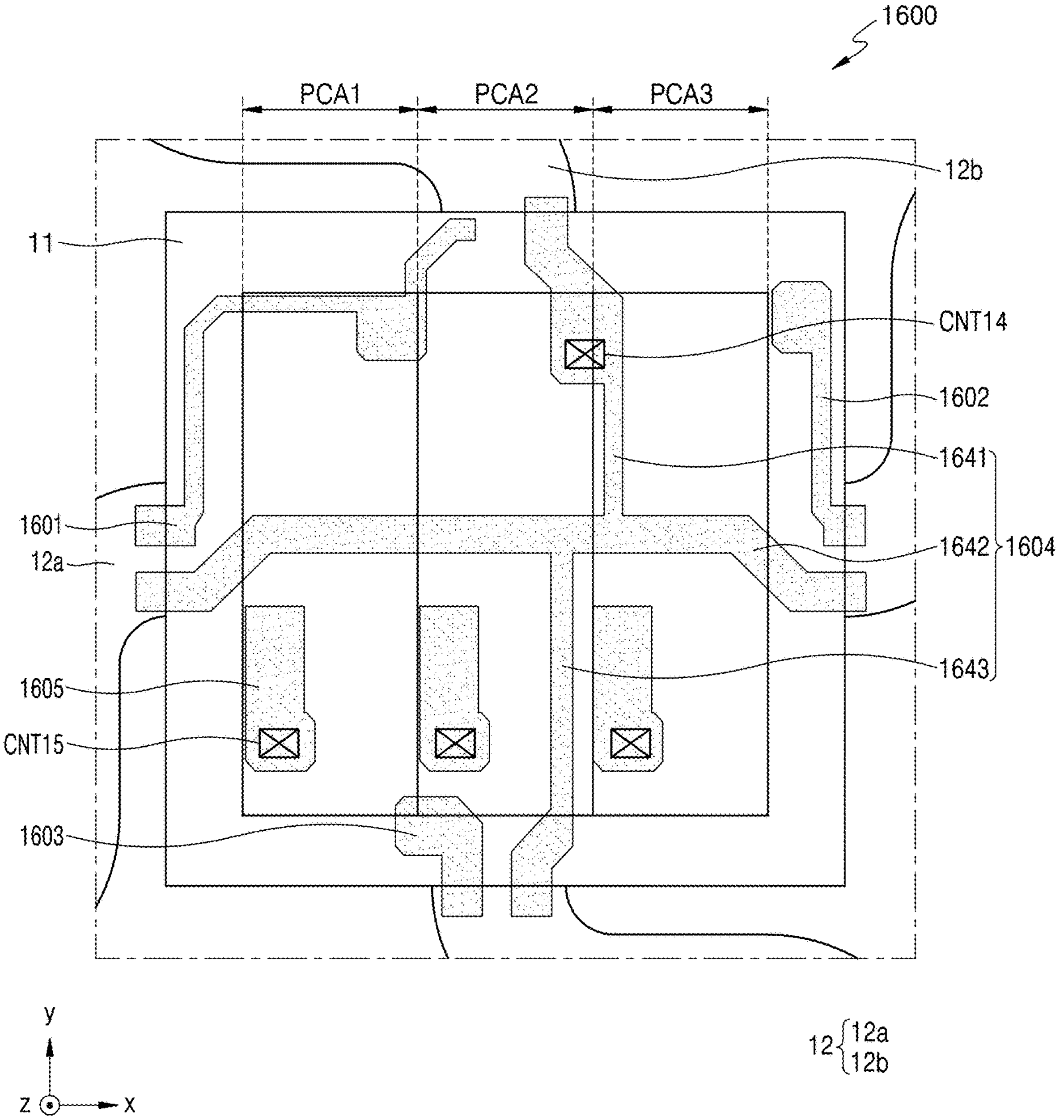

Referring to FIG. 9F, the fifth conductive layer 1600 may be arranged on the fourth conductive layer 1500. A second organic insulating layer 121 (see FIG. 13) may be arranged between the fourth conductive layer 1500 and the fifth conductive layer 1600. The fifth conductive layer 1600 may include a 25th conductive pattern 1601, a 26th conductive pattern 1602, a 27th conductive pattern 1603, a 28th conductive pattern 1604, and a 29th conductive pattern 1605.

The 25th to 29th conductive patterns 1601, 1602, 1603, 1604, and 1605 may include the same material. The 25th to 29th conductive patterns 1601, 1602, 1603, 1604, and 1605 may each include Al, Pt, Pd, Ag, Mg, Au, Ni, Nd, Ir, Cr, Li, Ca, Mo, Ti, W, and/or Cu, and may be formed as a single layer or multilayer including the aforementioned material.

The 25th conductive pattern 1601, the 26th conductive pattern 1602, and the 27th conductive pattern 1603 may each have a shape extending from the bridge portion 12. Specifically, the 25th conductive pattern 1601 may be arranged such that the 25th conductive pattern 1601 extends from the horizontal bridge portion 12*a* to the first circuit area PCA1. The 26th conductive pattern 1602 may be arranged such that the 26th conductive pattern 1602 extends from the right outer edge of the third circuit area PCA3 to the horizontal bridge portion 12*a*. The 27th conductive pattern 1603 may be arranged such that the 27th conductive pattern 1603 extends from the lower outer edge of the circuit area to the vertical bridge portion 12*b*. In FIG. 9F, for ease of illustration, the 25th conductive pattern 1601 and the 26th conductive pattern 1602 are illustrated as being disconnected on the horizontal bridge portion 12*a*. However, the 25th conductive pattern 1601 and the 26th conductive pattern 1602 may be arranged such that the 25th conductive pattern 1601 and the 26th conductive pattern 1602 continue to extend in the first direction (e.g., the x direction) on the horizontal bridge portion 12*a*. Likewise, the 27th conductive pattern 1603 is also illustrated as being disconnected on the vertical bridge portion 12*b*. However, the 27th conductive pattern 1603 may be arranged such that the 27th conductive pattern 1603 continues to extend in the second direction (e.g., the y direction) on the vertical bridge portion 12*b*.

In an embodiment, the 25th conductive pattern 1601, the 26th conductive pattern 1602, and the 27th conductive pattern 1603 may form a part of the first driving voltage line VDDL (see FIG. 6). For example, the 25th conductive pattern 1601 may be connected to the 19th conductive pattern 1502, the 9th conductive pattern 1402, and the 22nd conductive pattern 1505 and transmit the first driving voltage ELVDD (see FIG. 6). The 26th conductive pattern 1602 may be connected to the 22nd conductive pattern 1505 and transmit the first driving voltage ELVDD in the first direction (e.g., the x direction), and the 27th conductive pattern 1603 may be connected to the 19th conductive pattern 1502 and transmit the first driving voltage ELVDD in the second direction (e.g., the y direction).

The 28th conductive pattern 1604 may be arranged such that the 28th conductive pattern 1604 extends in the first direction (e.g., the x direction) and the second direction (e.g., the y direction). Specifically, the 28th conductive pattern 1604 may include a second portion 1642 extending in the first direction, a first portion 1641 that extends in the second direction, and a third portion 1643 that extends in the second direction. The second portion 1642 of the 28th conductive pattern 1604 may be arranged such that the second portion 1642 extends in the first direction on the horizontal bridge portion 12*a* and the first island portion 11. The first portion 1641 and the third portion 1643 of the 28th conductive pattern 1604 may be arranged such that the first portion 1641 and the third portion 1643 extend in the second direction on the vertical bridge portion 12*b* and the first island portion 11. In this case, the first portion 1641 and the third portion 1643 may be arranged mainly within the second circuit area PCA2.

In an embodiment, the 28th conductive pattern 1604 may form a part of the second driving voltage line VSSL (see FIG. 6). The 28th conductive pattern 1604 is a pattern in which parts extending in the first direction (e.g., the x direction) and the second direction (e.g., the y direction) are integrally formed as a single body, and may transmit the second driving voltage ELVSS (see FIG. 6) in the first direction and the second direction. The 2nd conductive pattern 1604 may be connected, through a 14th contact hole CNT14, to a second electrode pad 242 (see FIG. 9G) to be described herein and may transmit the second driving voltage ELVSS to the light-emitting element LED (see FIG. 6).

The 29th conductive pattern 1605 may have an isolated shape. The 29th conductive pattern 1605 may be arranged such that the 29th conductive pattern 1605 extends slightly in the second direction (e.g., the y direction). The 29th conductive pattern 1605 may be arranged in each of the first circuit area PCA1, the second circuit area PCA2, and the third circuit area PCA3.

In an embodiment, the 29th conductive pattern 1605 may be a connection electrode connecting the third capacitor Ca (see FIG. 6), the light-emitting element LED (see FIG. 6), the first transistor T1 (see FIG. 6), and the third transistor T3 (see FIG. 6). For example, the 29th conductive pattern 1605 may correspond to the third node N3 in FIG. 6. Specifically, the 29th conductive pattern 1605 may be connected to the 1st conductive pattern 1201 and the first semiconductor pattern 1101 through the 24th conductive pattern 1507 and the 12th conductive pattern 1405 and may be electrically connected to the first transistor T1, the third transistor T3, and the third capacitor Ca. In some aspects, the 29th conductive pattern 1605 may be connected, through a 15th contact hole CNT15, to the first electrode pad 241 (see FIG. 9G) to be described herein and may be electrically connected to the light-emitting element LED.

Figure 9G:
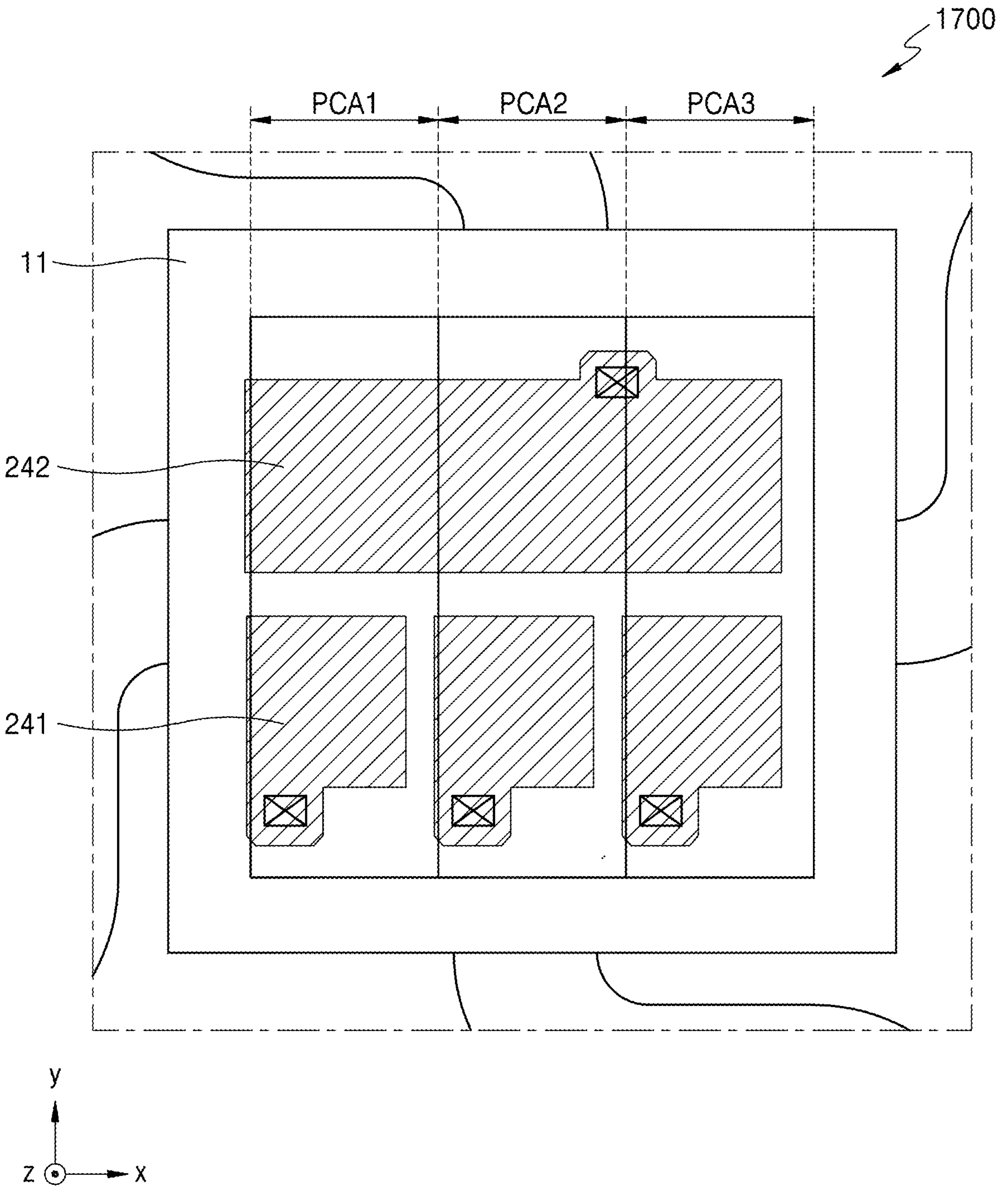

Referring to FIG. 9G, the sixth conductive layer 1700 may be arranged on the fifth conductive layer 1600. A third organic insulating layer 123 (see FIG. 13) may be arranged between the fifth conductive layer 1600 and the sixth conductive layer 1700. The sixth conductive layer 1700 may include first electrode pads 241 and second electrode pads 242.

The sixth conductive layer 1700 may include a conductive material, such as, for example, Mo, Al, Cu, or Ti, and may be formed as a multilayer or single layer including the aforementioned material. In an embodiment, when the first electrode pads 241 and the second electrode pad 242 are connected to the electrodes of the light-emitting element LED (see FIG. 6) by eutectic bonding, the sixth conductive layer 1700 may have a multi-layered structure including a Cu layer or may include a Cu alloy. In another embodiment, the sixth conductive layer 1700 may include a conductive organic material.

For example, the sixth conductive layer 1700 may contain carbon black or may include an organic material containing carbon black. In another embodiment, the sixth conductive layer 1700 may include a conductive oxide, such as, for example, ITO, IZO, ZnO, $In_2O_3$, IGO, or AZO. Alternatively, the sixth conductive layer 1700 may include a reflective layer including Ag, Mg, Al, Pt, Pd, Au, Ni, Nd, Ir, Cr, or a compound thereof. In another embodiment, the sixth conductive layer 1700 may further include a layer formed of ITO, IZO, ZnO, AZO, or $In_2O_3$ above/below the reflective layer described herein. For example, the sixth conductive layer 1700 may include an ITO layer/Ag layer/ITO layer.

The first electrode pads 241 may be arranged in the first circuit area PCA1, the second circuit area PCA2, and the third circuit area PCA3, respectively. Each of the first electrode pads 241 may have an isolated shape. The first electrode pad 241 may be connected to the first conductive pattern 1201 and the first semiconductor pattern 1101 through the 29th conductive pattern 1605, the 24th conductive pattern 1507, and the 12th conductive pattern 1405. Accordingly, the first electrode pad 241 may connect the first electrode of the light-emitting element LED (see FIG. 6) to the first transistor T1, the third transistor T3 (see FIG. 6), and the third capacitor Ca (see FIG. 6).

The second electrode pad 242 may be arranged such that the second electrode pad 242 extends across the first circuit area PCA1, the second circuit area PCA2, and the third circuit area PCA3. The second electrode pad 242 may have an island shape in which the length in the first direction (e.g., the x direction) is greater than the length in the second direction (e.g., the y direction). The second electrode pad 242 may be provided in common in the light-emitting elements arranged in the first island portion 11. For example, the second electrode of each of the first light-emitting element, the second light-emitting element, and the third light-emitting element may be connected to the second electrode pad 242. The second electrode pad 242 may be connected to the 28th conductive pattern 1604 through the 14th contact hole CNT14 and may receive the second driving voltage ELVSS (see FIG. 6).

In an embodiment illustrated in FIG. 9G, the light-emitting element includes an inorganic light-emitting diode 230 (see FIG. 7B), but in other embodiments, the light-emitting element may include an organic light-emitting diode 220 (see FIG. 7A). For example, the sixth conductive layer 1700 may include a first electrode 221 (see FIG. 7A) instead of the first electrode pad 241. In this case, the sixth conductive layer 1700 may include a conductive oxide, such as, for example, ITO, IZO, ZnO, $In_2O_3$, IGO, or AZO. Alternatively, the sixth conductive layer 1700 may include a reflective layer including Ag, Mg, Al, Pt, Pd, Au, Ni, Nd, Ir, Cr, or a compound thereof. In another embodiment, the sixth conductive layer 1700 may further include a layer formed of ITO, IZO, ZnO, AZO, or $In_2O_3$ above/below the reflective layer described herein.

Figure 10:
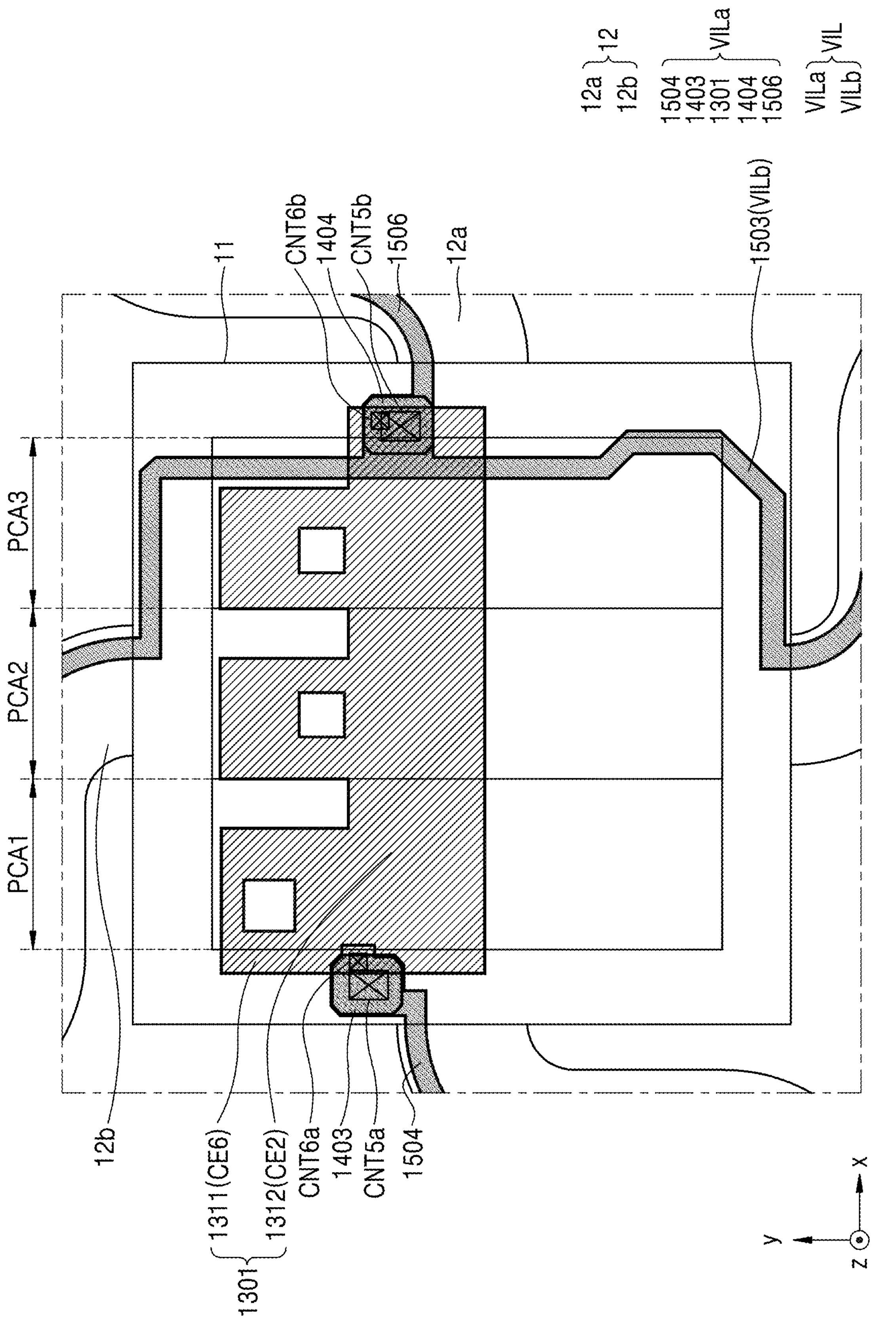
FIG. 10 is a schematic diagram illustrating an initialization voltage line among the components of the display device illustrated in FIG. 8.
Figure 11:
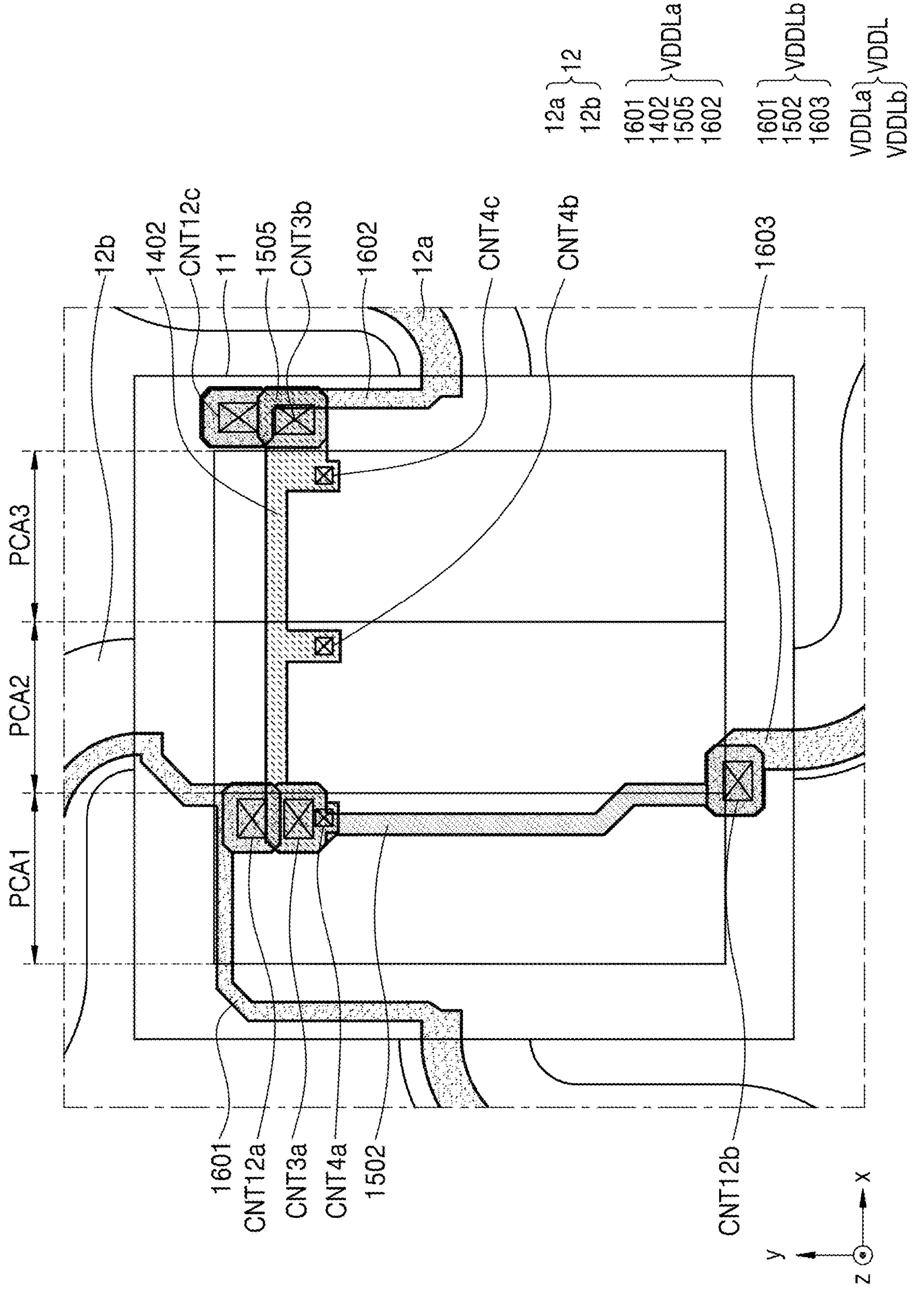
FIG. 11 is a schematic diagram illustrating a first driving voltage line among the components of the display device illustrated in FIG. 8.
Figure 12:
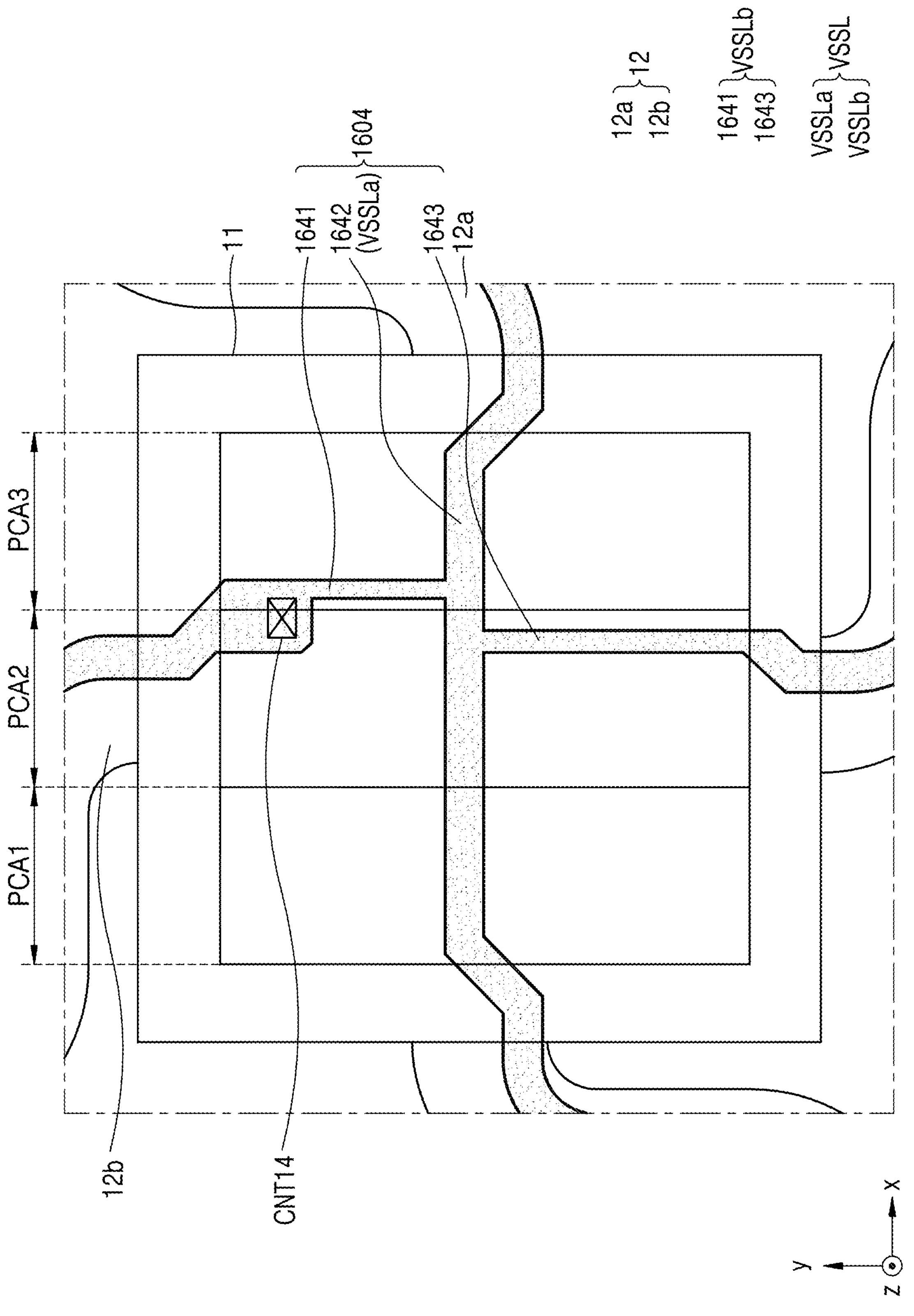
FIG. 12 is a schematic diagram illustrating a second driving voltage line among the components of the display device illustrated in FIG. 8.

FIG. 10 is a schematic diagram illustrating an initialization voltage line among the components of the display device illustrated in FIG. 8. FIG. 11 is a schematic diagram illustrating a first driving voltage line among the components of the display device illustrated in FIG. 8. FIG. 12 is a schematic diagram illustrating a second driving voltage line among the components of the display device illustrated in FIG. 8.

First, referring to FIG. 10, an initialization voltage line VIL may be arranged on a first island portion 11 and may be electrically connected to a first pixel circuit PC1 (see FIG. 8), a second pixel circuit PC2 (see FIG. 8), and a third pixel circuit PC3 (see FIG. 8). The initialization voltage line VIL may be arranged such that the initialization voltage line VIL extends on a first bridge portion 12 in a first direction (e.g., the x direction) and a second direction (e.g., the y direction). The extending initialization voltage line VIL may be configured to transmit an initialization voltage Vint (see FIG. 6) to a pixel circuit of an island portion arranged around the first island portion 11.

In an embodiment, the initialization voltage line VIL may include a horizontal initialization voltage line VILa and a vertical initialization voltage line VILb. The horizontal initialization voltage line VILa and the vertical initialization voltage line VILb may be arranged to intersect each other on the first island portion 11. In other words, the initialization voltage line VIL may be arranged in a planar mesh pattern.

As described herein, the initialization voltage line VIL may include a 6th conductive pattern 1301 arranged in a second conductive layer 1300 (see FIG. 9C), a 10th conductive pattern 1403 and an 11th conductive pattern 1404 arranged in a third conductive layer 1400 (see FIG. 9D), and a 20th conductive pattern 1503, a 21st conductive pattern 1504, and a 23rd conductive pattern 1506 arranged in a fourth conductive layer 1500 (see FIG. 9E). Specifically, the 21st conductive pattern 1504 extending from the horizontal bridge portion 12*a* to the first island portion 11 may be connected to the 10th conductive pattern 1403 through a 5th-1 contact hole CNT5*a* and the 10th conductive pattern 1403 may be connected to the 6th conductive pattern 1301 through a 6th-1 contact hole CNT6*a*, and thus, the initialization voltage Vint (see FIG. 6) may be transmitted to the 6th conductive pattern 1301. The 6th conductive pattern 1301 may be connected to the 11th conductive pattern 1404 through a 6th-2 contact hole CNT6*b*, and the 11th conductive pattern 1404 may transmit the initialization voltage Vint to the 20th conductive pattern 1503 and the 23rd conductive pattern 1506 through a 5th-2 contact hole CNT5*b*. The 20th conductive pattern 1503 receiving the initialization voltage Vint may extend to the vertical bridge portion 12*b* and transmit the initialization voltage Vint to pixel circuits arranged below the first island portion 11 in a plan view. The 23rd conductive pattern 1506 receiving the initialization voltage Vint may extend to the horizontal bridge portion 12*a* and transmit the initialization voltage Vint to pixel circuits arranged at the right side of the first island portion 11 in a plan view.

In this case, the 21st conductive pattern 1504, the 10th conductive pattern 1403, the 6th conductive pattern 1301, the 11th conductive pattern 1404, and the 23rd conductive pattern 1506 may be electrically connected to each other and may sequentially transmit the initialization voltage Vint in the first direction (e.g., the x direction). Accordingly, the 21st conductive pattern 1504, the 10th conductive pattern 1403, the 6th conductive pattern 1301, the 11th conductive pattern 1404, and the 23rd conductive pattern 1506 may form the horizontal initialization voltage line VILa.

Likewise, the 20th conductive pattern 1503 may transmit the initialization voltage Vint in the second direction (e.g., the y direction). Accordingly, the 20th conductive pattern 1503 may form the vertical initialization voltage line VILb. In an embodiment, the vertical initialization voltage line VILb may extend such that the vertical initialization voltage line VILb passes through the third circuit area PCA3 and is not arranged on the first circuit area PCA1 and the second circuit area PCA2.

Next, referring to FIG. 11, the first driving voltage line VDDL may be arranged on the first island portion 11 and may be electrically connected to the first pixel circuit PC1 (see FIG. 8), the second pixel circuit PC2 (see FIG. 8), and the third pixel circuit PC3 (see FIG. 8). The first driving voltage line VDDL may be arranged such that the first driving voltage line VDDL extends on the first bridge portion 12 in the first direction (e.g., the x direction) and the second direction (e.g., the y direction). The extending first driving voltage line VDDL may transmit the first driving voltage EVLDD (see FIG. 6) to a pixel circuit of an island portion arranged around the first island portion 11.

In an embodiment, the first driving voltage line VDDL may include a first horizontal driving voltage line VDDLa and a first vertical driving voltage line VDDLb. The first horizontal driving voltage line VDDLa and the first vertical driving voltage line VDDLb may be arranged to cross each other on the first island portion 11. In other words, the first driving voltage line VDDL may be arranged in a planar mesh pattern.

As described herein, the first driving voltage line VDDL may include a 9th conductive pattern 1402 arranged in the third conductive layer 1400 (see FIG. 9D), a 19th conductive pattern 1502 and a 22nd conductive pattern 1505 arranged in the fourth conductive layer 1500 (see FIG. 9E), and a 25th conductive pattern 1601, a 26th conductive pattern 1602, and a 27th conductive pattern 1603 arranged in the fifth conductive layer 1600 (see FIG. 9F).

Specifically, the 25th conductive pattern 1601 extending from the horizontal bridge portion 12*a* to the first island portion 11 may include a first region extending to the vertical bridge portion 12*b*, and a second region connected to the 19th conductive pattern 1502 through the 12th-1 contact hole CNT12*a*. The first region of the 25th conductive pattern 1601 may extend to the vertical bridge portion 12*b*, and thus, the first driving voltage line VDDL may transmit the first driving voltage ELVDD to pixel circuits arranged above the first island portion 11 in a plan view. In some aspects, the second region of the 25th conductive pattern 1601 may be connected to the 19th conductive pattern 1502 and the 19th conductive pattern 1502 may extend in the second direction (e.g., the y direction) and be connected to the 27th conductive pattern 1603 through the 12nd-2 contact hole CNT12*b*, and accordingly, the first driving voltage line VDDL may transmit the first driving voltage ELVDD to pixel circuits arranged below the first island portion 11 in a plan view.

The 19th conductive pattern 1502 may be connected to the 9th conductive pattern 1402 through the 3rd-1 contact hole CNT3*a*, and the 9th conductive pattern 1402 may extend in the first direction (e.g., the x direction) and be connected to the 22nd conductive pattern 1505 through the 3rd-2 contact hole CNT3*b*. The 22nd conductive pattern 1505 may be connected to the 26th conductive pattern 1602 through the 12th-3 contact hole CNT12*c* and the 26th conductive pattern 1602 may extend from the horizontal bridge portion 12*a*, and accordingly, the first driving voltage line VDDL may transmit the first driving voltage ELVDD to pixel circuits arranged on the right side of the first island portion 11 in a plane view. The 9th conductive pattern 1402 may be electrically connected to the first semiconductor pattern 1101 (see FIG. 9A) through the 4th-1 contact hole CNT4*a*, the 4th-2 contact hole CNT4*b*, and the 4th-3 contact hole CNT4*c*.

In this case, the 25th conductive pattern 1601, the 9th conductive pattern 1402, the 22nd conductive pattern 1505, and the 26th conductive pattern 1602 may be electrically connected to each other and may sequentially transmit the first driving voltage ELVDD in the first direction (e.g., the x direction). Accordingly, the 25th conductive pattern 1601, the 9th conductive pattern 1402, the 22nd conductive pattern 1505, and the 26th conductive pattern 1602 may form the first horizontal driving voltage line VDDLa.

Likewise, the 25th conductive pattern 1601, the 19th conductive pattern 1502, and the 27th conductive pattern 1603 may be electrically connected to each other and sequentially transmit the first driving voltage ELVDD in the second direction (e.g., the y direction). Therefore, the 25th conductive pattern 1601, the 19th conductive pattern 1502, and the 27th conductive pattern 1603 may form the first vertical driving voltage line VDDLb. In an embodiment, the first vertical driving voltage line VDDLb may extend such that the first vertical driving voltage line VDDLb passes through the first circuit area PCA1 and is not arranged in the second circuit area PCA2 and the third circuit area PCA3.

Next, referring to FIG. 12, a second driving voltage line VSSL may be arranged on the first island portion 11 and electrically connected to the first pixel circuit PC1 (see FIG. 8), the second pixel circuit PC2 (see FIG. 8), and the third pixel circuit PC3 (see FIG. 8). The second driving voltage line VSSL may be arranged such that the second driving voltage line VSSL extends on the first bridge portion 12 in the first direction (e.g., the x direction) and the second direction (e.g., the y direction). The extending second driving voltage line VSSL may transmit the second driving voltage EVLSS (see FIG. 6) to a pixel circuit of an island portion arranged around the first island portion 11.

In an embodiment, the second driving voltage line VSSL may include a second horizontal driving voltage line VSSLa and a second vertical driving voltage line VSSLb. The second horizontal driving voltage line VSSLa and the second vertical driving voltage line VSSLb may be arranged to cross each other on the first island portion 11. In other words, the second driving voltage line VSSL may be arranged in a planar mesh pattern.

As described herein, the second driving voltage line VSSL may include a 28th conductive pattern 1604 arranged on the 5th conductive layer 1600. The 28th conductive pattern 1604 may include a second portion 1642 extending in the first direction (e.g., the x direction), and a first portion 1641 and a third portion 1643 that extend in the second direction (e.g., the y direction). Specifically, the second portion 1642 may extend on the horizontal bridge portion 12*a* and transmit the second driving voltage ELVSS to pixel circuits arranged on the left side and/or right side of the first island portion 11 in a plan view. The first portion 1641 and the third portion 1643 may extend on the vertical bridge portion 12*b* and transmit the second driving voltage ELVSS to pixel circuits arranged on the upper side and/or lower side of the first island portion 11 in a plan view.

Accordingly, the second portion 1642 extending in the first direction may form the second horizontal driving voltage line VSSLa. Likewise, the first portion 1641 and the third portion 1643 that extend in the second direction may form the second vertical driving voltage line VSSLb. In an embodiment, the second vertical driving voltage line VSSLb may extend mainly to pass through the second circuit area PCA2.

Referring to FIGS. 10 to 12, a vertical voltage line that transmits a voltage to each pixel circuit and extends in the second direction (e.g., the y direction) may include a vertical initialization voltage line VILb, a first vertical driving voltage line VDDLb, and a second vertical driving voltage line VSSLb. In an embodiment, the vertical initialization voltage line VILb, the first vertical driving voltage line VDDLb, and the second vertical driving voltage line VSSLb may respectively extend such that each of the vertical initialization voltage line VILb, the first vertical driving voltage line VDDLb, and the second vertical driving voltage line VSSLb passes through one of the first circuit area PCA1, the second circuit area PCA2, and the third circuit area PCA3. However, the vertical initialization voltage line VILb, the first vertical driving voltage line VDDLb, and the second vertical driving voltage line VSSLb may be arranged in different circuit areas, respectively. For example, as in FIGS. 10 to 12, the vertical initialization voltage line VILb may be arranged in the third circuit area PCA3, the first vertical driving voltage line VDDLb may be arranged in the first circuit area PCA1, and the second vertical driving voltage line VSSLb may be arranged in the second circuit area PCA2.

Figure 13:
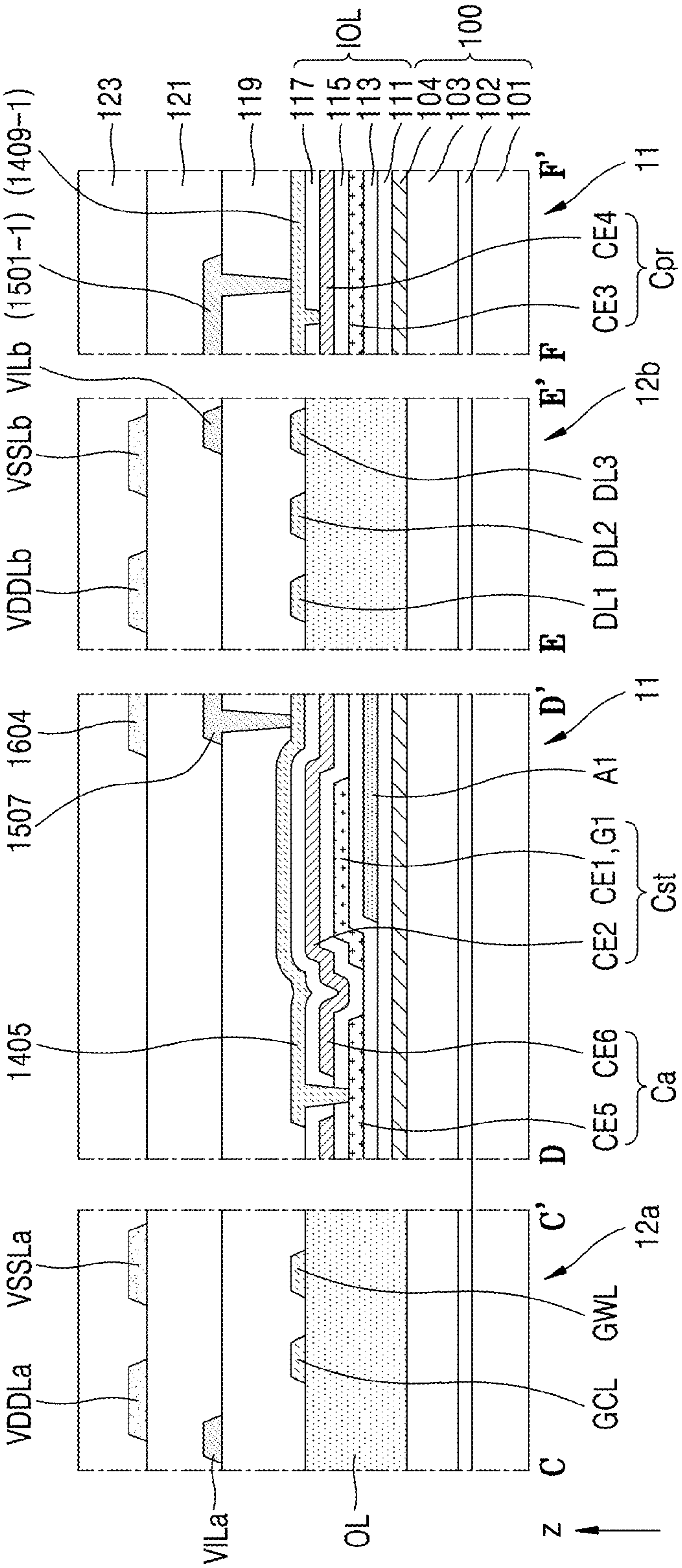
FIG. 13 is a schematic cross-sectional view illustrating a portion of a display device according to an embodiment.

FIG. 13 is a schematic cross-sectional view illustrating a portion of a display device according to an embodiment.

Referring to FIG. 13, a substrate 100 corresponding to the first island portion 11 (see FIG. 8) and the bridge portion 12 (see FIG. 8) may include a first base layer 101, a first barrier layer 102, a second base layer 103, and a second barrier layer 104. The first base layer 101 and the second base layer 103 may each include a polymer resin, such as, for example, polyethersulfone, polyarylate, polyether imide, polyethylene naphthalate, polyethylene terephthalate, polyphenylene sulfide, polyimide, polycarbonate, cellulose triacetate, cellulose acetate propionate, or the like. The first barrier layer 102 and the second barrier layer 104 may each include an inorganic insulating material, such as, for example, silicon oxide, silicon nitride, or silicon oxynitride.

First, in the first island portion 11, a buffer layer 111 may be arranged on the substrate 100, and a pixel circuit PC (see FIG. 6) may be arranged on the buffer layer 111. The buffer layer 111 may include an inorganic insulating material, such as, for example, silicon oxide, silicon nitride, or silicon oxynitride.

A semiconductor layer 1100 (see FIG. 9A) may be arranged on the buffer layer 111. For example, as illustrated in FIG. 13, a first semiconductor layer A1 of a first transistor T1 (see FIG. 8) may be arranged on the buffer layer 111. The first semiconductor layer A1 may include polysilicon. Alternatively, the first semiconductor layer A1 may include amorphous silicon, an oxide semiconductor, an organic semiconductor, or the like.

A gate insulating layer 113 may be arranged on the first semiconductor layer A1. The gate insulating layer 113 may include an inorganic insulating material, such as, for example, silicon oxide, nitrogen oxide, silicon oxynitride, aluminum oxide, or titanium oxide. The gate insulating layer 113 may include a single layer or multilayer including the aforementioned material.

A first conductive layer 1200 (see FIG. 9B) may be arranged on the gate insulating layer 113. For example, as illustrated in FIG. 13, a first gate electrode G1 of a first transistor T1 (see FIG. 8) may be arranged on the gate insulating layer 113. The first gate electrode G1 may include a conductive material including Mo, Al, Cu, Ti, or the like and may be formed as a multilayer or single layer including the aforementioned material.

In some aspects, a first capacitor electrode CE1 of a first capacitor Cst, a third capacitor electrode CE3 of a second capacitor Cpr, and a fifth capacitor electrode CE5 of a third capacitor Ca may be arranged on the gate insulating layer 113. As described herein, the first capacitor electrode CE1 may be a part of the first gate electrode G1. The third capacitor electrode CE3 and the fifth capacitor electrode CE5 may be arranged on the same layer as the first gate electrode G1 and may include the same material as the first gate electrode G1.

A first interlayer insulating layer 115 may be arranged on the first gate electrode G1, the third capacitor electrode CE3, and the fifth capacitor electrode CE5. The first interlayer insulating layer 115 may include an inorganic insulating material, such as, for example, silicon oxide, nitrogen oxide, silicon oxynitride, aluminum oxide, or titanium oxide, and may include a single layer or multilayer including the aforementioned material.

A second capacitor electrode CE2 of the first capacitor Cst, a fourth capacitor electrode CE4 of the second capacitor Cpr, and a sixth capacitor electrode CE6 of the third capacitor Ca may be arranged on the first interlayer insulating layer 115. The second capacitor electrode CE2 may be arranged to overlap the first capacitor electrode CE1 to form the first capacitor Cst, the fourth capacitor electrode CE4 may be arranged to overlap the third capacitor electrode CE3 to form the second capacitor Cpr, and the sixth capacitor electrode CE6 may be arranged to overlap the fifth capacitor electrode CE5 to form the third capacitor Ca.

The second capacitor electrode CE2, the fourth capacitor electrode CE4, and the sixth capacitor electrode CE6 may be arranged on the same layer and may include the same material. The second capacitor electrode CE2, the fourth capacitor electrode CE4, and the sixth capacitor electrode CE6 may include a conductive material including Mo, Al, Cu, Ti, or the like and may be formed as a multilayer or single layer including the aforementioned material.

A second interlayer insulating layer 117 may be arranged on the second capacitor electrode CE2, the fourth capacitor electrode CE4, and the sixth capacitor electrode CE6. The second interlayer insulating layer 117 may include an inorganic insulating material, such as, for example, silicon oxide, nitrogen oxide, silicon oxynitride, aluminum oxide, or titanium oxide, and may include a single layer or multilayer including the aforementioned material. The buffer layer 111, the gate insulating layer 113, the first interlayer insulating layer 115, and the second interlayer insulating layer 117 may be arranged on the first island portion 11 and form an inorganic insulating layer IOL.

A third conductive layer 1400 (see FIG. 9D) may be arranged on the second interlayer insulating layer 117. For example, as illustrated in FIG. 13, a 12th conductive pattern 1405 and a 16th-1 conductive pattern 1409-1 may be arranged on the second interlayer insulating layer 117. The 12th conductive pattern 1405 may be a connection electrode connecting the third capacitor Ca to a light-emitting element LED (see FIG. 6). The 16th-1 conductive pattern 1409-1 may form a part of the first data line DL1. The 12th conductive pattern 1405 and the 16th-1 conductive pattern 1409-1 may be arranged on the same layer and may include the same material. The 12th conductive pattern 1405 and the 16th-1 conductive pattern 1409-1 may each include a conductive material including Mo, Al, Cu, Ti, or the like and may each be formed as a multilayer or single layer including the aforementioned material.

A first organic insulating layer 119 may be arranged on the 12th conductive pattern 1405 and the 16th-1 conductive pattern 1409-1. The first organic insulating layer 119 may include an organic material, such as, for example, acrylic, benzocyclobutene (BCB), polyimide, or hexamethyldisiloxane (HMDSO).

A fourth conductive layer 1500 (see FIG. 9E) may be arranged on the first organic insulating layer 119. For example, as illustrated in FIG. 13, a 24th conductive pattern 1507 and an 18th-1 conductive pattern 1501-1 may be arranged on the first organic insulating layer 119. The 24th conductive pattern 1507 may be a connection electrode connecting the third capacitor Ca to the light-emitting element LED (see FIG. 6). The 18th-1 conductive pattern 1501-1 may form a part of the first data line DL1. The 24th conductive pattern 1507 and the 18th-1 conductive pattern 1501-1 may be arranged on the same layer and may include the same material. The 24th conductive pattern 1507 and the 18th-1 conductive pattern 1501-1 may each include a conductive material including Mo, Al, Cu, Ti, or the like and may each be formed as a multilayer or single layer including the aforementioned material.

A second organic insulating layer 121 may be arranged on the 24th conductive pattern 1507 and the 18th-1 conductive pattern 1501-1. The second organic insulating layer 121 may include an organic material, such as, for example, acrylic, BCB, polyimide, or HMDSO.

A fifth conductive layer 1600 (see FIG. 9F) may be arranged on the second organic insulating layer 121. For example, as illustrated in FIG. 13, a 28th conductive pattern 1604 may be arranged on the second organic insulating layer 121. The 28th conductive pattern 1604 may form a second driving voltage line VSSL (see FIG. 6). The 28th conductive pattern (1604) may include a conductive material including Mo, Al, Cu, Ti, or the like and may be formed as a multilayer or single layer including the aforementioned material.

Next, an organic layer OL may be arranged on the substrate 100 on the bridge portion 12. The organic layer OL may be an insulating layer corresponding to the inorganic insulating layer IOL of the first island portion 11 and arranged on the bridge portion 12. The organic layer OL may include an organic material, such as, for example, acrylic, BCB, polyimide, or HMDSO.

In the horizontal bridge portion **12*a*, a first gate line GWL and a second gate line GCL may be arranged on the organic layer OL. The first gate line GWL and the second gate line GCL may be arranged on the same layer as the 12th conductive pattern 1405 arranged on the first island portion 11, and may include the same material as the 12th conductive pattern 1405. The first gate line GWL and the second gate line GCL may extend in the first direction (e.g., the x direction) on the horizontal bridge portion 12***a* and apply gate signals to a plurality of pixel circuits.

A first organic insulating layer 119 may be arranged on the first gate line GWL and the second gate line GCL, and a horizontal initialization voltage line VILa may be arranged on the first organic insulating layer 119. The horizontal initialization voltage line VILa may be arranged on the same layer as the 24th conductive pattern 1507 arranged on the first island portion 11, and may include the same material as the 24th conductive pattern 1507. The horizontal initialization voltage line VILa may extend in the first direction (e.g., the x direction) on the horizontal bridge portion 12*a* and transmit an initialization voltage to a plurality of pixel circuits.

A second organic insulating layer 121 may be arranged on the horizontal initialization voltage line VILa, and a first horizontal driving voltage line VDDLa and a second horizontal driving voltage line VSSLa may be arranged on the second organic insulating layer 121. The first horizontal driving voltage line VDDLa and the second horizontal driving voltage line VSSLa may be arranged on the same layer as the 28th conductive pattern 1604 arranged on the first island portion 11, and may include the same material as the 28th conductive pattern 1604. The first horizontal driving voltage line VDDLa and the second horizontal driving voltage line VSSLa may extend in the first direction (e.g., the x direction) on the horizontal bridge portion 12*a* and transmit a first driving voltage and a second driving voltage to a plurality of pixel circuits.

That is, a plurality of gate lines and a plurality of voltage lines arranged on the horizontal bridge portion 12*a* may be arranged on different layers. For example, as illustrated in FIG. 13, a horizontal initialization voltage line VILa may be arranged on the first gate line GWL and the second gate line GCL, and a first horizontal driving voltage line VDDLa and a second horizontal driving voltage line VSSLa may be arranged on the horizontal initialization voltage line VILa. In the case where a plurality of wiring lines are arranged on different layers as described herein, compared to a structure where a plurality of wiring lines are arranged on the same layer, a plurality of gate lines and a plurality of voltage lines may have relatively wide wiring widths on the horizontal bridge portion 12*a*. Accordingly, the loads of the plurality of gate lines and the plurality of voltage lines arranged on the horizontal bridge portion 12*a* may be efficiently reduced.

In the vertical bridge portion 12*b*, a first data line DL1, a second data line DL2, and a third data line DL3 may be arranged on the organic layer OL. The first data line DL1, the second data line DL2, and the third data line DL3 may be arranged on the same layer as the 12th conductive pattern 1405 arranged on the first island portion 11, and may include the same material as the 12th conductive pattern 1405. The first data line DL1, the second data line DL2, and the third data line DL3 may extend in the second direction (e.g., the y direction) on the vertical bridge portion 12*b* and apply data signals to a plurality of pixel circuits.

A first organic insulating layer 119 may be arranged on the first data line DL1, the second data line DL2, and the third data line DL3, and a vertical initialization voltage line VILb may be arranged on the first organic insulating layer 119. The vertical initialization voltage line VILb may be arranged on the same layer as the 24th conductive pattern 1507 arranged on the first island portion 11, and may include the same material as the 24th conductive pattern 1507. The vertical initialization voltage line VILb may extend in the second direction (e.g., the y direction) on the vertical bridge portion 12*b* and transmit an initialization voltage to a plurality of pixel circuits.

A second organic insulating layer 121 may be arranged on the vertical initialization voltage line VILb, and a first vertical driving voltage line VDDLb and a second vertical driving voltage line VSSLb may be arranged on the second organic insulating layer 121. The first vertical driving voltage line VDDLb and the second vertical driving voltage line VSSLb may be arranged on the same layer as the 28th conductive pattern 1604 arranged on the first island portion 11, and may include the same material as the 28th conductive pattern 1604. The first vertical driving voltage line VDDLb and the second vertical driving voltage line VSSLb may extend in the second direction (e.g., the y direction) on the vertical bridge portion 12*b* and transmit the first driving voltage and the second driving voltage to a plurality of pixel circuits.

That is, the plurality of data lines and the plurality of voltage lines arranged on the vertical bridge portion 12*b* may be arranged on different layers. For example, as illustrated in FIG. 13, a vertical initialization voltage line VILb may be arranged on the first data line DL1, the second data line DL2, and the third data line DL3, and a first vertical driving voltage line VDDLb and a second vertical driving voltage line VSSLb may be arranged on the vertical initialization voltage line VILb. In the case where a plurality of wiring lines are arranged on different layers as described herein, compared to a structure where a plurality of wiring lines are arranged on the same layer, a plurality of gate lines and a plurality of voltage lines may have relatively wide wiring widths on the vertical bridge portion 12*b*. Accordingly, the loads of the plurality of gate lines and the plurality of voltage lines arranged on the vertical bridge portion 12*b* may be efficiently reduced.

FIGS. 14A to 14G are schematic perspective views illustrating embodiments of an electronic device including a display device according to an embodiment.

Figure 14A:
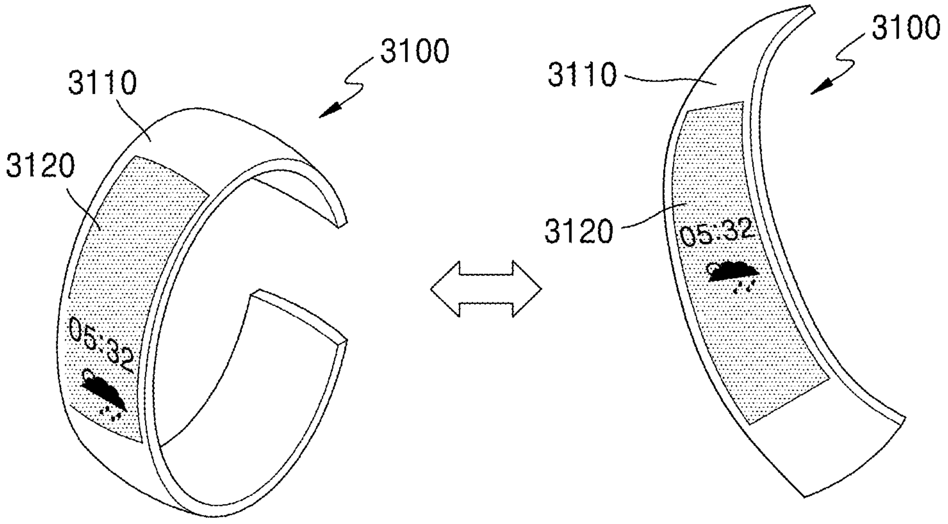
FIGS. 14A to 14G are schematic perspective views illustrating embodiments of an electronic device including a display device according to an embodiment.

Referring to FIG. 14A, the display device according to an embodiment may be used in a wearable electronic device 3100 that may be worn on a portion of a user's body. The wearable electronic device 3100 may include a body portion 3110 and a display portion 3120 provided on the body portion 3110. The display device according to an embodiment may be used as the display portion 3120 of the wearable electronic device 3100. As illustrated in FIG. 14A, the wearable electronic device 3100 may be deformable. In an embodiment, the wearable electronic device 3100 may be used as a smart watch or a smartphone depending on a user's choice.

Figure 14B:
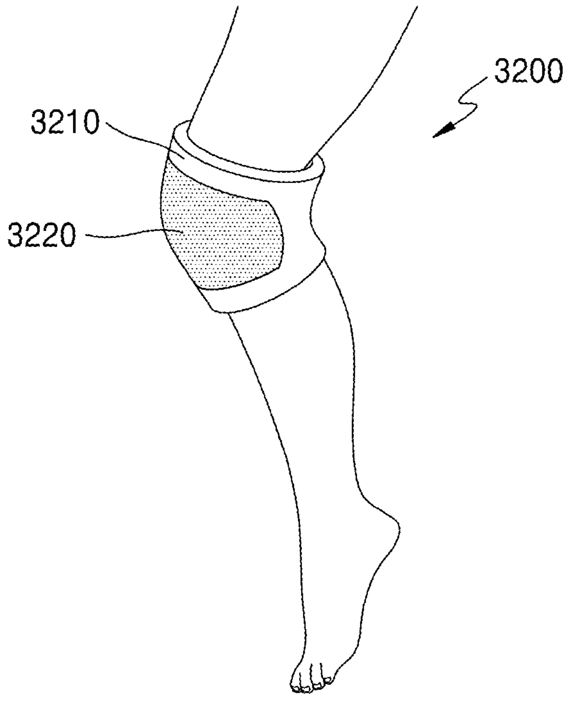

FIG. 14B illustrates a medical electronic device 3200. In an embodiment, the medical electronic device 3200 may include a body portion 3210 and a light-emitting portion 3220. The display device according to an embodiment may be used as the light-emitting portion 3220 of the medical electronic device 3200. The light-emitting portion 3220 may emit light (e.g., infrared light or visible light) of a certain wavelength band to a patient's body. In an embodiment, the body portion 3210 may include a stretchable fiber material and may have a structure in which the body portion 3210 may be worn on a user's body.

Figure 14C:
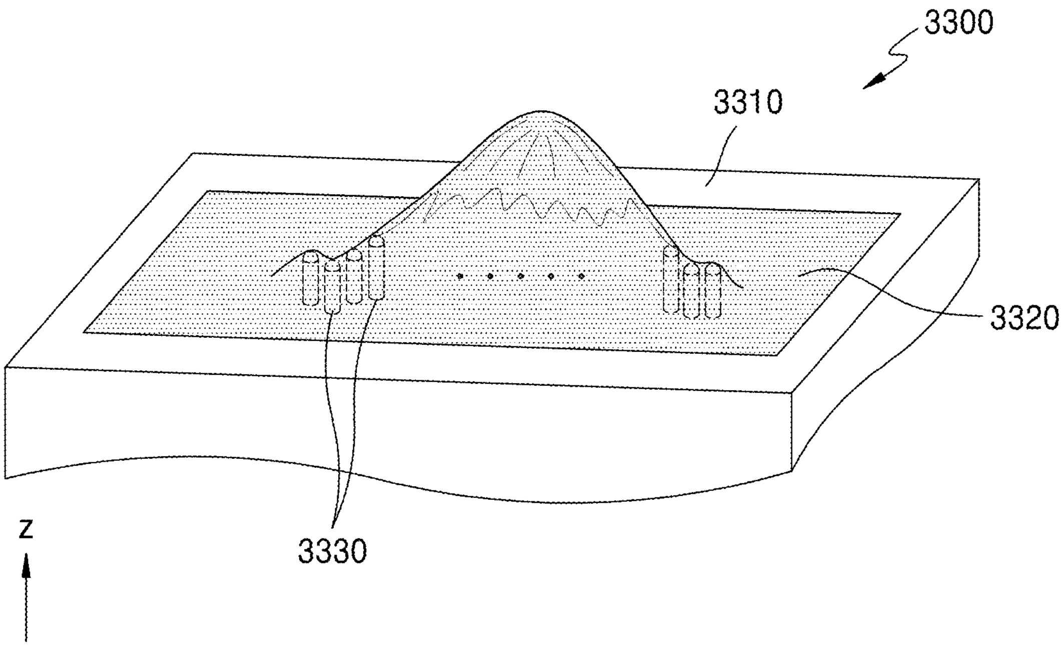

FIG. 14C illustrates an educational electronic device 3300. In an embodiment, the educational electronic device 3300 may include a display portion 3320 provided within a frame 3310. The display portion 3320 may use a display device according to an embodiment. The display portion 3320 may provide images, such as, for example, an ocean with waves, a snow-covered mountain, or a volcano with flowing lava, and in this case, the display portion 3320 may be stretched in a height direction (e.g., the z direction) to reflect the height of waves, mountains, or volcanoes. In some embodiments, a portion of the display portion 3320 may show the movement of lava in three dimensions by sequentially changing the height in a direction in which the lava flows. The educational electronic device 3300 may include a plurality of pins (or stroke portions) 3330 arranged on the back of the display portion 3320 such that the display portion 3320 is stretched in the height direction. As the pins 3330 move in a third direction (e.g., the z direction or the −z direction), the image displayed on the display portion 3320 may be implemented to have a three-dimensional height. FIG. 14C illustrates the educational electronic device 3300, but its use is not limited as long as the educational electronic device 3300 provides certain image information.

Although the electronic device illustrated in FIGS. 14A to 14C is described as an electronic device whose shape may be variable, but the disclosure is not limited thereto. As in embodiments to be described herein, the display device according to embodiments may be used in an electronic device in which a part (e.g., a screen) capable of displaying an image is fixed.

Figure 14D:
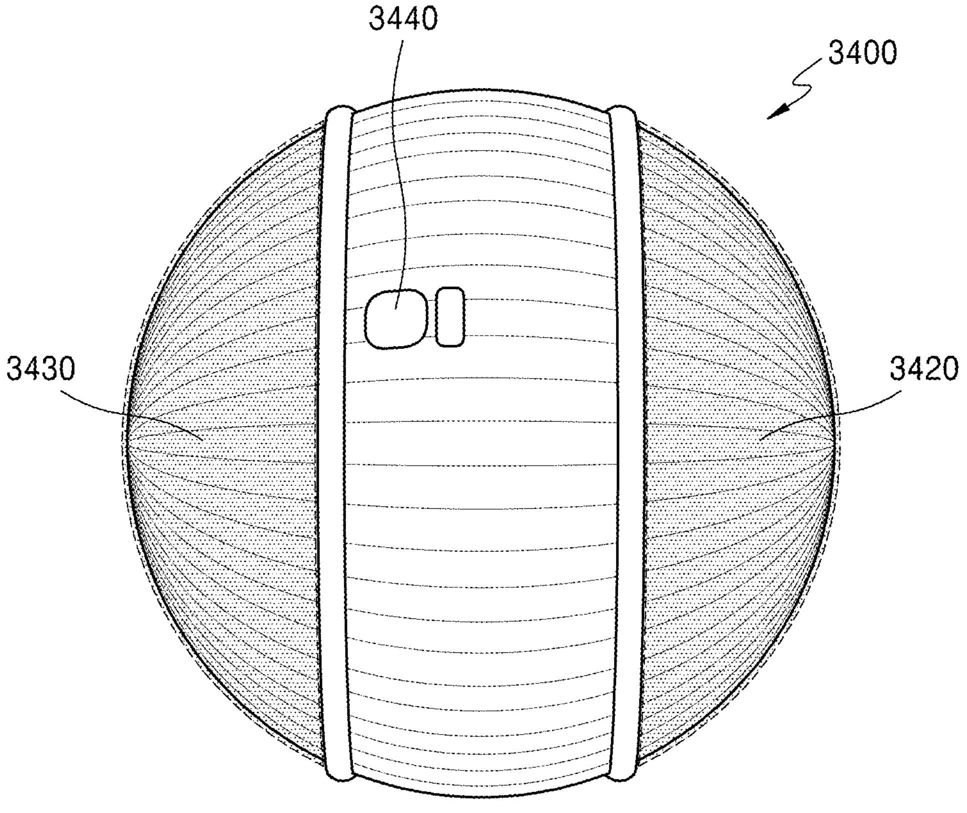

FIG. 14D illustrates a robot 3400 as another electronic device according to an embodiment. The robot 3400 may recognize movement or objects by using a camera portion 3440 and may display a certain image to a user through display portions 3420 and 3430. In some embodiments, the display device according to an embodiment may be stretched in various directions as described herein and thus may be assembled into a body frame having a hemispherical shape, and thus, the robot 3400 may include the display portions 3420 and 3430 having hemispherical shapes.

Figure 14E:
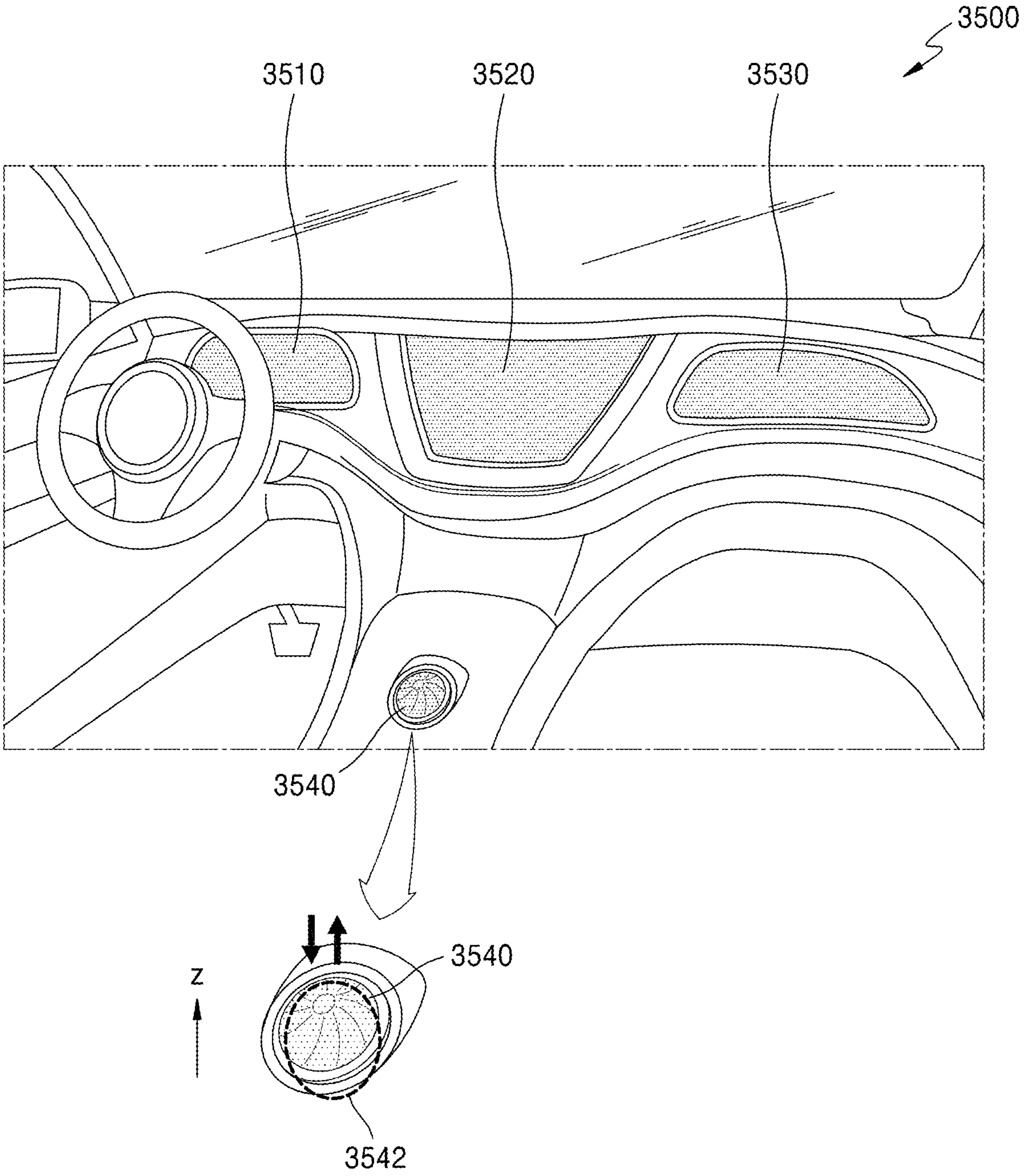

FIG. 14E illustrates a vehicle display device 3500 as another electronic device according to an embodiment. The vehicle display device 3500 may include a cluster 3510, a center information display (CID) 3520, and/or a passenger seat display. Because the display device according to an embodiment may be stretched in various directions, the display device may be used in the cluster 3510, the CID 3520, and/or a co-driver display (i.e., the passenger seat display) regardless of the shape of a vehicle's internal frame.

Although FIG. 14E illustrates the cluster 3510, the CID 3520, and/or the co-driver display being separated, the disclosure is not limited thereto. In another embodiment, two or more selected from the cluster 3510, the CID 3520, and the co-driver display may be integrally connected.

In some embodiments, the vehicle display device 3500 may include a button 3540 that may display a certain image. Referring to the enlarged view of FIG. 14E, the button 3540 having a hemispherical shape may include an object 3542 that provides the feeling of using the button 3540 while moving in a z direction or −z direction, and a display device arranged on the object 3542. In some embodiments, when the object 3542 has a three-dimensionally rounded surface, the display device may also have a three-dimensionally rounded surface.

Figure 14F:
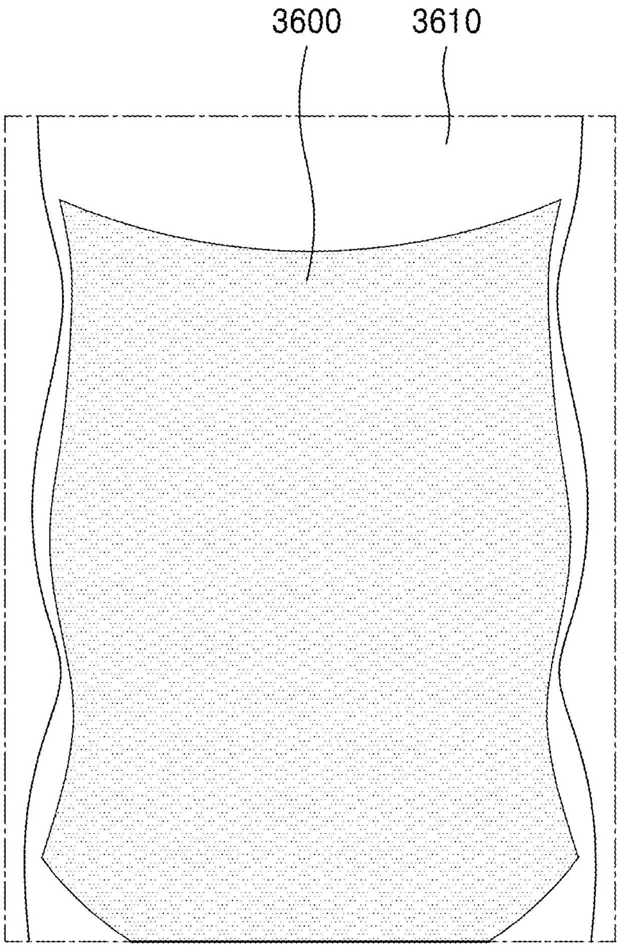

FIG. 14F illustrates that the electronic device according to an embodiment is an electronic device 3600 for advertising or exhibition. In some embodiments, the electronic device 3600 for advertising or exhibition may be installed on a fixed structure 3610, such as, for example, a wall or pillar. In an example in which the fixed structure 3610 includes an uneven surface as illustrated in FIG. 14F, the electronic device 3600 for advertising or exhibition may also be arranged along the uneven surface of the fixed structure 3610. In some embodiments, the electronic device 3600 for advertising or exhibition may be installed on the fixed structure 3610 by using a heat-shrink film or the like.

Figure 14G:
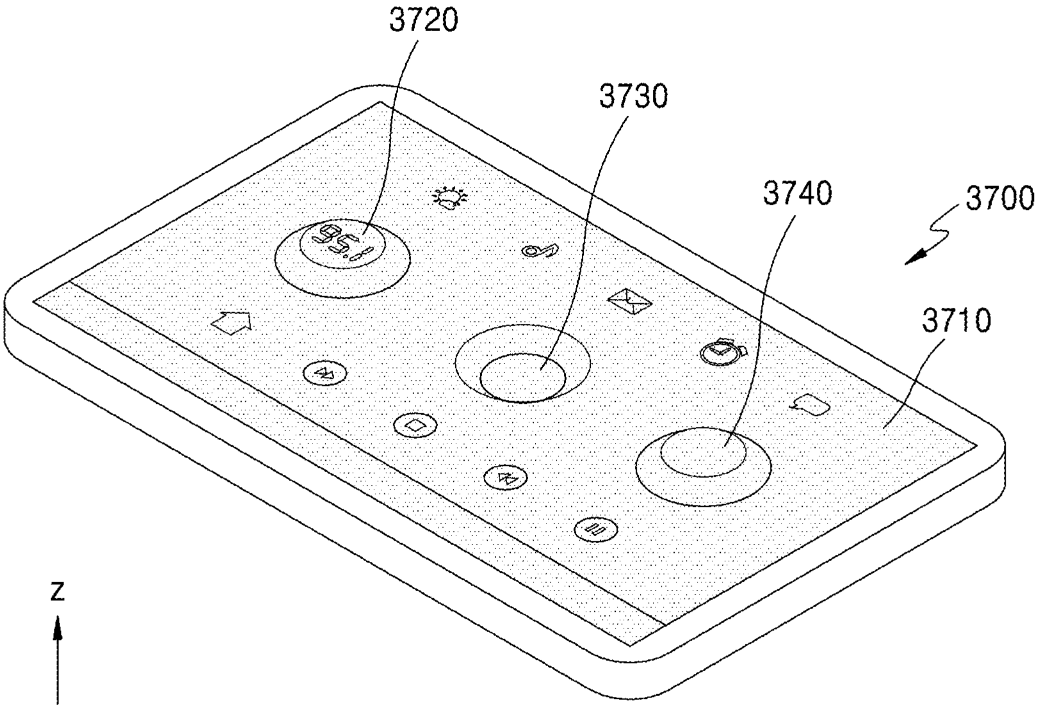

FIG. 14G illustrates that the electronic device according to an embodiment is a controller 3700. The controller 3700 may include image-type buttons. For example, the controller 3700 may include first to third button areas 3720, 3730, and 3740 in which a portion of a display portion 3710 protrudes in a z direction or protrudes in a-z direction (or is dented in the z direction). In some embodiments, the first and third button areas 3720 and 3740 may protrude in the z direction, and the second button area 3730 may protrude in the −z direction (or be dented in the z direction).

The display device according to the embodiment may be applied to various electronic apparatuses. An electronic apparatus according to an embodiment of the present disclosure may include the display device (e.g., the display device of FIG. 1) described above, and may further include modules or apparatuses having additional functions in addition to the display device.

Figure 15:
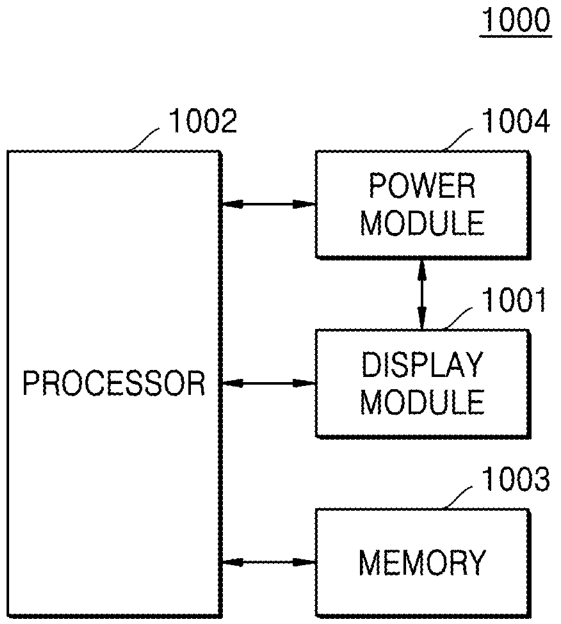
FIG. 15 is a block diagram of an electronic apparatus according to an embodiment.

FIG. 15 is a block diagram of an electronic apparatus according to an embodiment.

Referring to FIG. 15, an electronic apparatus 1000 according to an embodiment may include a display module 1001, a processor 1002, a memory 1003, and a power module 1004.

The processor 1002 may include at least one of a central processing unit (CPU), an application processor (AP), a graphic processing unit (GPU), a communication processor (CP), an image signal processor (ISP), and a controller.

The memory 1003 may store data information necessary for the operation of the processor 1002 or the display module 1001. When the processor 1002 executes an application stored in the memory 1003, an image data signal and/or an input control signal may be transmitted to the display module 1001, and the display module 1001 may process a signal received and output image information through a display screen.

The power module 1004 may include a power supply module such as a power adapter or a battery device, and a power conversion module that converts the power supplied by the power supply module to generate power necessary for the operation of the electronic apparatus 1000.

At least one of the components of the electronic apparatus 1000 described above may be included in the display device according to the embodiments described above. In addition, a part among the individual modules functionally included in one module may be included in the display apparatus, and another part may be provided separately from the display device. For example, the display device may include the display module 1001, and the processor 1002, the memory 1003, and the power module 1004 may be provided in the form of other apparatus within the electronic apparatus 1000 except for the display device.

In an embodiment, the display module 1001 included in the display device may drive based on the image data signal and the input control signal received from the processor 1002.

Figure 16:
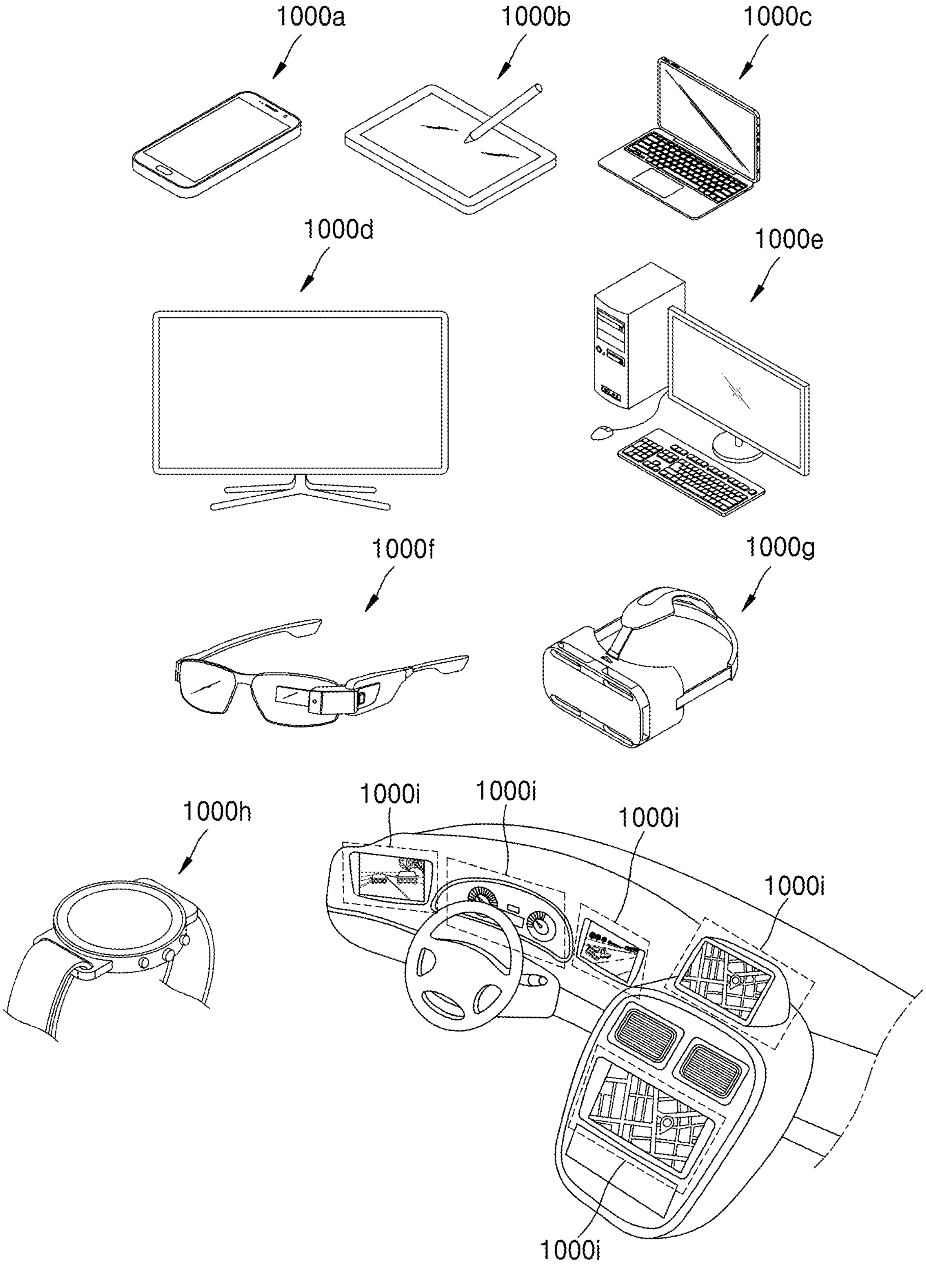
FIG. 16 is a schematic diagrams of electronic apparatuses according to various embodiments.

FIG. 16 is a schematic diagrams of electronic apparatuses according to various embodiments.

Referring to FIG. 16, various electronic apparatuses to which display devices according to embodiments are applied may include not only image display electronic apparatuses such as a smart phone 1000_a_, a tablet PC 1000_b_, a laptop 1000_c_, a TV 1000_d_, and a desk monitor 1000_e_, but also a wearable electronic device including display modules such as smart glasses 1000_f_, a head mounted display 1000_g_, and a smart watch **1000*h*, and a vehicle electronic device 1000*i*** including a dashboard, a center fascia, and display modules such as a CID (Center Information Display) and a room mirror display disposed in the dashboard.

According to embodiments, a display device having improved display quality and resolution may be provided. As described herein, the display device may display an image in a simultaneous emission manner by applying a pixel circuit that receives a data voltage by using a program capacitor (Cpr), and the resolution of the display device is improved by reducing the area of a the first island portion where the pixel circuit is placed. The aforementioned effects are examples, and the scope of the disclosure is not limited by these effects.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
- a substrate in which a plurality of island portions and a plurality of bridge portions connecting the plurality of island portions are defined;
- a first pixel circuit arranged in each of the plurality of island portions and connected to a first data line; and
- a light-emitting element arranged in each of the plurality of island portions and connected to the first pixel circuit, wherein the first pixel circuit comprises:
- a first transistor connected between a first driving voltage line and the light-emitting element and configured to control a current supplied to the light-emitting element;
- a first capacitor connected between:
  - a first node connected to a gate of the first transistor, and
  - an initialization voltage line;
- a second transistor connected between the first node and a second node and comprising a gate connected to a first gate line;
- a second capacitor connected between the first data line and the second node; and
- a third transistor connected between the second node and a third node connected to the light-emitting element, wherein the third transistor comprises a gate connected to a second gate line, and wherein the plurality of bridge portions comprise:
- a first bridge portion connecting first adjacent island portions to each other in a first direction; and
- a second bridge portion connecting second adjacent island portions to each other in a second direction intersecting with the first direction.

2. The display device of claim 1, wherein:
- the first capacitor comprises a first capacitor electrode and a second capacitor electrode arranged on the first capacitor electrode, and
- the first capacitor electrode is a part of the gate of the first transistor.

3. The display device of claim 2, wherein:
- the second capacitor comprises a third capacitor electrode and a fourth capacitor electrode arranged on the third capacitor electrode, and
- the third capacitor electrode is arranged on a same layer as the gate of the first transistor.

4. The display device of claim 3, wherein a first insulating layer is arranged between the first capacitor electrode and the second capacitor electrode and between the third capacitor electrode and the fourth capacitor electrode.

5. The display device of claim 2, wherein:
- the first pixel circuit further comprises a third capacitor connected between the third node and the initialization voltage line, and
- the third capacitor comprises a fifth capacitor electrode and a sixth capacitor electrode on the fifth capacitor electrode.

6. The display device of claim 5, wherein the sixth capacitor electrode is formed integrally with the second capacitor electrode.

7. The display device of claim 1, wherein the first gate line and the second gate line extend in the first direction on the plurality of island portions and the first bridge portion, and
- wherein the first gate line and the second gate line are arranged on a same layer on the first bridge portion.

8. The display device of claim 1, wherein the first gate line, the initialization voltage line, and the first driving voltage line are arranged on different layers on the first bridge portion.

9. The display device of claim 1, wherein the first data line, the initialization voltage line, and the first driving voltage line are arranged on different layers on the second bridge portion.

10. The display device of claim 1, further comprising:
- a second pixel circuit arranged in each of the plurality of island portions and connected to a second data line; and
- a third pixel circuit arranged in each of the plurality of island portions and connected to a third data line,
- wherein the first pixel circuit, the second pixel circuit, and the third pixel circuit are sequentially arranged in the first direction.

11. The display device of claim 10, wherein the first data line, the second data line, and the third data line extend in the second direction on the plurality of island portions and the second bridge portion, and
- wherein the first data line, the second data line, and the third data line are arranged on a same layer on the second bridge portion.

12. The display device of claim 10, wherein each of the initialization voltage line and the first driving voltage line has a planar mesh pattern.

13. The display device of claim 10, wherein the initialization voltage line comprises:
- a horizontal initialization voltage line extending in the first direction on the plurality of island portions and the first bridge portion; and
- a vertical initialization voltage line extending in the second direction on the plurality of island portions and the second bridge portion.

14. The display device of claim 13, wherein the first driving voltage line comprises:
- a first horizontal driving voltage line extending in the first direction on the plurality of island portions and the first bridge portion; and
- a first vertical driving voltage line extending in the second direction on the plurality of island portions and the second bridge portion.

15. The display device of claim 14, further comprising a second driving voltage line connected to the light-emitting element and configured to supply a second voltage lower than a first voltage supplied by the first driving voltage line, wherein the second driving voltage line comprises:

a second horizontal driving voltage line extending in the first direction on the plurality of island portions and the first bridge portion; and a second vertical driving voltage line extending in the second direction on the plurality of island portions and the second bridge portion.

16. The display device of claim 15, wherein each of the plurality of island portions further comprises a first circuit area in which the first pixel circuit is arranged, a second circuit area in which the second pixel circuit is arranged, and a third circuit area in which the third pixel circuit is arranged.

17. The display device of claim 16, wherein:

the vertical initialization voltage line, the first vertical driving voltage line, and the second vertical driving voltage line respectively extend such that each of the vertical initialization voltage line, the first vertical driving voltage line, and the second vertical driving voltage line passes through one of the first circuit area, the second circuit area, and the third circuit area, and the vertical initialization voltage line, the first vertical driving voltage line, and the second vertical driving voltage line are arranged in different circuit areas.

18. The display device of claim 16, wherein the horizontal initialization voltage line, the first horizontal driving voltage line, and the second horizontal driving voltage line respectively extend such that each of the horizontal initialization voltage line, the first horizontal driving voltage line, and the second horizontal driving voltage line passes through all of the first circuit area, the second circuit area, and the third circuit area.

19. An electronic apparatus comprising a display device, wherein the display device comprises:

a substrate in which a plurality of island portions and a plurality of bridge portions connecting the plurality of island portions are defined;

a first pixel circuit arranged in each of the plurality of island portions and connected to a first data line; and a light-emitting element arranged in each of the plurality of island portions and connected to the first pixel circuit, wherein the first pixel circuit comprises:

a first transistor connected between a first driving voltage line and the light-emitting element and configured to control a current supplied to the light-emitting element;

a first capacitor connected between:

a first node connected to a gate of the first transistor, and an initialization voltage line;

a second transistor connected between the first node and a second node and comprising a gate connected to a first gate line;

a second capacitor connected between the first data line and the second node; and a third transistor connected between the second node and a third node connected to the light-emitting element, wherein the third transistor comprises a gate connected to a second gate line, and wherein the plurality of bridge portions comprise:

a first bridge portion connecting first adjacent island portions to each other in a first direction; and a second bridge portion connecting second adjacent island portions to each other in a second direction intersecting with the first direction.

* * * * *